(12) United States Patent
Nagatsuka et al.

(10) Patent No.: US 8,654,566 B2
(45) Date of Patent: Feb. 18, 2014

(54) SEMICONDUCTOR DEVICE AND DRIVING METHOD THEREOF

(75) Inventors: Shuhei Nagatsuka, Kanagawa (JP); Takanori Matsuzaki, Kanagawa (JP); Hiroki Inoue, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 238 days.

(21) Appl. No.: 13/221,947

(22) Filed: Aug. 31, 2011

(65) Prior Publication Data

US 2012/0056647 A1 Mar. 8, 2012

(30) Foreign Application Priority Data

Sep. 3, 2010 (JP) ................................. 2010-197404
May 12, 2011 (JP) ................................. 2011-107642

(51) Int. Cl.
*G11C 11/24* (2006.01)

(52) U.S. Cl.
USPC ...... 365/149; 365/183; 365/184; 365/185.02; 365/185.09; 365/185.17; 365/210.11; 365/51; 365/63; 365/72

(58) Field of Classification Search
USPC .............. 365/149, 183, 184, 185.02, 185.09, 365/185.17, 210.11, 51, 63, 72
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 6,016,268 A | * 1/2000 | Worley | 365/149 |
| 6,127,702 A | 10/2000 | Yamazaki et al. | |
| 6,314,017 B1 | 11/2001 | Emori et al. | |
| 6,445,026 B1 | 9/2002 | Kubota et al. | |
| 6,536,013 B2 | 3/2003 | Kobayashi et al. | |

(Continued)

FOREIGN PATENT DOCUMENTS

| | | |
|---|---|---|
| CN | 101258607 A | 9/2008 |
| EP | 2 339 639 A2 | 6/2011 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Toan Le
(74) *Attorney, Agent, or Firm* — Fish & Richardson P.C.

(57) ABSTRACT

The semiconductor device includes a memory cell including a first transistor including a first channel formation region, a first gate electrode, and first source and drain regions; a second transistor including a second channel formation region provided so as to overlap with at least part of either of the first source region or the first drain region, a second source electrode, a second drain electrode electrically connected to the first gate electrode, and a second gate electrode; and an insulating layer provided between the first transistor and the second transistor. In a period during which the second transistor needs in an off state, at least when a positive potential is supplied to the first source region or the first drain region, a negative potential is supplied to the second gate electrode.

15 Claims, 32 Drawing Sheets

(56) References Cited

U.S. PATENT DOCUMENTS

| | | | |
|---|---|---|---|
| 6,737,695 B2 * | 5/2004 | Beer | 257/300 |
| 7,061,014 B2 | 6/2006 | Hosono et al. | |
| 7,064,346 B2 | 6/2006 | Kawasaki et al. | |
| 7,088,606 B2 * | 8/2006 | Turner | 365/149 |
| 7,402,506 B2 | 7/2008 | Levy et al. | |
| 7,468,901 B2 | 12/2008 | Kameshiro et al. | |
| 7,791,074 B2 | 9/2010 | Iwasaki | |
| 7,859,889 B2 | 12/2010 | Kameshiro et al. | |
| 7,935,582 B2 | 5/2011 | Iwasaki | |
| 7,956,361 B2 | 6/2011 | Iwasaki | |
| 8,339,837 B2 | 12/2012 | Inoue et al. | |
| 8,422,272 B2 | 4/2013 | Inoue et al. | |
| 8,461,586 B2 | 6/2013 | Yamazaki et al. | |
| 2003/0209739 A1 * | 11/2003 | Hisamoto et al. | 257/278 |
| 2003/0218222 A1 | 11/2003 | Wager et al. | |
| 2005/0128803 A1 | 6/2005 | Luk et al. | |
| 2006/0113565 A1 | 6/2006 | Abe et al. | |
| 2006/0169973 A1 | 8/2006 | Isa et al. | |
| 2008/0006877 A1 | 1/2008 | Mardilovich et al. | |
| 2008/0073653 A1 | 3/2008 | Iwasaki | |
| 2008/0166834 A1 | 7/2008 | Kim et al. | |
| 2008/0182358 A1 | 7/2008 | Cowdery-Corvan et al. | |
| 2008/0296568 A1 | 12/2008 | Ryu et al. | |
| 2009/0002590 A1 | 1/2009 | Kimura | |
| 2009/0045397 A1 | 2/2009 | Iwasaki | |
| 2009/0152541 A1 | 6/2009 | Maekawa et al. | |
| 2010/0097838 A1 | 4/2010 | Tanaka et al. | |
| 2010/0148171 A1 | 6/2010 | Hayashi et al. | |
| 2010/0193785 A1 | 8/2010 | Kimura | |
| 2011/0101351 A1 | 5/2011 | Yamazaki | |
| 2011/0121878 A1 | 5/2011 | Kato et al. | |
| 2011/0122670 A1 | 5/2011 | Yamazaki et al. | |
| 2011/0122673 A1 | 5/2011 | Kamata et al. | |
| 2011/0128777 A1 | 6/2011 | Yamazaki et al. | |
| 2011/0193082 A1 | 8/2011 | Iwasaki | |
| 2012/0014157 A1 | 1/2012 | Kato et al. | |

FOREIGN PATENT DOCUMENTS

| | | |
|---|---|---|
| JP | 57-105889 A | 7/1982 |
| JP | 62-060191 A | 3/1987 |
| JP | 63-268184 A | 11/1988 |
| JP | 02-168494 A | 6/1990 |
| JP | 2001-053167 A | 2/2001 |
| JP | 2007-103918 A | 4/2007 |
| KR | 2008-0053355 A | 6/2008 |
| WO | 2007/029844 A1 | 3/2007 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

International Search Report, PCT Application No. PCT/JP2011/069239, dated Oct. 11, 2011, 3 pages.

Written Opinion, PCT Application No. PCT/JP2011/069239, dated Oct. 11, 2011, 4 pages.

* cited by examiner 400  450a  437

450b

453 c-axis direction charge 0 charge 0 ab plane charge 0 charge + 1 charge − 1

- In
- Sn
- Zn
- O

FIG. 17A
FIG. 17B
FIG. 17C
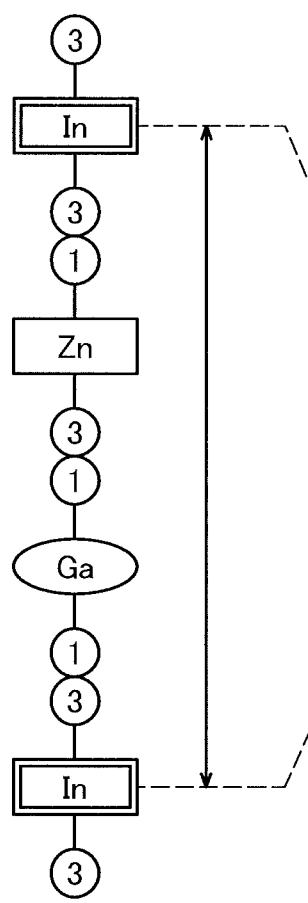
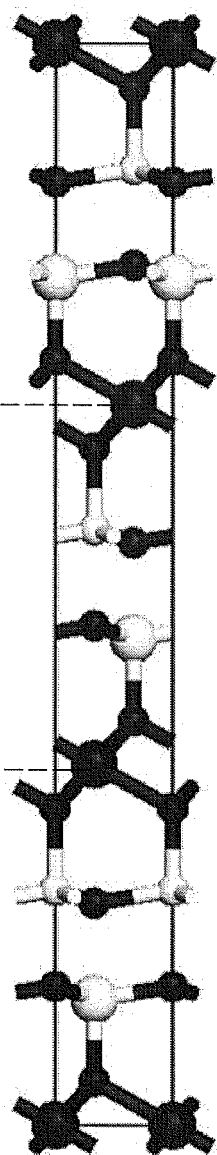
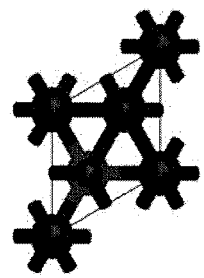
- In
- Ga
- Zn
- O

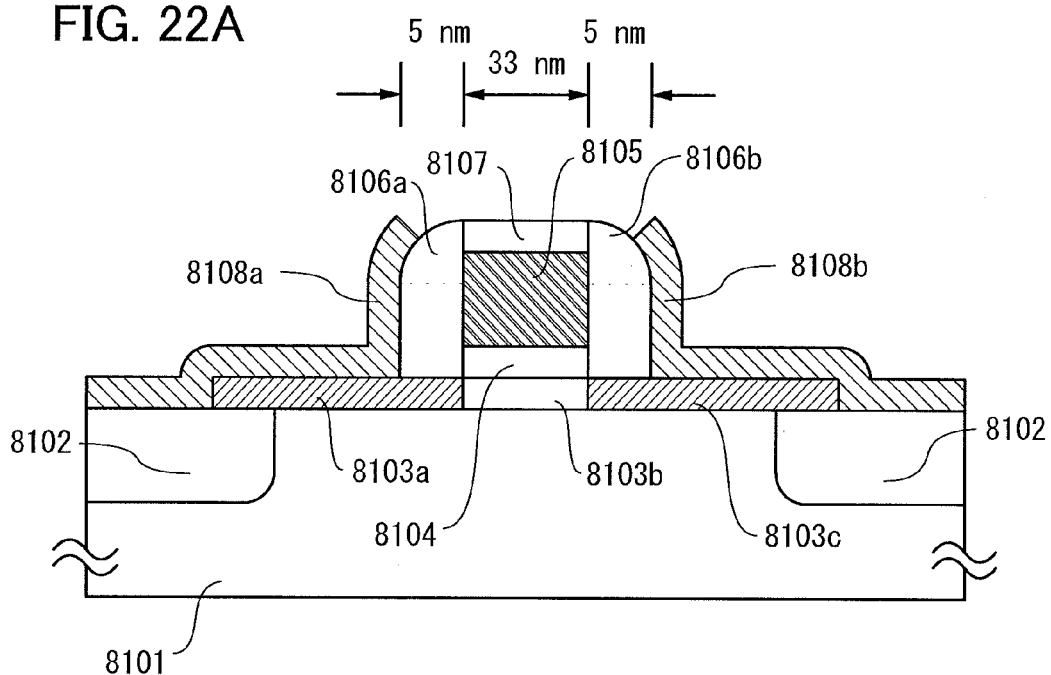
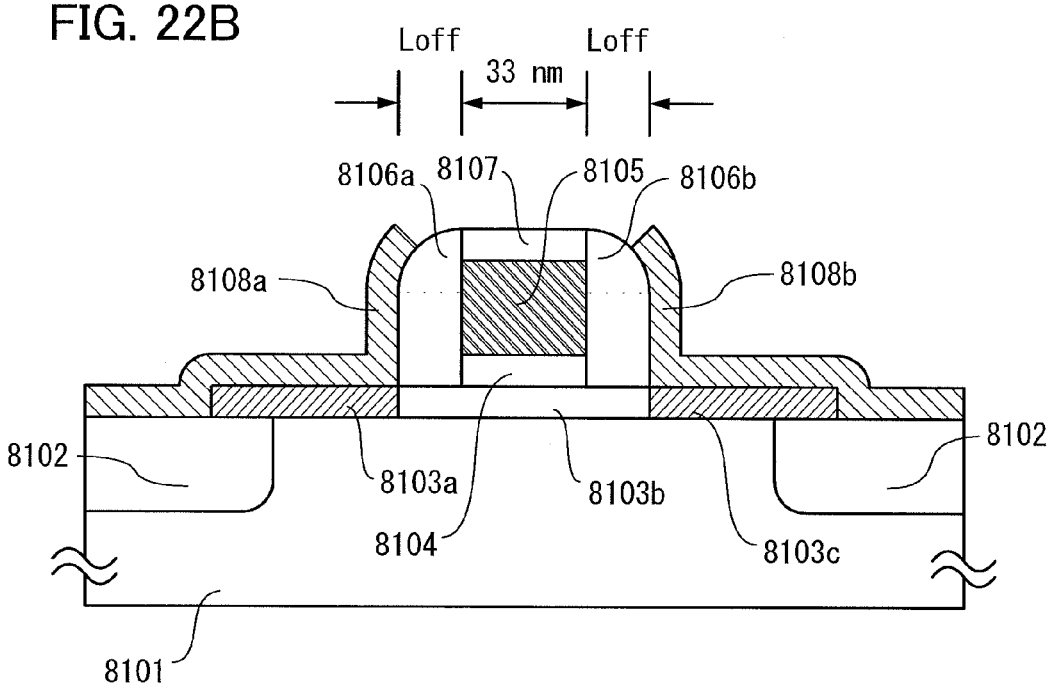

- In
- Ga or Zn
- O

- In
- Ga
- Zn
- O

SEMICONDUCTOR DEVICE AND DRIVING METHOD THEREOF

TECHNICAL FIELD

One embodiment of the present invention relates to a semiconductor device using a semiconductor element and a driving method for manufacturing the semiconductor device.

BACKGROUND ART

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a storage element is selected and electric charge is stored in a capacitor.

On the above-described principle, when data is read from a DRAM, charge in a capacitor is lost; thus, another writing operation is necessary every time data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for a flash memory in order to inject charge into the floating gate or removing the charge, and a circuit therefore is required. Further, it takes a relatively long time to inject or remove charge, and it is not easy to increase the speed of writing and erasing data.

REFERENCE

[Patent Document 1] Japanese Published Patent Application No. S57-105889

DISCLOSURE OF INVENTION

In view of the above problems, an object of one embodiment of the present invention is to provide a semiconductor device with a novel structure in which stored data can be held even when power is not supplied and there is no limit on the number of times of writing, and to provide a method for driving the semiconductor device. Another object is to increase the degree of integration of the semiconductor device with the novel structure.

In one embodiment of the present invention, a semiconductor device is manufactured using an oxide semiconductor. In particular, a highly purified oxide semiconductor is used. A transistor formed using an oxide semiconductor can retain data for a long time because leakage current thereof is extremely small. Moreover, in the case of a transistor formed using a highly-purified oxide semiconductor, the leakage current is remarkably low, and data can be therefore retained for an extremely long time.

Specifically, structures described below can be employed, for example.

According to an embodiment of the disclosed invention, a semiconductor device includes a memory cell that includes a first transistor including a first channel formation region, a first gate insulating layer provided over the first channel formation region, a first gate electrode provided over the first gate insulating layer so as to overlap with the first channel formation region, and a first source region and a first drain region with the first channel formation region provided therebetween; a second transistor including a second channel formation region provided so as to overlap with at least part of either of the first source region or the first drain region, a second source electrode and a second drain electrode electrically connected to the second channel formation region, a second gate electrode provided over the second channel formation region, and a second gate insulating layer provided between the second channel formation region and the second gate electrode; and an insulating layer provided between the second channel formation region and the first source region and/or the first drain region. The second drain electrode and the first gate electrode are electrically connected to form a node. The second transistor is turned on to supply charge to the node. The second transistor is turned off to hold charge in the node. In a period during which charge needs to be held in the node, at least when a positive potential is supplied to the first source region or the first drain region, the negative potential is supplied to the second gate electrode. In addition, the negative potential preferably satisfies the following formula (1).

[FORMULA 1]

$$V_a \leq -V_b \times \frac{t_a}{t_b} \times \frac{\varepsilon_{rb}}{\varepsilon_{ra}} \qquad (1)$$

(Note that in the formula (1), $V_a$ represents a negative potential, $V_b$ represents a positive potential, $t_a$ represents a thickness of the second gate insulating layer, $\varepsilon_{ra}$ represents a relative permittivity of the second gate insulating layer, $t_b$ represents a thickness of the insulating layer, and $\in_{rb}$ represents a relative permittivity of the insulating layer).

According to another embodiment of the disclosed invention, a semiconductor device includes a memory cell that includes a first transistor including a first channel formation region, a first gate insulating layer provided over the first channel formation region, a first gate electrode provided over first gate insulating layer so as to overlap with the first channel formation region, and a first source region and a first drain region with the first channel formation region provided therebetween; a second transistor including a second gate electrode, a second channel formation region provided over the second gate electrode, a second source electrode and a second drain electrode electrically connected to the second channel formation region, a second gate insulating layer provided between the second channel formation region and the second gate electrode, and a first insulating layer provided over the second channel formation region, the second source electrode, and the second drain electrode, and a wiring electrically connected to the second source electrode and provided over the first insulating layer to overlap at least part of the second channel formation region; and a second insulating layer provided between the second gate electrode and the first source region and/or the first drain region. The second drain electrode and the first gate electrode are electrically connected to form a node. Charge is supplied to the node when the second transistor is in an on state. Charge is held in the node when the second transistor is in an off state. In the period during which the charge needs to be held in the node, when a positive potential is supplied to at least the wiring, the negative potential is supplied to the second gate electrode. In addition, the negative potential preferably satisfies the following formula (2).

[FORMULA 2]

$$V_a \leq -V_c \times \frac{t_a}{t_c} \times \frac{\varepsilon_{rc}}{\varepsilon_{ra}} \quad (2)$$

(Note that in the formula (2), $V_a$ represents the negative potential, $V_c$ represents the positive potential, $t_a$ represents a thickness of the second gate insulating layer, $\in_{ra}$ represents the relative permittivity of the second gate insulating layer, $t_c$ represents a thickness of the first insulating layer, and $\in_{rc}$ represents the relative permittivity of the first insulating layer).

In addition, the first source or drain region and the second source electrode nay be electrically connected to each other. Further, a capacitor is preferably constituted by the second drain electrode, the second gate insulating layer, and a conductive layer. Alternatively, the capacitor may be constituted by the second drain electrode, a third insulating layer provided between the first insulating layer and the second drain electrode, and the conductive layer.

According to another embodiment of the disclosed invention, a semiconductor device includes a plurality of bit lines, a plurality of source lines, a plurality of write word lines, a plurality of write-read word lines, and a memory cell array including a plurality of memory cells. Each memory cells includes a first transistor including a first gate electrode, a first source region, a first drain region, and a first channel formation region; a second transistor including a second gate electrode, a second source electrode, a second drain electrode, and a second channel formation region provided so as to overlap at least part of either of the first source region or the first drain region; and a capacitor. The source line is electrically connected to the first source region. The bit line is electrically connected to the first drain region and the second source electrode. The write-read word line is electrically connected to one electrode of the capacitor. The write word line is electrically connected to the second gate electrode. The first gate electrode, the second drain electrode, and the other electrode of the capacitor are electrically connected to one another to form a node where charge is held. In a writing period of the memory cell, at least when the positive potential is supplied to the plurality of bit lines, the positive potential is supplied to one of the plurality of write word lines in a selected row and the negative potential is supplied to the other of the plurality of write word lines in unselected rows. In a reading period of the memory cell, at least when the positive potential is supplied to the plurality of bit lines, the negative potential is supplied to the plurality of write word lines.

In addition, it is preferable that the first channel formation region and the second channel formation region include different semiconductor materials. In addition, the second channel formation region preferably includes an oxide semiconductor.

Note that although the transistor is formed using an oxide semiconductor material in the above semiconductor devices, one embodiment of the present invention is not limited to using an oxide semiconductor material. A material which can realize the off-current characteristics equivalent to those of the oxide semiconductor material, such as a wide gap material like silicon carbide (specifically, a semiconductor material with an energy gap Eg of greater than 3 eV) may be used.

Note that in this specification and the like, the term such as "over" or "below" does not necessarily mean that a component is placed "directly on" or "directly under" another component. For example, the expression "a gate electrode over a gate insulating layer" does not exclude the case where another component is placed between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely low, stored data can be retained for an extremely long time by using the transistor. In other words, power consumption can be adequately reduced because refresh operation becomes unnecessary or the frequency of refresh operation can be extremely low. Moreover, stored data can be stored for a long time even when power is not supplied.

Further, a semiconductor device according to one embodiment of the present invention does not need high voltage for writing data, and degradation of the element does not become a problem. For example, since there is no need to perform injection of electrons to a floating gate and extraction of electrons from the floating gate which are needed in a conventional nonvolatile memory, deterioration of a gate insulating layer does not occur. That is, the semiconductor device according to one embodiment of the present invention has no limitation on the number of times data can be rewritten, which is a problem of a conventional nonvolatile memory, and the reliability thereof is drastically improved. Furthermore, since data is written by turning on or off the transistor, high-speed operation can be easily realized. Additionally, there is an advantage in that operation for erasing data is not needed.

Since a transistor including a material other than an oxide semiconductor can operate at sufficiently high speed, a semiconductor device can perform operation (e.g., reading data) at sufficiently high speed in combination of a transistor including an oxide semiconductor. Further, a transistor including a material other than an oxide semiconductor can favorably realize a variety of circuits (such as a logic circuit or a driver circuit) which is required to operate at high speed.

Further, the transistor using a material other than an oxide semiconductor and the transistor using an oxide semiconductor are overlapped with each other at least partly, in particular, the source region or the drain region of the transistor using a material other than an oxide semiconductor and the oxide semiconductor layer are partly overlapped with each other; thus, high integration of the semiconductor device can be achieved. Further, in a period during which the transistor using a material other than an oxide semiconductor needs to be in an off state, a negative potential is supplied to a gate electrode of the transistor using a material other than an oxide semiconductor at least when the positive potential is supplied to the source region or the drain region of the transistor using an oxide semiconductor; thus, memory retention of the semiconductor device can be improved.

A semiconductor device having a novel feature can be realized by being provided with both the transistor including a material other than an oxide semiconductor (in a broader sense, a transistor capable of operating at sufficiently high speed) and the transistor including an oxide semiconductor (in a broader sense, a transistor whose off-state current is sufficiently small).

BRIEF DESCRIPTION OF DRAWINGS

In the accompanying drawings:
FIGS. 17A to 17C are diagrams illustrating a structure of an oxide material according to one embodiment of the present invention;
FIGS. 22A and 22B are diagrams illustrating cross-sectional structures of transistors used for calculation.

BEST MODE FOR CARRYING OUT THE INVENTION

Figure 1A:
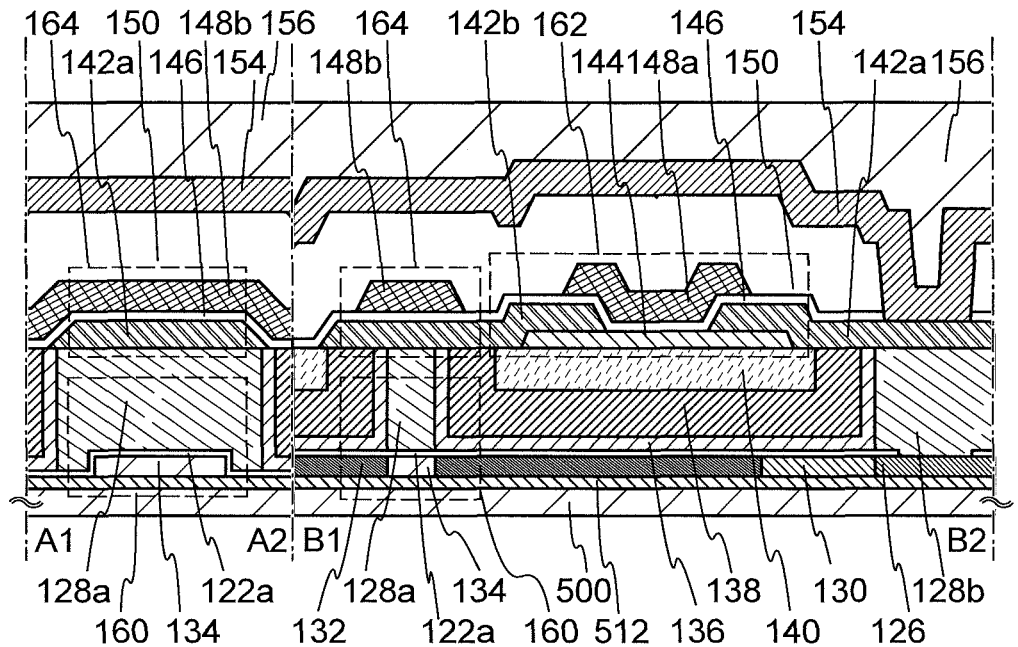
FIGS. 1A and 1B are a cross-sectional view and a plan view of a semiconductor device.

Hereinafter, embodiments and examples of the present invention will be described with reference to the drawings. Note that the present invention is not limited to the following description and it will be readily appreciated by those skilled in the art that the modes and details of the present invention can be modified in various ways without departing from the spirit and scope thereof. Therefore, the invention should not be construed as being limited to the description in following the embodiments and examples.

Note that the position, size, range, and the like of each component illustrated in the drawings and the like are not accurately represented for easy understanding in some cases. Therefore, one embodiment of the present invention is not necessarily limited to the position, size, range, and the like in the drawings and the like.

In this specification and the like, ordinal numbers such as "first", "second", and "third" are used in order to avoid confusion among components, and the terms do not limit the components numerically.

(Embodiment 1)

In this embodiment, a structure and a driving method of a semiconductor device according to one embodiment of the present invention will be described with reference to FIGS. 1A and 1B, FIGS. 2A and 2B, FIGS. 3A to 3D, FIG. 4, FIG. 5, and FIG. 6.

<Cross-sectional Structure and Planar View of Semiconductor Device>

Figure 1B:
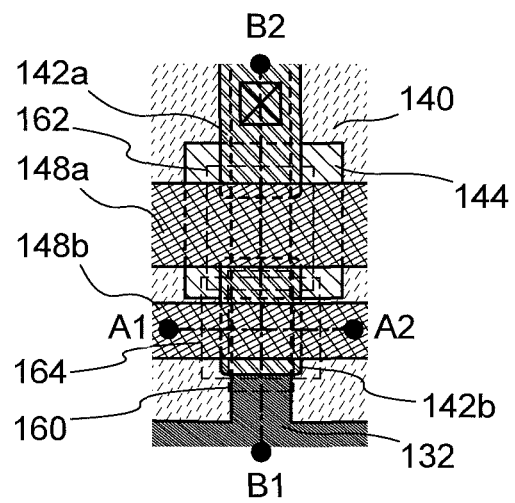

FIGS. 1A and 1B illustrate an example of a structure of the semiconductor device. FIG. 1A is a cross-sectional view of the semiconductor device. FIG. 1B is a plan view of the semiconductor device. In FIGS. 1A and 1B is a cross section perpendicular to a channel length direction of a transistor, and FIG. 1B is a cross section parallel to the channel length direction of the transistor. The semiconductor device illustrated in FIGS. 1A and 1B includes a transistor 160 including a first semiconductor material in a lower portion, and a transistor 162 including a second semiconductor material in an upper portion. FIGS. 1A and 1B show that the semiconductor device including one transistor 160, one transistor 162, and one capacitor 164; alternatively, the semiconductor device may include a plurality of transistors 160, transistors 162, and capacitors 164.

Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystalline. Alternatively, an organic semiconductor material or the like may be used. A transistor including such a semiconductor material can operate at high speed easily. On the other hand, a transistor including an oxide semiconductor can hold charge for a long time owing to its characteristics.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

In addition, as other stabilizer(s), the oxide semiconductor may contain one or more of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

For example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as the oxide semiconductor.

Note that here, for example, an "In—Ga—Zn—O-based oxide" means an oxide containing In, Ga, and Zn as its main component and there is no particular limitation on the ratio of In:Ga:Zn. Further, a metal element in addition to In, Ga, and Zn may be contained.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Further alternatively, a material represented by $In_3SnO_5(ZnO)_n$ (n>0 is satisfied, and n is an integer) may be used as an oxide semiconductor.

In the case of forming an In—Ga—Zn-based oxide semiconductor film for an oxide semiconductor by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When an oxide semiconductor film is formed using a target of an In—Ga—Zn-based oxide having the aforementioned atomic ratio, a polycrystal or a c-axis-aligned crystal (CAAC), which is described below, is easily formed.

In the case of faulting an oxide semiconductor using an In—Sn—Zn-based oxide by a sputtering method, it is preferable to use an In—Sn—Zn-based oxide target having an atomic ratio of In:Sn:Zn=1:1:1, 2:1:3, 1:2:2, or 20:45:35. When an oxide semiconductor is formed using a target of an In—Sn—Zn-based oxide having the above atomic ratio, a polycrystal or CAAC, which is described below, is easily formed.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:

Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a measurement surface. The $R_a$ can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x, y) - Z_0|dxdy \quad \text{[FORMULA 3]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

Here, as the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoodianate O and O surrounded by a double circle represents tricoodenate O.

Figure 15A:
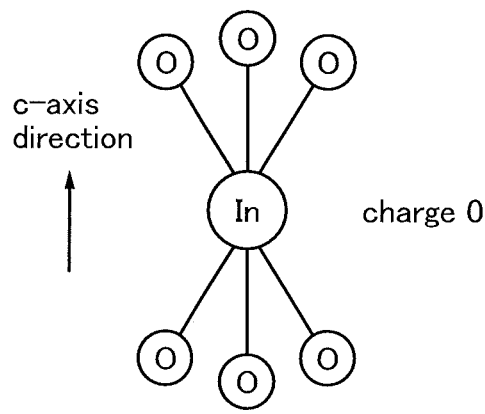
FIGS. 15A to 15E are diagrams illustrating a structure of an oxide material according to one embodiment of the present invention.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15B:
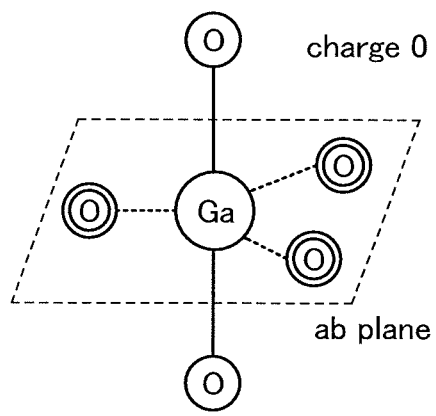

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15C:
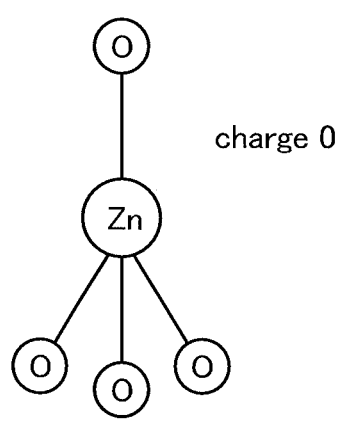

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

Figure 15D:
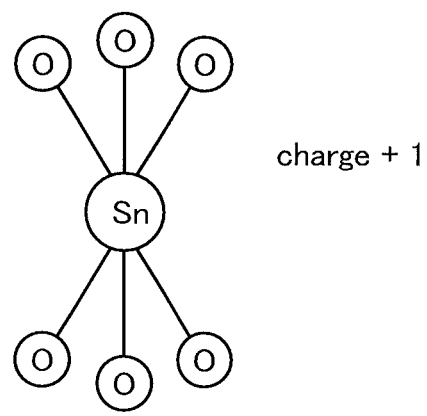

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

Figure 15E:
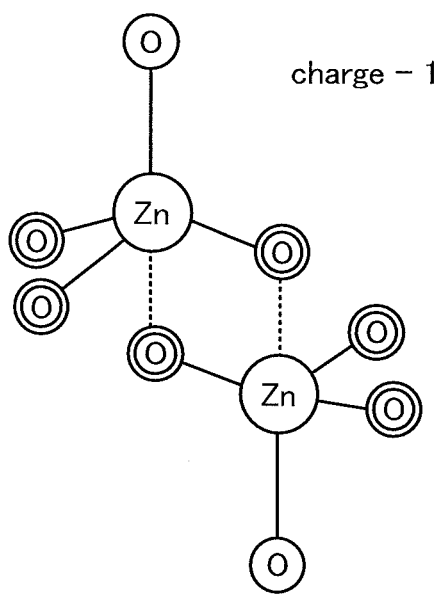

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

Metal atoms having the above coordination numbers are bonded to another metal atom through a tetracoordinate O atom in the c-axis direction. In addition to the above, a medium group can be formed in a different manner by combining a plurality of small groups so that the total electric charge of the layered structure is 0.

Figure 16A:
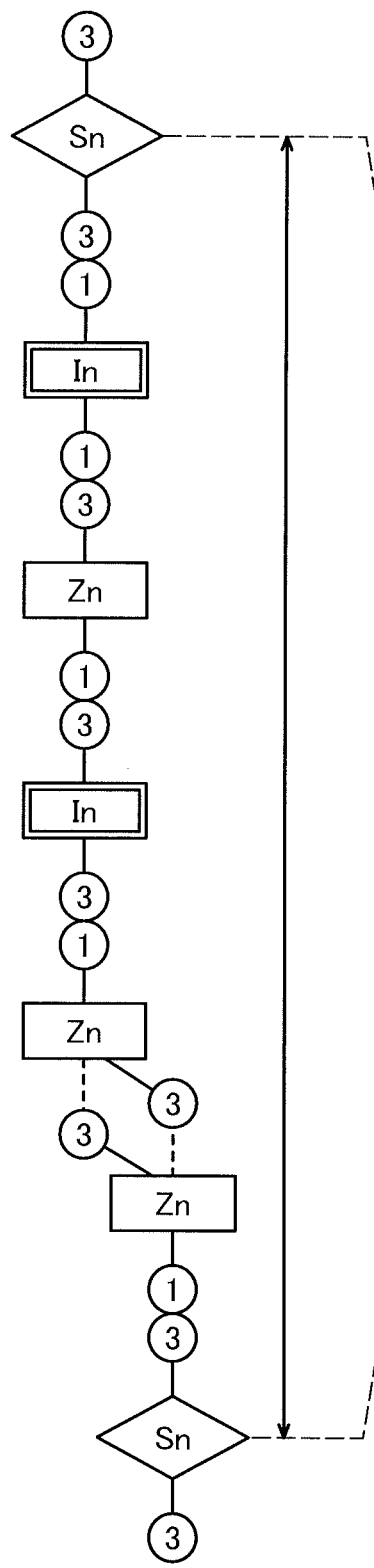
FIGS. 16A to 16C are diagrams illustrating a structure of an oxide material according to one embodiment of the present invention.
Figure 16B:
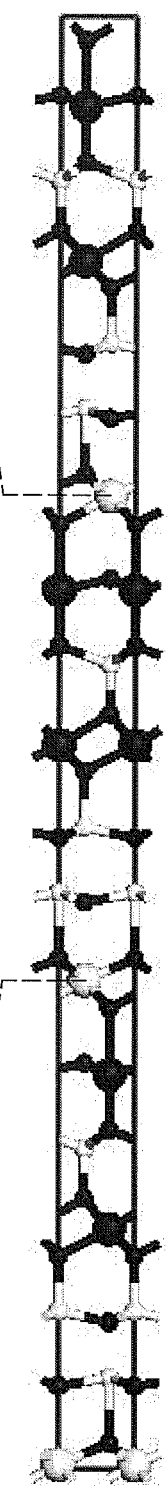
Figure 16C:

FIG. 16A illustrates a model of a medium group included in a layered structure of an In—Sn—Zn—O-based material. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 17A illustrates a model of a medium group included in a layered structure of an In—Ga—Zn—O-based material.

In the medium group included in the layered structure of the In—Ga—Zn—O-based material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 17A but also a medium group in which the arrangement of the In atom, the Ga atom, and the Zn atom is different from that in FIG. 17A.

When the large group illustrated in FIG. 17B is repeated, an In—Sn—Zn—O-based crystal can be obtained. Note that a layered structure of the obtained In—Ga—Zn—O-based crystal can be expressed as a composition formula, $InGaO_3(ZnO)_n$ (n is a natural number).

Figure 32A:
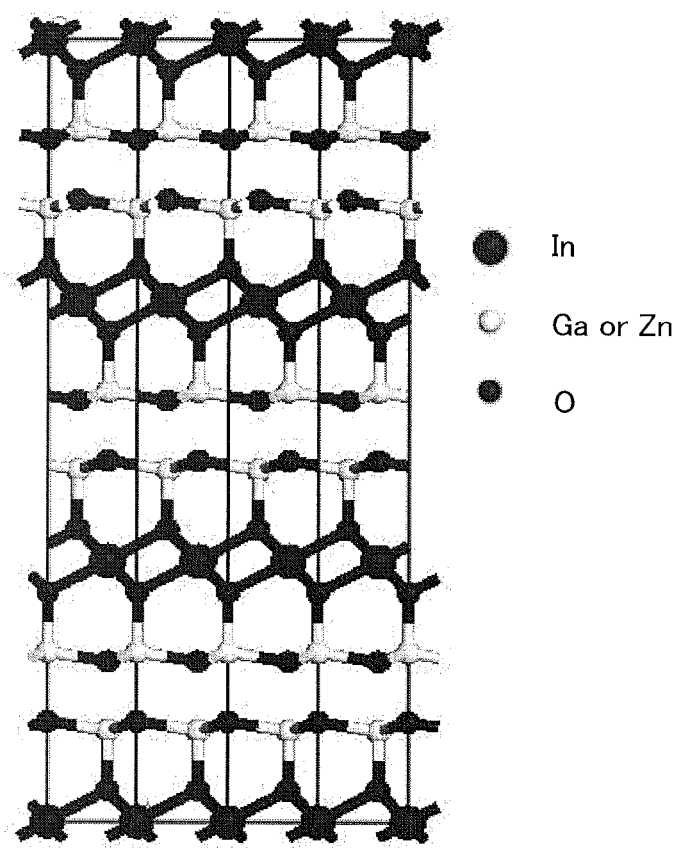
FIGS. 32A and 32B are diagrams illustrating structures of oxide materials according to one embodiment of the present invention.

In the case where n=1 ($InGaZnO_4$), a crystal structure illustrated in FIG. 32A can be obtained, for example. Note that in the crystal structure in FIG. 32A, since a Ga atom and an In atom each have five ligands as described in FIG. 15B, a structure in which Ga is replaced with In can be obtained.

Figure 32B:
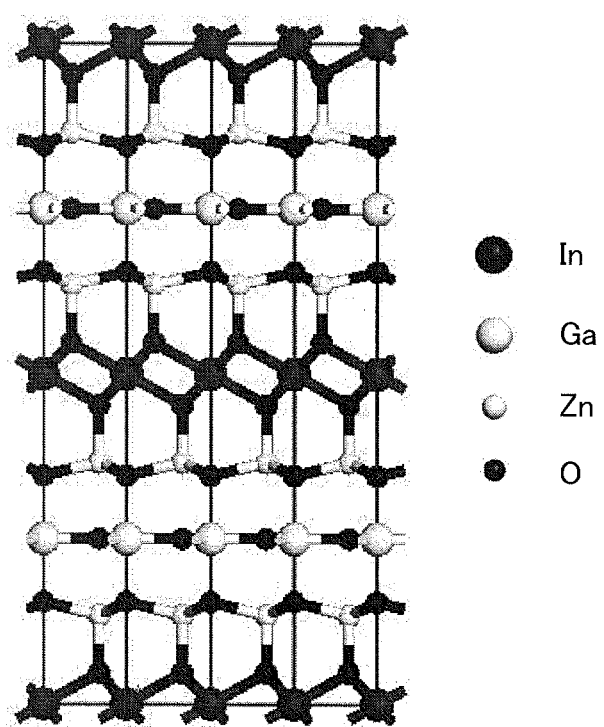

In the case where n=2 ($InGaZn_2O_5$), a crystal structure illustrated in FIG. 32B can be obtained, for example. Note that in the crystal structure in FIG. 14B, since a Ga atom and an In atom each have five ligands as described in FIG. 32B, a structure in which Ga is replaced with In can be obtained.

Either an n-channel transistor or a p-channel transistor can be used for the transistor 160 and the transistor 162. Here, the case where the transistors 160 and 162 are n-channel transistors will be described. The technical feature of the invention disclosed herein lies in the use of a semiconductor material with which off-state current can be sufficiently reduced, such as an oxide semiconductor, in the transistor 162 in order to hold data. Therefore, it is not necessary to limit specific conditions, such as a material, a structure, or the like of the semiconductor device, to those given here.

The transistor 160 includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as "drain electrode". In other words, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Here, the impurity region 126 and the impurity region 130 can function as a source region or a drain region of the transistor 160. Note that the conductive layer 128b is not necessarily provided. In that case, the impurity region 126, the impurity region 130, and the impurity region 132 can be formed as one impurity region functioning as a source region or a drain region of the transistor 160.

An insulating layer 136, an insulating layer 138, and an insulating layer 140 are stacked so as to cover the transistor 160. Note that the structure of the insulating layer covering the transistor 160 is not necessarily a stacked structure and a single structure can be employed. Alternatively, a stacked structure of two or more layers can be employed.

Note that in order to obtain higher integration, the transistor 160 preferably does not include a sidewall insulating layer as illustrated in FIGS. 1A and 1B. On the other hand, in the case where characteristics of the transistor 160 are emphasized, a sidewall insulating layer may be provided on a side surface of the gate electrode 128a and the impurity regions 132 may include an impurity region having a different impurity concentration provided in a region overlapping with the sidewall insulating layer.

Note that in the semiconductor device shown in FIGS. 1A and 1B, the channel formation region 134 and the channel formation region 126 of the transistor 160 are formed using the semiconductor layer provided over an oxidation film 512 over the semiconductor substrate 500; however, one embodiment of the present invention is not limited thereto. For example, instead of the semiconductor substrate 500, variety of glass substrates used in the electronics industry, such as an aluminosilicate glass substrate, an aluminoborosilicate glass substrate, or a barium borosilicate glass substrate; a quartz substrate; a ceramic substrate, or a sapphire substrate can be used. Alternatively, a ceramic substrate which contains silicon nitride and aluminum oxide as its main components and whose coefficient of thermal expansion is close to that of silicon may be used. Further alternatively, a channel formation region or an impurity region may be formed directly over the semiconductor substrate 500 without providing a semiconductor layer over the oxidation film 512. In that case, an element separation insulating layer is provided to cover the transistor 160 so that the transistor 160 is electrically separated.

The transistor 162 includes an oxide semiconductor layer 144 provided over an insulating layer 140 and the like, a source electrode (or a drain electrode) 142a and a drain electrode (or a source electrode) 142b electrically connected to the oxide semiconductor layer 144, a gate insulating layer 146 covering the oxide semiconductor layer 144, the source electrode 142a, and the drain electrode 142b, and a gate electrode 148a provided so as to overlap with the oxide semiconductor layer 144 over the gate insulating layer 146. Here, the drain electrode 142b of the transistor 162 is connected to the gate electrode 128a of the transistor 160. Accordingly, a potential of the gate electrode 128a of the transistor 160 can be held for an extremely long time for a charge retention characteristic of the transistor 162. In addition, the oxide semiconductor layer 144 serves as a channel formation region of the transistor 162 and is provided so as to overlap with at least part of the source region or the drain region of the transistor 160.

Here, the oxide semiconductor layer 144 used for the transistor 162 is preferably a purified oxide semiconductor layer by sufficiently removing impurities such as hydrogen or sufficiently supplying oxygen. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 144 is measured by secondary ion mass spectrometry (SIMS). In the oxide semiconductor layer 144 which is purified by sufficiently reducing the concentration of hydrogen therein and in which defect levels in an energy gap due to oxygen deficiency are reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature (25° C.) is lower than or equal to 100 zA (1 zA (zepto-ampere) is $1\times10^{-21}$ A), preferably lower than or equal to 10 zA. In this manner, by using the oxide semiconductor which is made to be an i-type (intrinsic) oxide semiconductor or a substantially i-type oxide semiconductor layer 144, the transistor 162 which has extremely favorable off-state current characteristics can be obtained.

The oxide semiconductor layer 144 has a sodium concentration of $5\times10^{16}$ atoms/cm$^3$ or less, preferably $1\times10^{16}$ atoms/cm$^3$ or less, and more preferably $1\times10^{15}$ atoms/cm$^3$ or less. The oxide semiconductor layer 144 has a lithium concentration of $5\times10^{15}$ atoms/cm$^3$ or less, preferably $1\times10^{15}$ atoms/cm$^3$ or less. The oxide semiconductor layer 144 has a potassium concentration of $5\times10^{15}$ atoms/cm$^3$ or less, preferably $1\times10^{15}$ atoms/cm$^3$ or less. The sodium concentration, the lithium concentration, and the potassium concentration in the oxide semiconductor layer 144 are measured by secondary ion mass spectrometry. An alkali metal and an alkaline earth metal are adverse impurities for the oxide semiconductor and are better contained as little as possible. An alkali metal, in particular, sodium diffuses into an oxide and becomes Na$^+$ when an insulating film in contact with the oxide semiconductor is an oxide. In addition, sodium cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5\times10^{19}$ cm$^{-3}$, particularly lower than or equal to $5\times10^{18}$ cm$^{-3}$.

Note that although the transistor 162 includes the oxide semiconductor layer 144 which is processed into an island shape in order to suppress leakage current between elements which is caused due to miniaturization, the oxide semiconductor layer which is not processed into an island shape may be employed. In the case where the oxide semiconductor layer is not processed into an island shape, contamination of the oxide semiconductor layer due to etching in the processing can be prevented.

The capacitor 164 includes the drain electrode 142b, the gate insulating layer 146, and a conductive layer 148b. In other words, the drain electrode 142b functions as one electrode of the capacitor 164, and the conductive layer 148b functions as the other electrode of the capacitor 164. With such a structure, capacitance can be sufficiently secured. Further, in the capacitor 164, insulating properties between the drain electrode 142b and the conductive layer 148b can be adequately secured by stacking the oxide semiconductor layer 144 and the gate insulating layer 146. Further alternatively, the capacitor 164 may be omitted in the case where a capacitor is not needed.

Note that in the transistor 162 and the capacitor 164, the source electrode 142a and the drain electrode 142b preferably have tapered end portions. When the end portions of the source electrode 142a and the drain electrode 142b are tapered, the coverage with the gate insulating layer 146 can be improved and a breaking thereof can be prevented. Here, a taper angle is, for example, greater than or equal to 30° and less than or equal to 60°. Note that the taper angle refers to an inclination angle formed with a side surface and a bottom surface of a layer having a tapered shape (for example, the source electrode 142a) when seen from a direction perpendicular to a cross section (a plane perpendicular to a surface of a substrate) of the layer.

The insulating layer 150 is provided over the transistor 162 and the capacitor 164. A wiring 154 is provided over the insulating layer 150 and is connected to the source electrode 142a through an opening formed in the gate insulating layer 146, the insulating layer 150, and the like. Here, the wiring 154 is preferably provided so as to overlap with the oxide semiconductor layer 144 of the transistor 162 at least partly. In addition, an insulating layer 156 may be provided over the wiring 154. Note that although the wiring 154, the source electrode 142a, and the impurity region 126 are connected to one another through the conductive layer 128b in FIGS. 1A and 1B, one embodiment of the present invention is not limited thereto. For example, the source electrode 142a may be directly in contact with the impurity region 126. Alternatively, the wiring 154 may be in contact with the source electrode 142a with another conductive layer therebetween.

In the semiconductor device shown in FIGS. 1A and 1B, the transistor 160 and the transistor 162 are provided to overlap with each other at least partly. In particular, the source region or the drain region of the transistor 160 and the oxide semiconductor layer 144 are provided so as to overlap with each other at least partly. The wiring 154 is provided so as to overlap with the oxide semiconductor layer 144 at least partly. In addition, the transistor 162, the capacitor 164, and the like are provided so as to overlap with the transistor 160. For example, the conductive layer 148b of the capacitor 164 is provided so as to overlap with the gate electrode 128a of the transistor 160 at least partly. With such a planar layout, the semiconductor device can be highly integrated. For example, in the case where a memory cell is formed using the semiconductor device, given that the minimum feature size is F, the area occupied by the memory cell can be approximately 15 F$^2$ to 25 F$^2$.

However, in the case where the transistor 160 and the transistor 162 are provided to overlap with each other at least partly, the source region or the drain region of the transistor 160 might function as a backgate electrode of the transistor 162. In particular, as shown in FIG. 1B, in the case where the oxide semiconductor layer 144 is formed so as to be over and across the source region or the drain region of the transistor 160, the source region or the drain region of the transistor 160 might be function as a backgate electrode. Note that the backgate electrode here refers to a pseudo backgate electrode provided opposite to the gate electrode 148a with a channel formation region in the oxide semiconductor layer 144 provided therebetween. In other words, when the source region or the drain region of the transistor 160 is supplied with the positive potential and the positive potential exceeds the threshold voltage $V_{th}$ (back) that is set by the backgate electrode, the transistor 162 is turned on. Even when the positive potential applied to the source region or the drain region of the transistor 160 is at a level at which the transistor 162 is not turned on, the threshold voltage $V_{th}$ that is set by the gate electrode 148a of the transistor 162 is shifted negatively (so that the transistor 162 is normally on). For example, when the positive potential is applied to the source region or the drain region of the transistor 160 in a reading operation or a writing operation of the semiconductor device, the threshold voltage $V_{th}$ of the transistor 162 is shifted negatively (so that the transistor 162 is normally on) and the leakage current of the transistor 162 is increased, which might result in deterioration of charge retention characteristics. In particular, in the case where a memory cell array or the like is formed using the semiconductor device according to this embodiment, charge held in the gate electrode 128a of the transistor 160 is lost, so that data in the memory cell might be changed. That is, memory retention of the semiconductor device might deteriorate. Note that memory retention refers to data retention characteristics of a memory.

In view the above, in the semiconductor device of one embodiment of the disclosed invention, in a period during which charge needs to be held in the gate electrode 128a of the transistor 160, that is, in a period during which the transistor 162 needs to be in an off state, at least when the positive potential is supplied to the source region or the drain region of the transistor 160, the negative potential is supplied to the gate electrode 148a. Here, the level of the negative potential supplied to the gate electrode 148a may be set as appropriate so that an influence on the transistor 162 by the positive potential supplied to the source region or the drain region of the transistor 160 can be suppressed.

Specifically, the negative potential $V_a$ supplied to the gate electrode 148a preferably satisfies the following formula (1) expressed using the positive potential $V_b$ supplied to the source region or the drain region of the transistor 160, the thickness $t_b$ and a composite relative permittivity $\in_{rb}$ of the insulating layer provided between the source region or the drain region of the transistor 160 and the oxide semiconductor layer 144 (a gate insulating layer 122a, an insulating layer 136, an insulating layer 138, and an insulating layer 140 in the semiconductor device shown in FIGS. 1A and 1B), and the thickness $t_a$ and the relative permittivity $\in_{ra}$ of the gate insulating layer 146.

[FORMULA 4]

$$V_a \leq -V_b \times \frac{t_a}{t_b} \times \frac{\varepsilon_{rb}}{\varepsilon_{ra}} \quad (1)$$

In other words, the negative potential $V_a$ may be set as appropriate in accordance with the positive potential $V_b$, the thickness $t_b$, the composite relative permittivity $\in_{rb}$, the thickness $t_a$, and the relative permittivity $\in_{ra}$.

Further, in the period during which the transistor 162 needs to be in the off state, at least when the positive potential is supplied to the source region or the drain region of the transistor 160, the negative potential is supplied to the gate electrode 148a. For example, the negative potential may be kept to be supplied to the gate electrode 148a all the time when the transistor 162 is in an off state.

In such a manner, since the negative potential is supplied to the gate electrode 148a, the potential of the gate electrode 148a is smaller than the threshold voltage of the transistor 162 even when the source region and the drain region of the transistor 160 function as a backgate electrode of the transistor 162. Accordingly, data in a memory cell is prevented from changing by leakage current generated between the source electrode and the drain electrode of the transistor 162. Thus, memory retention of the semiconductor device according to this embodiment can be improved.

Although a top-gate transistor is used as the transistor 162 in the semiconductor device shown in FIGS. 1A and 1B, the semiconductor device according to an embodiment of this embodiment is not limited thereto. For example, a bottom-gate transistor can be used as in the transistor 162 as the semiconductor device shown in FIGS. 2A and 2B.

Figure 2A:
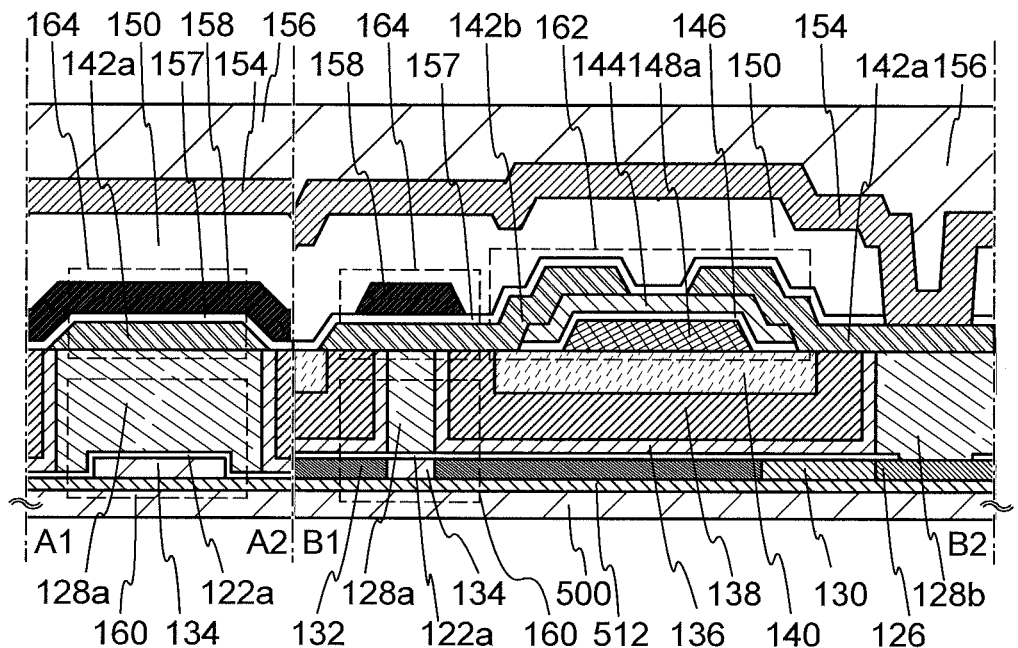
FIGS. 2A and 2B are a cross-sectional view and a plan view of a semiconductor device.
Figure 2B:
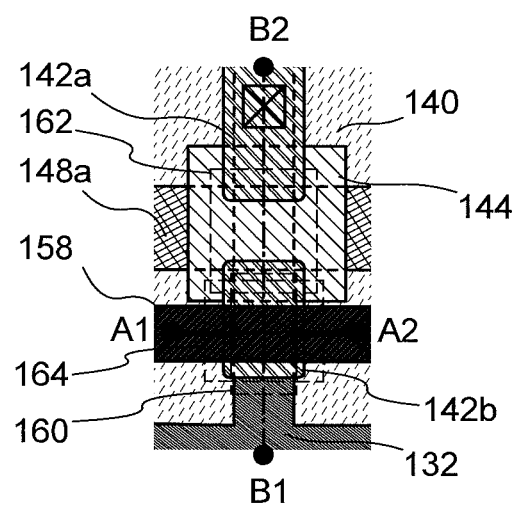

The transistor 162 shown in FIGS. 2A and 2B includes the gate electrode 148a, the gate insulating layer 146 covering the gate electrode 148a, the oxide semiconductor layer 144 provided over the gate insulating layer 146 so as to overlap with the gate electrode 148a, and the source electrode 142a and the drain electrode 142b electrically connected to the oxide semiconductor layer 144, which are formed over the insulating layer 140 and the like. The description of the semiconductor device shown in FIGS. 1A and 1B can be referred to for the details.

Further, in the semiconductor device shown in FIGS. 2A and 2B, an insulating layer 157 is provided over the transistor 162 and a conductive layer 158 is provided over the insulating layer 157 so as to overlap with the drain electrode 142b at least partly. That is, the conductive layer 158 functions as one electrode of the capacitor 164. Here, the insulating layer 157 can be formed using a material similar to that of the gate insulating layer 146, and the conductive layer 158 can be formed using a material similar to that of the conductive layer 148b shown in FIGS. 1A and 1B. The description of the semiconductor device shown in FIGS. 1A and 1B can be referred to for the details.

The insulating layer 150 is provided over the insulating layer 157 and the conductive layer 158. The wiring 154 is provided over the insulating layer 150 and is connected to the source electrode 142a through an opening formed in the gate insulating layer 146, the insulating layer 150, and the like. Here, the wiring 154 is provided so as to overlap with the oxide semiconductor layer 144 of the transistor 162 at least partly. The description of the semiconductor device shown in FIGS. 1A and 1B can be referred to for the details.

Note that the configuration of other portions is similar to that of the semiconductor device shown in FIGS. 1A and 1B; therefore, the description of the semiconductor device can be referred to for the details.

In the semiconductor device shown in FIGS. 2A and 2B, the transistor 160 and the transistor 162 are provided to overlap with each other at least partly. In particular, the source region or the drain region of the transistor 160 and the oxide semiconductor layer 144 are provided so as to overlap with each other at least partly. The wiring 154 is provided so as to overlap with the oxide semiconductor layer 144 at least partly. In addition, the transistor 162, the capacitor 164, and the like are provided so as to overlap with the transistor 160. For example, the conductive layer 148b of the capacitor 164 is provided so as to overlap with the gate electrode 128a of the transistor 160 at least partly. With such a planar layout, the semiconductor device can be highly integrated. For example, in the case where a memory cell is formed using the semiconductor device, given that the minimum feature size is F, the area occupied by the memory cell can be approximately 15 $F^2$ to 25 $F^2$.

Here, also in the semiconductor device shown in FIGS. 2A and 2B, in the case where the oxide semiconductor layer 144 of the transistor 162 and the wiring 154 are provided so as to overlap with each other at least partly, the wiring 154 might function as a backgate electrode of the transistor 162.

In view the above, in the semiconductor device according to an embodiment of the disclosed invention, in the period during which the transistor 162 needs to be in the off state, at least when the positive potential is supplied to the wiring 154, a negative potential is supplied to the gate electrode 148a. Here, a level of the negative potential supplied to the gate electrode 148a may be set as appropriate so that an influence by the positive potential supplied to the wiring 154 on the transistor 162 is suppressed.

Specifically, the negative potential $V_a$ supplied to the gate electrode 148a preferably satisfies the following formula (2) expressed using the positive potential $V_c$ supplied to the wiring 154, the thickness $t_c$ and the composite relative permittivity $\in_{rc}$ of the insulating layer provided between the wiring 154 and the oxide semiconductor layer 144 (the insulating layer 150, the insulating layer 157 in the semiconductor device shown in FIGS. 2A and 2B), and the thickness $t_a$ and the relative permittivity $\in_{ra}$ of the gate insulating layer 146.

[FORMULA 5]

$$V_a \leq -V_c \times \frac{t_a}{t_c} \times \frac{\varepsilon_{rc}}{\varepsilon_{ra}} \qquad (2)$$

In other words, the negative potential $V_a$ may be set as appropriate in accordance with the positive potential $V_c$, the thickness $t_c$, the composite relative permittivity $\in_{rc}$, the thickness $t_a$, and the relative permittivity $\in_{ra}$.

Further, in the period during which the transistor 162 needs to be in the off state, at least when the positive potential is supplied to the wiring 154, the negative potential is supplied to the gate electrode 148a. For example, the negative potential may be kept to be supplied to the gate electrode 148a all the time when the transistor 162 is in the off state.

In such a manner, since the negative potential is supplied to the gate electrode 148a, the potential of the gate electrode 148a is smaller than the threshold voltage of the transistor 162 even when the wiring 154 function as a backgate electrode of the transistor 162. Accordingly, data in a memory cell is prevented from changing by leakage current generated between the source electrode and the drain electrode of the transistor 162. Thus, memory retention of the semiconductor device according to this embodiment can be improved. Thus, memory retention of the semiconductor device of this embodiment can be improved.

Although a transistor in which the source electrode 142a and the drain electrode 142b are in contact with at least a top surface of the oxide semiconductor layer 144 is used as the transistor 162 in the semiconductor devices shown in FIGS. 1A and 1B and FIGS. 2A and 2B, an embodiment of the disclosed invention is not limited thereto. For example, a transistor in which the oxide semiconductor layer 144 is in contact with each top surface of the source electrode 142a and the drain electrode 142b may be used as the transistor 162.

<Circuit Configuration of Semiconductor Device>

Next, circuit configurations and operations of the semiconductor devices illustrated in FIGS. 1A and 1B and FIGS. 2A and 2B will be described with reference to FIGS. 3A to 3D. Note that in each of circuit diagrams, in some cases, "OS" is written beside a transistor in order to indicate that the transistor includes an oxide semiconductor.

<Basic Configuration>

Figure 3A:
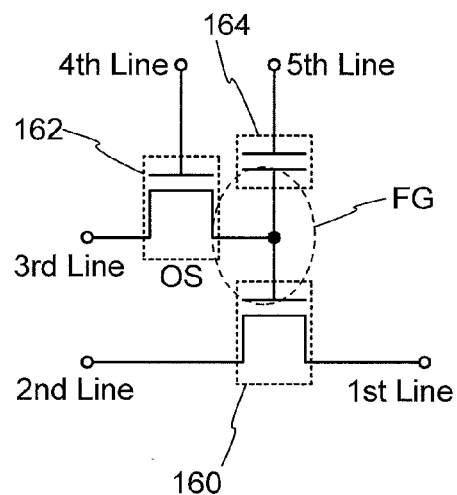
FIGS. 3A to 3D are circuit diagrams of a semiconductor device.

In a semiconductor device illustrated in FIG. 3A, a first wiring (a 1st Line) is electrically connected to a source electrode (or a drain electrode) of the transistor 160. A second wiring (a 2nd Line) is electrically connected to the drain electrode (or the source electrode) of the transistor 160. In addition, a third wiring (a 3rd line) and a source electrode (or a drain electrode) of a transistor 162 are electrically connected to each other, and a fourth wiring (a 4th line) and a gate electrode of the transistor 162 are electrically connected to each other. In addition, a gate electrode of the transistor 160 and the drain electrode (or the source electrode) of the transistor 162 are electrically connected to one electrode of a capacitor 164, and a fifth wiring (a 5th line) and the other electrode of the capacitor 164 are electrically connected to each other. In addition, the second wiring and the third wiring may be connected to each other as shown in FIG. 3B.

Figure 3B:
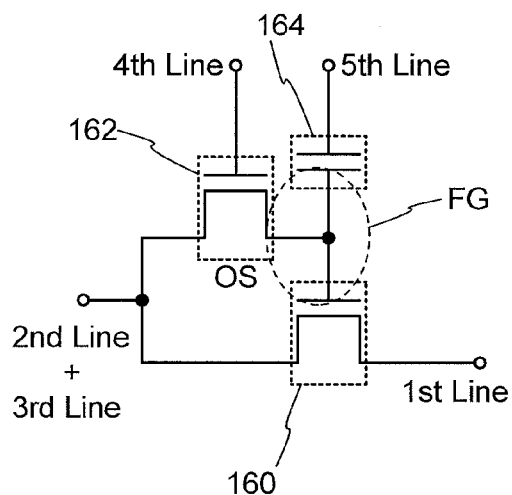

Note that the circuit configuration in FIGS. 3A and 3B corresponds to the configuration included in the semiconductor device in FIGS. 1A and 1B or FIGS. 2A and 2B. That is, a wiring electrically connected to one of the source region and the drain region of the transistor 160 (on the side where the source region and the drain region of the transistor 160 does not overlap with the oxide semiconductor layer 144) shown in FIGS. 1A and 1B or FIGS. 2A and 2B corresponds to the first wiring. A wiring electrically connected to the other of the source region and the drain region of the transistor 160 (on the side where the source region and the drain region of the transistor 160 overlap with the oxide semiconductor layer 144) shown in FIGS. 1A and 1B or FIGS. 2A and 2B corresponds to the second wiring. A wiring (the wiring 154) electrically connected to the source electrode 142a of the transistor 162 shown in FIGS. 1A and 1B or FIGS. 2A and 2B corresponds to the third wiring. A wiring electrically connected to the gate electrode 148a of the transistor 162 shown in FIGS. 1A and 1B or FIGS. 2A and 2B corresponds to the fourth wiring. A wiring electrically connected to the conductive layer 148b shown in FIGS. 1A and 1B or FIGS. 2A and 2B corresponds to the fifth wiring. Note that the first wiring and the second wiring may be inversed. That is, the wiring electrically connected to one of the source region and the drain region of the transistor 160 (on the side where the source region and the drain region of the transistor 160 does not overlap with the oxide semiconductor layer 144) may correspond to the second wiring. The wiring electrically connected to the other of the source region and the drain region of the transistor 160 (on the side where the source region and the drain region of the transistor 160 overlap with the oxide semiconductor layer 144) may correspond to the first wiring. Here, the circuit configuration shown in FIG. 3A corresponds to a circuit configuration in which the conductive layer 128b is not provided and the source region or the drain region of the transistor 160 is not electrically connected to the source electrode 142a of the transistor 162 in the semiconductor device shown in FIGS. 1A and 1B or FIGS. 2A and 2B. FIG. 3B corresponds to a circuit configuration in which the conductive layer 128b is provided and the source region or the drain region of the transistor 160 is electrically connected to the source electrode 142a of the transistor 162 in the semiconductor device shown in FIGS. 1A and 1B or FIGS. 2A and 2B.

Here, the above transistor including an oxide semiconductor is used as the transistor 162, for example A transistor including an oxide semiconductor has a characteristic of a significantly small off current. For that reason, a potential of the gate electrode of the transistor 160 can be held for an extremely long time by turning off the transistor 162. Provision of the capacitor 164 facilitates holding of charge given to the gate electrode of the transistor 160 and reading of stored data.

Note that there is no particular limitation on a material of the transistor 160; a transistor including a semiconductor material that is not an oxide semiconductor is used, for example. In terms of increasing the speed of reading data, it is preferable to use, for example, a transistor with high switching rate such as a transistor formed using single crystal silicon.

Figure 3C:
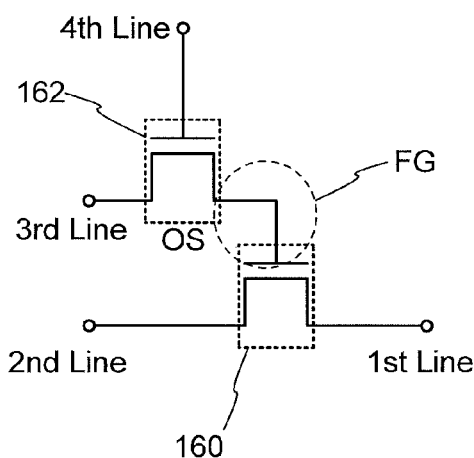

As shown in FIG. 3C, the capacitor 164 can be omitted in FIG. 3A. The capacitor 164 can be omitted from the structure illustrated in FIG. 3B.

The semiconductor device in FIG. 3A utilizes an advantage that the potential of the gate electrode of the transistor 160 can be held, whereby writing, holding, and reading of data can be performed as described below.

Firstly, writing and holding of data will be described. First, the potential of the fourth wiring is set to a potential at which the transistor 162 is turned on, so that the transistor 162 is turned on. Accordingly, the potential of the third wiring is supplied to a node (also referred to as a node FG) where the drain electrode (or the source electrode) of the transistor 162, the gate electrode of the transistor 160, and one electrode of the capacitor 164 are electrically connected. That is, predetermined charge is given to the gate electrode of the transistor 160 (writing operation). Here, one of charges for supply of two different potentials (hereinafter, a charge for supply of a low potential is referred to as a charge $Q_L$ and a charge for supply of a high potential is referred to as a charge $Q_H$) is given. Note that charges giving three or more different potentials may be applied to improve a storage capacitor. After that, the potential of the fourth wiring is set to a potential at which the transistor 162 is turned off, so that the transistor 162 is turned off. Thus, the charge given to the gate electrode of the transistor 160 is held (holding operation).

Since the off-state current of the transistor 162 is significantly small, the charge in the gate electrode of the transistor 160 is held for a long period.

However, in the case where the transistor 160 and the transistor 162 are provided to overlap with each other at least partly in the semiconductor device shown in FIGS. 1A and 1B, the source region or the drain region of the transistor 160 might function as a backgate electrode of the transistor 162. In the writing and holding of data, according to a driving method in which the positive potential is supplied to the second wiring in a period during which charge needs to be held in the node FG, that is, the period during which the transistor 162 needs to be in the off state, the threshold voltage of the transistor 162 is shifted negatively (shifted to the normally-on side). Consequently, the leakage current of the transistor 162 is increased, which might lead to deterioration of memory retention. Particularly, with a structure in which the second wiring and the third wiring are connected to each other, also according to a driving method in which the positive potential is supplied to the third wiring, the memory retention might be deteriorated.

Here, also in the semiconductor device shown in FIGS. 2A and 2B, in the case where the oxide semiconductor layer 144 of the transistor 162 and the wiring 154 are provided so as to overlap with each other at least partly, the wiring 154 might function as a backgate electrode of the transistor 162. In the writing and holding of data, according to a driving method in which the positive potential is supplied to the third wiring in the period during which the transistor 162 needs to be in the off state, the leakage current of the transistor 162 is increased, which might lead to deterioration of retention characteristics. Particularly, with a structure in which the second wiring and the third wiring are connected to each other, also according to a driving method in which the positive potential is supplied to the second wiring, the memory retention might be deteriorated.

However, in the period during which the transistor 162 needs to be in the off state, the negative potential is supplied to the gate electrode 148a of the transistor 162, that is, the fourth wiring at least when the positive potential is supplied to the second wiring or the third wiring, so that the potential of the fourth wiring becomes smaller than the threshold voltage of the transistor 162. As a result, even when the second wiring or the third wiring of the transistor 162 functions as a backgate electrode, data in a memory cell is prevented from changing by leakage current generated between the source electrode and the drain electrode of the transistor 162. Thus, memory retention of the semiconductor device according to this embodiment can be improved. In particular, the negative potential $V_a$ applied to the fourth wiring preferably satisfies the formula (1) or the formula (2) described above.

Secondly, reading of data will be described. By supplying an appropriate potential (reading potential) to the fifth wiring while a predetermined potential (constant potential) is supplied to the first line, the potential of the second line varies depending on the amount of charge held in the gate electrode of the transistor 160. That is, the conductance of the transistor 160 is controlled by the charge held in the gate electrode (also referred to as a node FG) of the transistor 160. This is because, in general, an apparent threshold voltage $V_{th\_H}$ in the case where $Q_H$ is supplied to the gate electrode of the transistor 160 is lower than an apparent threshold voltage $V_{th\_L}$ in the case where $Q_L$ is supplied to the gate electrode of the transistor 160. Here, the apparent threshold voltage refers to the potential of the fifth wiring to make the transistor 160 the "on state" from the "off state" or to make the transistor 160 the "off state" from the "on state". Thus, the potential of the fifth wiring is set to a potential $V_0$ intermediate between $V_{th\_H}$ and $V_{th\_L}$, whereby charge given to the gate electrode of the transistor 160 can be determined. For example, when the transistor 160 is an n-channel transistor, in the case where charge $Q_H$ is supplied in writing, when the potential of the fifth wiring is set to $V_0$ ($>V_{th\_H}$), the transistor 160 is turned on. In the case where $Q_L$ is supplied in writing, even when the potential of the fifth wiring is set to $V_0$ ($>V_{th\_L}$), the transistor 160 remains in an off state. Note that in the case where the transistor 160 is a p-channel transistor, when $Q_L$ is supplied, the transistor 160 is in the "on state", and when $Q_H$ is supplied, the transistor 160 remains in the "off state". Therefore, the stored data can be read by the potential of the second wiring.

However, in the case where the transistor 160 and the transistor 162 are provided to overlap with each other at least partly in the semiconductor device shown in FIGS. 1A and 1B, the source region or the drain region of the transistor 160 might function as a backgate electrode of the transistor 162. In the reading of data, when the positive potential is supplied to the second wiring in the period during which charge needs to be held in the node FG; that is, the period during which the transistor 162 needs to be in the off state, the threshold voltage of the transistor 162 is shifted negatively (shifted to the normally-on side). Thus, the leakage current of the transistor 162 is increased, which might lead to deterioration of memory retention. Particularly, with a structure in which the second wiring and the third wiring are connected to each other, also according to a driving method in which the positive potential is supplied to the third wiring, the memory retention might be deteriorated.

Also in the semiconductor device shown in FIGS. 2A and 2B, in the case where the oxide semiconductor layer 144 of the transistor 162 and the wiring 154 are provided so as to overlap with each other at least partly, the wiring 154 might function as a backgate electrode of the transistor 162. In the writing and holding of data, according to a driving method in which the positive potential is supplied to the third wiring in the period during which the transistor 162 needs to be in the off state, the leakage current of the transistor 162 is increased, which might lead to deterioration of retention characteristics. Particularly, with a structure in which the second wiring and the third wiring are connected to each other, also according to a driving method in which the positive potential is supplied to the second wiring, the memory retention might be deteriorated.

However, in the period during which the transistor 162 needs to be in the off state, the negative potential is supplied to the gate electrode 148a of the transistor 162, that is, the fourth wiring at least when the positive potential is supplied to the second wiring or the third wiring, so that the potential of the fourth wiring becomes smaller than the threshold voltage of the transistor 162. As a result, even when the second wiring or the third wiring of the transistor 162 functions as a back-gate electrode, data in a memory cell is prevented from changing by leakage current generated between the source electrode and the drain electrode of the transistor 162. Thus, memory retention of the semiconductor device according to this embodiment can be improved. In particular, the negative potential $V_a$ applied to the fourth wiring preferably satisfies the formula (1) or the formula (2) described above.

Note that in the case where memory cells are arrayed and used, only data of desired memory cells needs to be read. Thus, in order that data of a predetermined memory cell is read and data of the other memory cells is not read, in the case where the transistors 160 are connected in parallel between the memory cells, potential which allows the transistor 160 to be turned off regardless of a state of the gate electrode, that is, potential lower than $V_{th\_H}$ may be supplied to fifth wirings of the memory cells whose data is not to be read. On the other hand, in the case where the transistors 160 are connected in series among the memory cells, fifth wirings in memory cells that are not a target for reading are supplied with a potential at which the transistors 160 are turned on regardless of the state of the gate electrodes, that is, a potential higher than $V_{th\_L}$.

Next, rewriting of data will be described. Rewriting of data is performed in a manner similar to that of the writing and holding of data. In other words, the potential of the fourth wiring is set to a potential at which the transistor 162 is turned on, so that the transistor 162 is turned on. Accordingly, the potential of the third wiring (a potential for new data) is supplied to the gate electrode of the transistor 160 and the capacitor 164. After that, the potential of the fourth wiring is set to a potential at which the transistor 162 is turned off, so that the transistor 162 is turned off. Accordingly, charge for new data is supplied to the gate electrode of the transistor 160.

In the semiconductor device according to an embodiment of the disclosed invention, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the node (the node FG) where the drain electrode (or the source electrode) of the transistor 162, the gate electrode of the transistor 160, and one electrode of the capacitor 164 are electrically connected has a function similar to that of a floating gate of a floating-gate transistor used for a nonvolatile memory element. When the transistor 162 is turned off, the node FG can be regarded as being embedded in an insulator and thus charge is held at the node FG. The off-state current of the transistor 162 including an oxide semiconductor is smaller than or equal to 1/100000 of the off-state current of a transistor including a silicon semiconductor or the like; thus, loss of the charge accumulated in the node FG due to leakage in the transistor 162 is negligible. That is, with the transistor 162 including an oxide semiconductor, a nonvolatile memory device which can hold data without being supplied with power can be realized.

For example, when the off-state current of the transistor 162 at room temperature (25° C.) is 10 zA (1 zA (zeptoampere) is $1 \times 10^{-21}$ A) or less and the capacitance of the capacitor 164 is approximately 10 fF, data can be held for $10^4$ seconds or longer. It is needless to say that the holding time depends on transistor characteristics and capacitance.

Further, the semiconductor device according to an embodiment of the disclosed invention does not have the problem of deterioration of a gate insulating film (tunnel insulating film), which is a problem of a conventional floating gate transistor. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figure 3D:
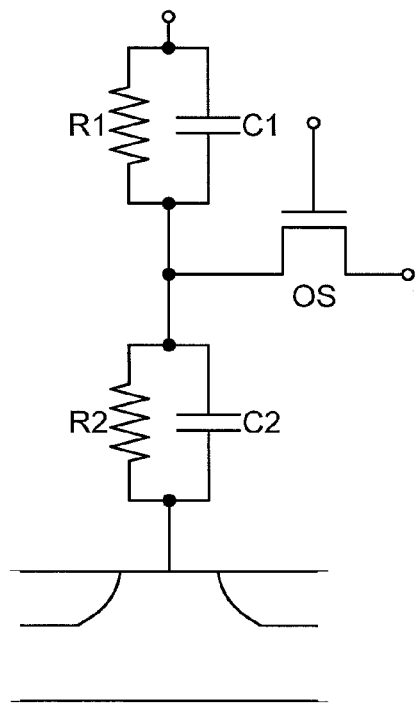

Components such as transistors in the semiconductor device in FIG. 3A can be regarded as including resistors and capacitors as illustrated in FIG. 3D. That is, in FIG. 3D, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small, R1 is greater than or equal to ROS, and R2 is greater than or equal to ROS, where ROS is the resistance (also referred to as effective resistance) between the source electrode and the drain electrode in a state where the transistor 162 is turned off.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode) is large. Accordingly, it can be said that it is preferable that the semiconductor device disclosed in this embodiment satisfies the relationships in that R1 is greater than or equal to ROS and R2 is greater than or equal to ROS.

Meanwhile, C1 is preferably greater than or equal to C2. This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to a floating gate of a floating gate transistor of a flash memory or the like, but the node FG of this embodiment has a feature that is essentially different from that of the floating gate of the flash memory or the like. In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates higher integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

In the case where the relative permittivity $\epsilon r1$ of the insulating layer included in the capacitor 164 is different from the relative permittivity $\epsilon r2$ of the insulating layer included in the transistor 160, it is easy to satisfy that C1 is greater than or equal to C2 while satisfying that 2·S2 is greater than or equal to S1, preferably S2 is greater than or equal to S1, where S1 is the area of the insulating layer included in the capacitor 164 and S2 is the area of the insulating layer forming a gate capacitor of the transistor 160. In other words, C1 can easily be made greater than or equal to C2 while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that $\epsilon r1$ can be set to 10 or more, preferably 15 or more, and silicon oxide is used for the insulating layer forming the gate capacitor so that $\epsilon r2$ can be set to 3 to 4.

A combination of such structures enables the semiconductor device according to one embodiment of the disclosed invention to have further higher integration.

Note that in addition to higher integration, a multilevel technique can be employed in order to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q to the gate electrode of the first transistor, in addition to charge $Q_L$ providing a low potential and charge $Q_H$ providing a high potential. In this case, enough storage capacity can be secured even when a circuit configuration in which $F^2$ is not sufficiently small is employed.

Note that, in the above description, an n-type transistor (an n-channel transistor) using electrons as carriers is used; however, a p-channel transistor using holes as carriers, needless to say, can be used instead of an n-channel transistor.

As described above, the semiconductor device according to this embodiment is suitable for increasing the integration degree. Note that according to one embodiment of the present invention, a wiring is shared and the contact region is reduced; thus, a semiconductor device whose integration degree is further increased can be provided.

APPLICATION EXAMPLE 1

Next, a more specific circuit structure to which the circuit illustrated in FIGS. 3A to 3D is applied and an operation thereof will be described with reference to FIG. 4, FIG. 5, and FIG. 6. Note that the case where an n-channel transistor is used as a writing transistor (the transistor 162) and a p-channel transistor is used as a reading transistor (the transistor 160) will be described below as an example. Note that the slashes in the timing chart of FIG. 5 means that the corresponding line may have either a high potential and a low potential.

Figure 4:
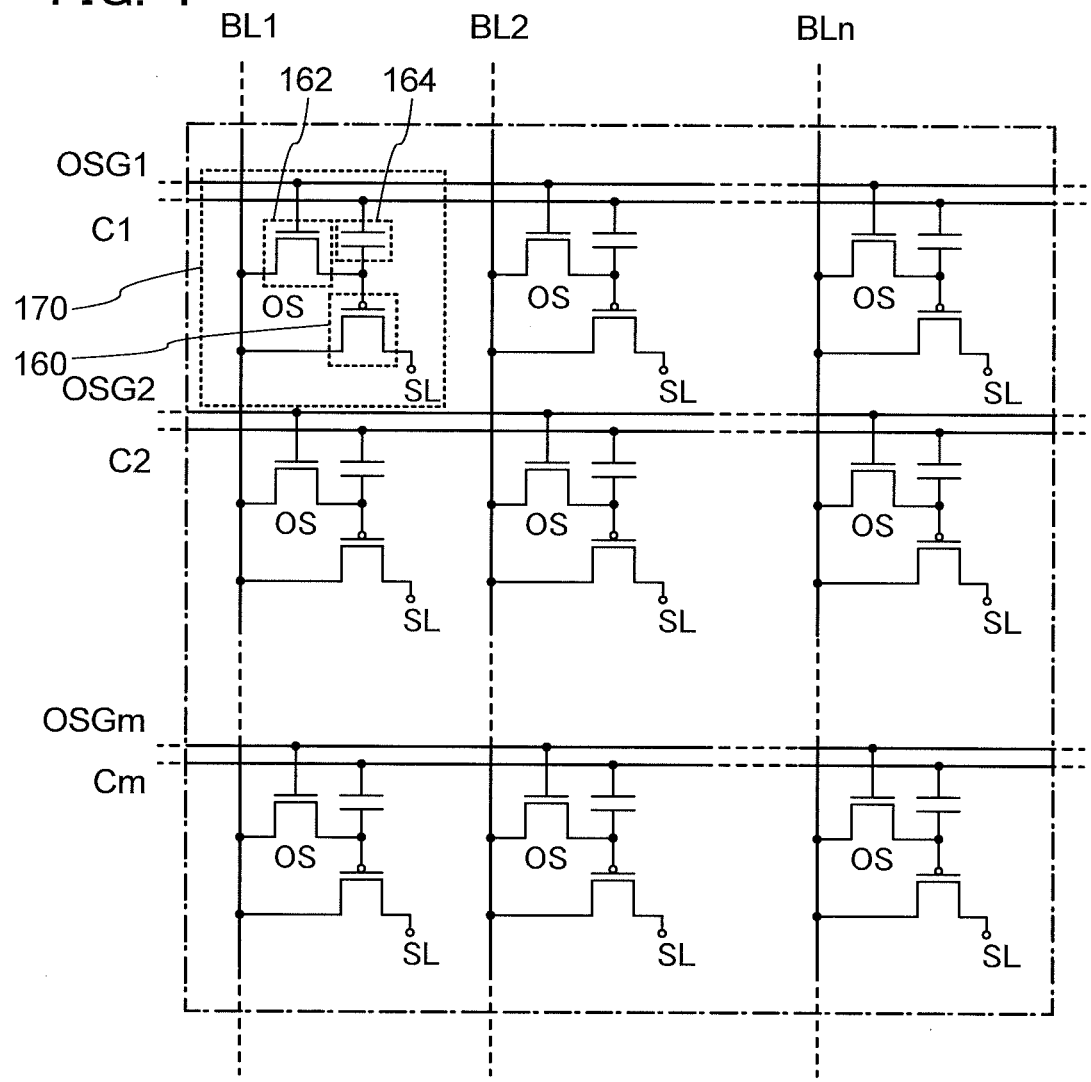
FIG. 4 is a circuit diagram of a semiconductor device.

FIG. 4 is an example of a circuit diagram of a semiconductor device including (m×n) memory cells 170. The semiconductor device illustrated in FIG. 4 includes m (m is an integer greater than or equal to 2) write word lines OSG, m write-read word lines C, n (n is an integer greater than or equal to 2) bit lines BL, a source line SL, a memory cell array having the memory cells 170 arranged in a matrix of in (rows)×n (columns). In FIG. 4, in the case where the same kinds of plurality of wirings are included in each block, the wirings are denoted by reference numerals.

Here, for the memory cell 170, the structure in which the second wiring and the third wiring are connected to each other (the structure shown in FIG. 3B) in the circuit structure described above is employed. That is, each of the memory cells 170 includes the first transistor 160, the second transistor 162, and the capacitor 164. In each of the memory cells 170, a gate electrode of the first transistor 160, a drain electrode (or a source electrode) of the second transistor 162, and one electrode of the capacitor 164 are electrically connected to one another, and the source line SL and a source electrode of the first transistor 160 are electrically connected to each other. Further, the bit line BL, the drain electrode of the first transistor 160, and the source electrode (or the drain electrode) of the second transistor 162 are electrically connected to one another. The write-read word line C and the other electrode of the capacitor 164 are electrically connected to each other. The write word line OSG and the gate electrode of the second transistor 162 are electrically connected to each other. In other words, the source line SL corresponds to the first wiring (the 1st Line) in the configuration illustrated in FIG. 3B, the bit line BL corresponds to the second wiring (the 2nd Line) and the third wiring (the 3rd Line), the write word line OSG corresponds to the fourth wiring (the 4th Line), and the write-read word line C corresponds to the fifth wiring (the 5th Line).

In the semiconductor device shown in FIG. 4, the source line SL is provided per memory cell 170; however, without limitation thereto, one source line SL may be shared among a plurality of memory cells.

The bit line BL, the source line SL, the write word line OSG, and the write-read word line C are electrically connected to driver circuits provided around the memory cell array. The driver circuits may be provided independently according to the kind of wirings, or a plurality of kinds of wirings may be electrically connected to one driver circuit.

Data writing, holding, and reading in the semiconductor device illustrated in FIG. 4 are basically similar to those in the case of FIGS. 3A to 3D. FIG. 5 is an example of a timing chart for the writing and reading operations of the semiconductor device in FIG. 4.

Specifically, the following case will be described: in the writing to the first row, data "1" and data "0" are written to the memory cell in the first row and the first column and the memory cell in the first row and the n-th column, respectively, and in the writing to the m-th row, data "0" and data "1" are written to the memory cell in the m-th row and the first column and the memory cell in the m-th row and the n-th column, respectively, and then, all of the written data is read. Note that a high potential (a power supply potential VDD or the like) is supplied to the node FG of the memory cell to write data "1" to the memory cell and a low potential (a ground potential GND or the like) is supplied to the node FG of the memory cell to write data "0" to the memory cell.

First, the writing operation will be described. In the writing period, a potential VH is supplied to the write word line OSG1 in the first row that is a selected row, whereby the transistor 162 is turned on. In addition, a potential VL is supplied to the write word lines OSG1 to OSGm in the second row to the m-th row that are unselected rows, whereby the transistors 162 are turned off. Here, the potential VH is preferably higher than the potential obtained by adding the threshold voltage of the transistor 162 to the power supply potential VDD. As a result, when data is written, the power supply potential VDD corresponding to data "1" can be written to the node FG even when the potential of the bit line BL is decreased by the threshold voltage of the transistor 162.

Further, the low potential (a ground potential GND or the like) is supplied to the write-read word line C1 in the first row which is the selected row and the power supply potential VDD is supplied to the write-read word lines C2 to Cm in the second row to the m-th row which are the unselected rows. In such a manner, by supplying the power supply potential VDD to the write-read word lines C2 to Cm in the second row to the m-th row, the transistor 160 is turned off in each of the second row to the m-th row even in a memory cell in which data "0" or "1" is held. Thus, in the second to m-th rows, current does not flow even if the potentials of the common source lines SL and the common bit lines BL1 to BLn are different from each other.

Further, in the case where a ground potential GND is supplied to the node FG, the potential of the source line SL is set to a ground potential GND in order to prevent current flowing in the bit line BL and the source line SL.

Then, the power supply potential VDD is supplied to the bit line BL1 in the first column, and the ground potential GND is supplied to the bit lines BLn in the n-th column. As a result, the power supply potential VDD is supplied to a floating gate portion FG of the memory cell 170 in the first row and the first column, and the ground potential GND is supplied to floating gate portions FG of the memory cell 170 in the first row and the n-th column. That is, data "1" is written to the memory cell in the first row and the first column, and data "0" is written to the memory cell in the first row and the n-th column Then, the write word line in the first row OSG1 is set to the potential VL, so that the transistor 162 is turned off. Thus, the writing is completed. Note that the signal input period of the bit line BL is set so as to be longer than that of the write word line OSG in the first row and the write-read word line in the first row C1 for the following reason: if the signal input period of the bit line BL is short, incorrect writing of data to the memory cell might be caused. Hereinafter, data can be written to the memory cells in the second row to the m-th row by the same method. For example, when data in the m-th row is written, the writing operation similar to the method described above can be performed in a manner similar to the above, in which the first row to the (m–1)-th row are unselected and the m-th row is selected.

Here, since the memory cell 170 is formed using the semiconductor device shown in FIGS. 1A and 1B or FIGS. 2A and 2B, the bit lines BL might function as a backgate electrode of the transistor 162 in the period during which charge needs to be held in the node FG, that is, the period during which the transistor 162 needs to be in the off state. For example, in the above writing period, the transistors 162 in the unselected rows needs to be turned off in order to hold data; however, the power supply potential VDD is supplied to the bit line BL in the selected row and in the column to which data "1" is written, so that the bit line BL in the column might function as a backgate of the transistor 162 in the unselected row. Further, when the writing of data "1" to the memory cells in the selected row is completed, the power supply potential VDD is supplied to the bit line BL of the memory cell, so that the bit line BL might function as a backgate. In such a manner, by functioning as a backgate of the transistor 162, data in the memory cell 170 might be changed by leakage current generated between the source electrode and the drain electrode of the transistor 162.

Figure 5:
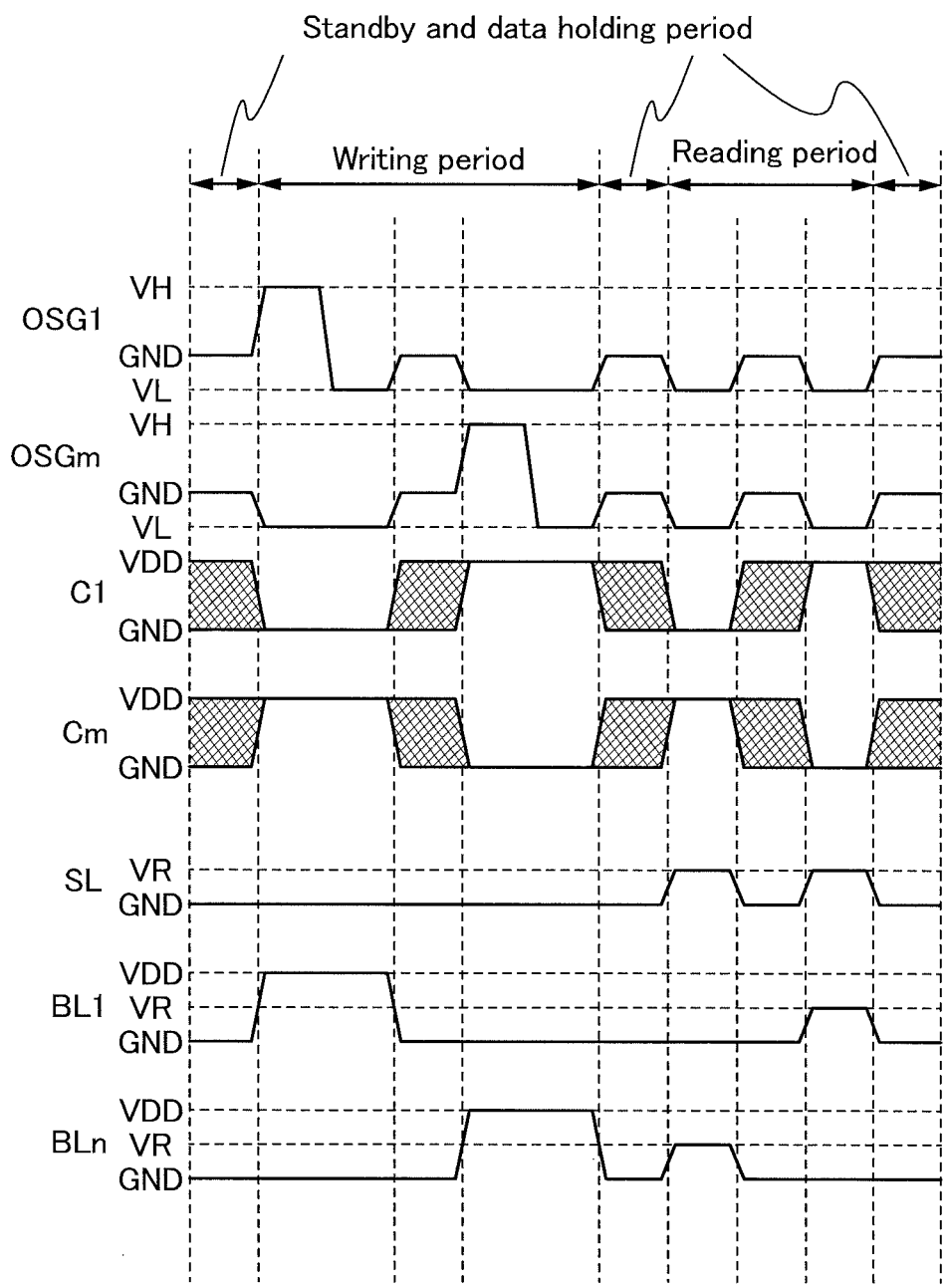
FIG. 5 is a timing chart of a semiconductor device.

However, as shown in FIG. 5, the potential VL is supplied to the write word line OSG in the unselected row with the timing at which the power supply potential VDD is supplied to the bit line BL and the potential of the write word line OSG is changed from the potential VH to the potential VL when the transistor 162 in the selected row is turned off, so that the potential of the write word line OSG becomes smaller than the threshold voltage of the transistor 162 even when the bit line BL functions as a backgate of the transistor 162. That is, in the period during which the transistor 162 needs to be in the off state, the negative potential (the potential VL) is supplied to the gate electrode of the transistor 162, that is, the write word line OSG at least when the positive potential is supplied to the bit line BL, so that even when the bit line BL functions as a backgate electrode of the transistor 162, data in the memory cell 170 is prevented from changing by leakage current generated between the source electrode and the drain electrode of the transistor 162. Thus, memory retention of the semiconductor device according to this embodiment can be improved. In particular, the negative potential (the potential VL) applied to the write word line OSG preferably satisfies the negative potential $V_a$ in the formula (1) or the formula (2) described above.

Figure 6:
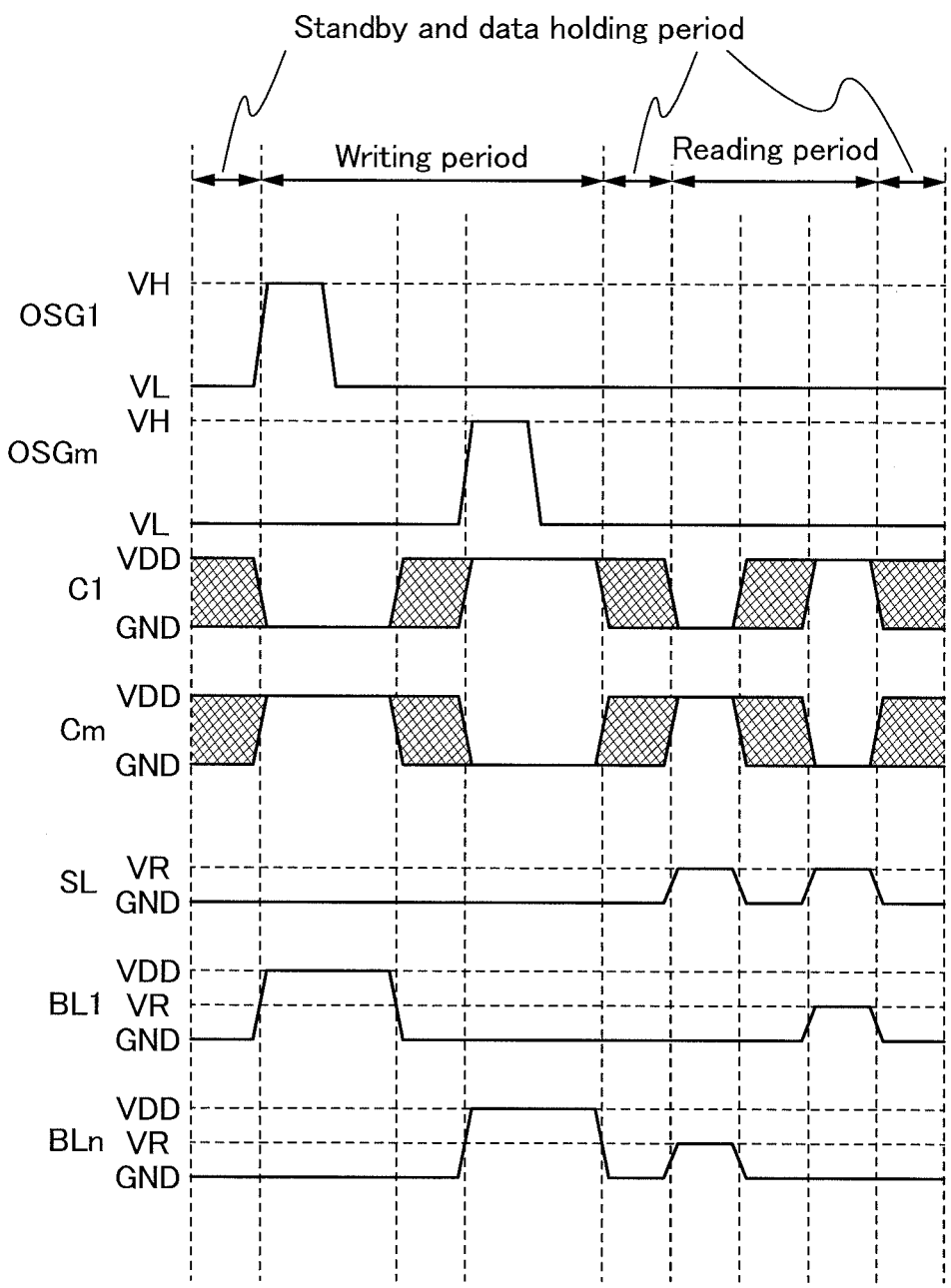
FIG. 6 is a timing chart of a semiconductor device.

Note that in the period during which the transistor 162 needs to be in the off state, the negative potential is supplied to the write word line OSG at least when the positive potential is supplied to the bit line BL; therefore, for example, as shown in FIG. 6, no ground potential GND may be supplied to the write word line OSG, and the negative potential may be kept to be supplied to the write word line OSG all the time when the transistor 162 is in an off state.

Next, reading operation is described. In a reading period, the potential VL is applied to the write word line OSG regardless of whether it is in the selected row or in the unselected row, whereby the transistor 162 is turned off.

Further, the low potential (a ground potential GND or the like) is supplied to the write-read word line C1 in the first row which is the selected row and the power supply potential VDD is supplied to the write-read word lines C2 to Cm in the second row to the m-th row which are the unselected rows. In such a manner, by supplying the power supply potential VDD to the write-read word lines C2 to Cm in the second row to the m-th row, the transistor 160 is turned off in each of the second row to the m-th row even in a memory cell in which data "0" or "1" is held. Thus, in the second to m-th rows, current does not flow even if the potentials of the common source lines SL and the common bit lines BL1 to BLn are different from each other.

The potential of the source line SL is set to the power supply potential VDD or a potential slightly lower than the power supply potential VDD (hereinafter referred to as a potential VR). In the case where data "1" is written to a memory cell, the potential of the source line SL is preferably set to the potential VR rather than the potential VDD because the range of the potential that allows reading of data "1" can be widened.

As a result, the resistance between the bit line BL1 and the source line SL becomes high because data "1" is written to the memory cell 170 in the first row and the first column and the first transistor 160 is in an off state, so that the bit line BL1 has the low potential (the ground potential GND). In addition, the resistance between the bit line BLn and the source line SL becomes low because data "0" is written to the memory cell 170 in the first row and the m-th column and the first transistor 160 is in an on state, so that the bit line BLn has the n-th potential (such as the potential VR). Therefore, a reading circuit that is electrically connected to the bit lines BL can read data from the level of resistance between the bit line and the source line. Hereinafter, data in the memory cells in the second row to the m-th row can be read in a similar manner. For example, when data in the m-th row is read, the reading operation similar to the method described above can be performed in a manner similar to the above, in which the first row to the (m−1)-th row are unselected and the m-th row is selected.

Here, since the memory cell 170 is formed using the semiconductor device shown in FIGS. 1A and 1B or FIGS. 2A and 2B, the bit lines BL might function as a backgate electrode of the transistor 162 in the period during which charge needs to be held in the node FG, that is, the period during which the transistor 162 needs to be in the off state. For example, in the above reading period, the transistors 162 in the unselected rows needs to be turned off in order to hold data; however, the potential of the bit line BL in the selected row and in the column to which data "0" is written becomes VR, so that the bit line BL in the column might function as a backgate of the transistor 162 in the unselected rows. In such a manner, by functioning as a backgate of the transistor 162, data in the memory cell 170 might be changed by leakage current generated between the source electrode and the drain electrode of the transistor 162.

However, as shown in FIG. 5, the potential VL is supplied to the write word line OSG with the timing at which the potential VR is supplied to the bit line BL, so that the potential of the write word line OSG becomes smaller than the threshold voltage of the transistor 162 even when the bit line BL functions as a backgate of the transistor 162. That is, in the period during which the transistor 162 needs to be in the off state, the negative potential (the potential VL) is supplied to the gate electrode of the transistor 162, that is, the write word line OSG at least when the positive potential is supplied to the bit line BL, so that even when the bit line BL functions as a backgate electrode of the transistor 162, data in the memory cell 170 is prevented from changing by leakage current generated between the source electrode and the drain electrode of the transistor 162. Thus, memory retention of the semiconductor device according to this embodiment can be improved. In particular, the negative potential (the potential VL) applied to the write word line OSG preferably satisfies the negative potential $V_a$ in the formula (1) or the formula (2) described above.

Note that in the period during which the transistor 162 needs to be in the off state, the negative potential is supplied to the write word line OSG at least when the positive potential is supplied to the bit line BL; therefore, for example, as shown in FIG. 6, no ground potential GND may be supplied to the write word line OSG, and the negative potential may be kept to be supplied to the write word line OSG all the time when the transistor 162 is in an off state.

Note that in a standby and data holding period, the transistor 162 in the circuit shown in FIG. 4 is turned off.

Note that in the semiconductor device with the circuit configuration shown in FIG. 4, the second wiring and the third wiring of the memory cell 170 are connected to each other, which corresponds to the bit line BL; however, the semiconductor device of the disclosed invention is not limited thereto: a circuit configuration in which the second wiring and the third wiring are not connected can be employed.

In addition, in the semiconductor device with the circuit configuration shown in FIG. 4, the transistor 160 and the transistor 162 included in the memory cell 170 in one column between the bit line BL and the source line SL are connected in parallel; however, the semiconductor device of the disclosed invention is not limited thereto. For example, a circuit configuration in which the transistors 160 included in the memory cell 170 in one column between the bit line BL and the source line SL are connected in series may be employed. Alternatively, a circuit configuration in which the transistors 162 included in the memory cell 170 in one column between the bit line BL and the source line SL are connected in series may be employed.

Note that in the semiconductor device having the circuit structure shown in FIG. 4, an n-channel transistor is used as the writing transistor (the transistor 162) and a p-channel transistor is used as the reading transistor (the transistor 160); however, a semiconductor device according to one embodiment of the disclosed invention is not limited thereto. A p-channel transistor may be used as the writing transistor and an n-channel transistor may be used as the reading transistor.

Note that the operation method, the operation voltage, and the like relating to the semiconductor device of an embodiment of the disclosed invention are not limited to the above description and can be changed appropriately in accordance with an embodiment in which the operation of the semiconductor device is implemented.

In such a manner, the transistor using a material other than an oxide semiconductor and the transistor using an oxide semiconductor are overlapped with each other at least partly, in particular, the source region or the drain region of the transistor using a material other than an oxide semiconductor and the oxide semiconductor layer are partly overlapped with each other; thus, higher integration of the semiconductor device can be achieved. Further, in a period during which the transistor using a material other than an oxide semiconductor is in an off state, the negative potential is supplied to a gate electrode of the transistor using a material other than an oxide semiconductor at least when the positive potential is supplied to the source region or the drain region of the transistor using an oxide semiconductor; thus, memory retention of the semiconductor device can be improved.

The structures and methods described in this embodiment can be combined as appropriate with any of the methods and structures described in the other embodiments.

(Embodiment 2)

In this embodiment, a manufacturing method of the semiconductor device shown in FIGS. 1A and 1B will be described with reference to FIGS. 7A to 7G, FIGS. 8A to 8E, FIGS. 9A to 9D, FIGS. 10A to 10D, and FIGS. 11A to 11C.

<Manufacturing Method of SOI Substrate>

Firstly, an example of a method for manufacturing an SOI substrate used for manufacturing the semiconductor device described in the above embodiment will be described with reference to FIGS. 7A to 7G.

Figure 7A:
FIGS. 7A to 7G are cross-sectional views illustrating a manufacturing process of a semiconductor device.
Figure 7B:
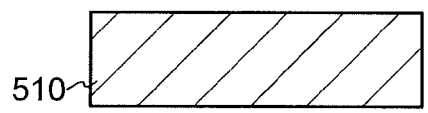

First, a semiconductor substrate 500 is prepared as a base substrate (see FIG. 7A). As the semiconductor substrate 500, a semiconductor substrate such as a single crystal silicon substrate or a single crystal germanium substrate can be used. As the semiconductor substrate, a solar grade silicon (SOG-Si) substrate or the like may be used. A polycrystalline semiconductor substrate may be used. Manufacturing cost in the case of using a SOG-Si substrate, a polycrystalline semiconductor substrate, or the like can be lower than that in the case of using a single crystal silicon substrate or the like.

Note that instead of the semiconductor substrate 500, a variety of glass substrates used in the electronics industry, such as substrates made of aluminosilicate glass, aluminoborosilicate glass, and barium borosilicate glass; a quartz substrate; a ceramic substrate; or a sapphire substrate can be used. Further, a ceramic substrate which contains silicon nitride and aluminum nitride as its main components and whose coefficient of thermal expansion is close to that of silicon may be used.

A surface of the semiconductor substrate 500 is preferably cleaned in advance. Specifically, the semiconductor substrate 500 is preferably subjected to ultrasonic cleaning with a hydrochloric acid/hydrogen peroxide mixture (RPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, and pure water (FPM), or the like.

Next, a bond substrate is prepared. Here, a single crystal semiconductor substrate 510 is used as the bond substrate (see FIG. 7B). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 7C:
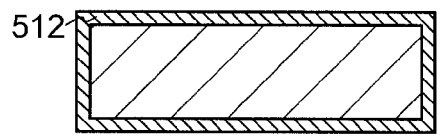

An oxide film 512 is formed on a surface of the single crystal semiconductor substrate 510 (see FIG. 7C). In view of removal of contamination, it is preferable that the surface of the single crystal semiconductor substrate 510 be cleaned with a hydrochloric acid/hydrogen peroxide mixture (RPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Dilute hydrofluoric acid and ozone water may be discharged alternately for cleaning.

The oxide film 512 can be formed with, for example, a single layer or a stacked layer of a silicon oxide film, a silicon oxynitride film, and the like. As a manufacturing method of the oxide film 512, a thermal oxidation method, a CVD method, a sputtering method, or the like can be used. In the case where the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 7D:
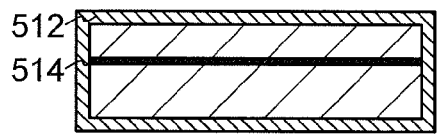
Figure 7E:
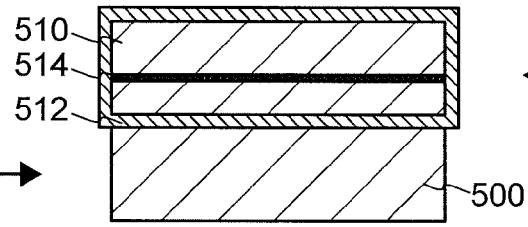

Next, ions are accelerated by an electric field and the single crystal semiconductor substrate 510 is irradiated with the ions, and the ions are added to the single crystal semiconductor substrate 510, whereby an embrittled region 514 where the crystal structure is damaged is formed in the single crystal semiconductor substrate 510 at a predetermined depth (see FIG. 7D).

The depth at which the embrittled region 514 is formed can be adjusted by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be controlled such that the thickness of a single crystal semiconductor layer is approximately greater than or equal to 10 nm and less than or equal to 500 nm, preferably, greater than or equal to 50 nm and less than or equal to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the semiconductor substrate 500 and the single crystal semiconductor substrate 510 are disposed to face each other and are made to be closely attached to each other with the oxide film 512 therebetween. As a result, the semiconductor substrate 500 and the single crystal semiconductor substrate 510 are bonded to each other (see FIG. 7E). Note that an oxide film or a nitride film may be formed on the surface of the semiconductor substrate 500 to which the single crystal semiconductor substrate 510 is attached.

When bonding is performed, it is preferable that pressure greater than or equal to 0.001 N/cm$^2$ and less than or equal to 100 N/cm$^2$, e.g., a pressure greater than or equal to 1 N/cm$^2$ and less than or equal to 20 N/cm$^2$, be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded to each other are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature higher than or equal to room temperature and lower than 400° C.). Bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Figure 7F:
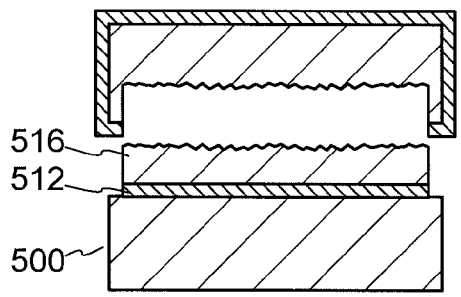

Next, heat treatment is performed for separation of the single crystal semiconductor substrate 510 at the embrittled region, whereby a single crystal semiconductor layer 516 is formed over the semiconductor substrate 500 with the oxide film 512 interposed therebetween (FIG. 7F).

Note that it is desirable that the temperature for heat treatment in the separation be as low as possible. This is because as the temperature in the separation is low, generation of roughness on the surface of the single crystal semiconductor layer 516 can be suppressed. Specifically, the temperature for the heat treatment in the separation may be higher than or equal to 300° C. and lower than or equal to 600° C. and the heat treatment is more effective when the temperature is lower than or equal to 500° C. (higher than or equal to 400° C.).

Note that after the single crystal semiconductor substrate 510 is separated, the single crystal semiconductor layer 516 may be subjected to heat treatment at 500° C. or higher so that concentration of hydrogen remaining in the single crystal semiconductor layer 516 is reduced.

Figure 7G:
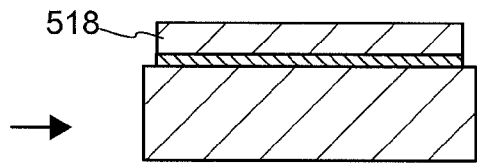

Next, the surface of the single crystal semiconductor layer 516 is irradiated with laser light, whereby a single crystal semiconductor layer 518 whose surface planarity is improved and in which defects is reduced are formed (see FIG. 7G). Note that instead of the laser light irradiation treatment, heat treatment may be performed.

Although the irradiation treatment with the laser light is performed immediately after the heat treatment for separation of the single crystal semiconductor layer 516 in this embodiment, one embodiment of the present invention is not construed as being limited thereto. The laser light irradiation treatment may be performed after the heat treatment for splitting the single crystal semiconductor layer 516 and etching treatment for removing a region including many defects at the surface of the single crystal semiconductor layer 516 are performed in this order. Alternatively, the laser light irradiation treatment may be performed after the surface planarity of the single crystal semiconductor layer 516 is improved. Note that the etching treatment may be either wet etching or dry etching. Further, after the irradiation with laser light is performed as described above, a step of reducing the thickness of the single crystal semiconductor layer 516 may be performed. In order to reduce the thickness of the single crystal semiconductor layer 516, either or both of dry etching and wet etching may be employed.

Through the above steps, an SOI substrate including the single crystal semiconductor layer 518 with favorable characteristics can be obtained (see FIG. 7G).

<Manufacturing Method of Semiconductor Device>

Next, a manufacturing method of a semiconductor device including the above SOI substrate will be described with reference to FIGS. 8A to 8E, FIGS. 9A to 9D, FIGS. 10A to 10D, and FIGS. 11A to 11C.

<Manufacturing Method of Transistor in Lower Portion>

First, a manufacturing method of the transistor 160 in the lower portion will be described with reference to FIGS. 8A to 8E and FIGS. 9A to 9D. Note that FIGS. 8A to 8E and FIGS. 9A to 9D illustrate part of the SOI substrate formed by the method illustrated in FIGS. 7A to 7G and are cross-sectional views illustrating the transistor in the lower portion illustrated in FIGS. 1A and 1B or FIGS. 2A and 2B.

Figure 8A:
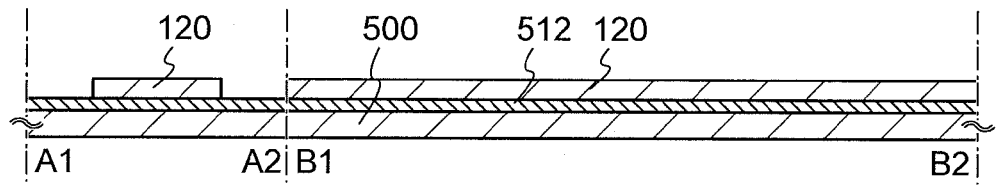
FIGS. 8A to 8E are cross-sectional views illustrating a manufacturing process of a semiconductor device.

First, the single crystal semiconductor layer 518 is patterned to have an island shape, so that a semiconductor layer 120 is formed (see FIG. 8A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 8B:
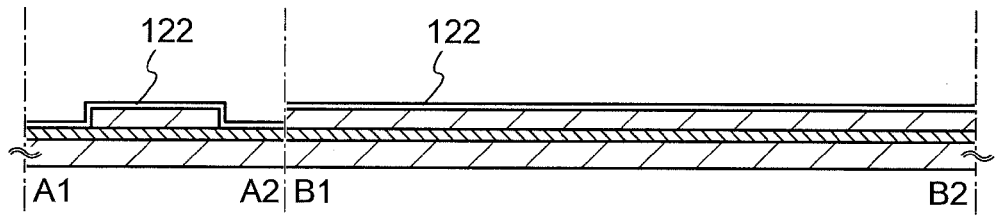

Next, an insulating layer 122 is formed so as to cover the semiconductor layer 120 (see FIG. 8B). The insulating layer 122 is to be a gate insulating layer later. For example, the insulating layer 122 can be formed by performing heat treatment (e.g., thermal oxidation treatment, thermal nitridation treatment, or the like) on a surface of the semiconductor layer 120. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by a CVD method, a sputtering method, or the like. The insulating layer 122 preferably has a single-layer structure or a stacked structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_y$ (x>0, y>0)), hafnium aluminate to which nitrogen is added ($HfAl_xO_y$ (x>0, y>0)), and the like. The thickness of the insulating layer 122 can be, for example, greater than or equal to 1 nm and less than or equal to 100 nm, preferably greater than or equal to 10 nm and less than or equal to 50 nm. In this embodiment, a single layer of an insulating layer containing silicon oxide is formed by a plasma CVD method.

Figure 8C:
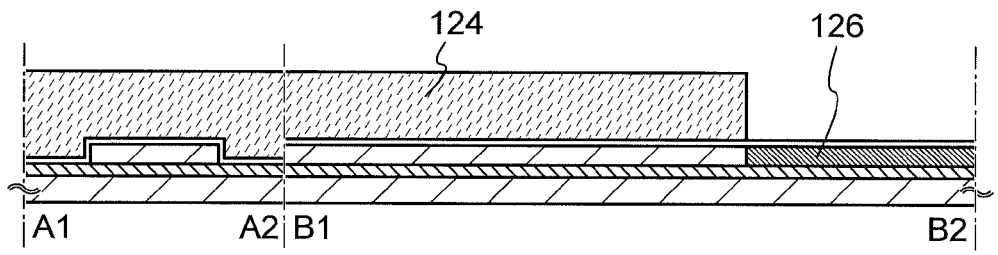

Next, a mask 124 is formed over the insulating layer 122 and an impurity element imparting one conductivity type is added to the semiconductor layer 120, so that the impurity region 126 is formed (see FIG. 8C). Note that here, the mask 124 is removed after the impurity element is added.

Figure 8D:
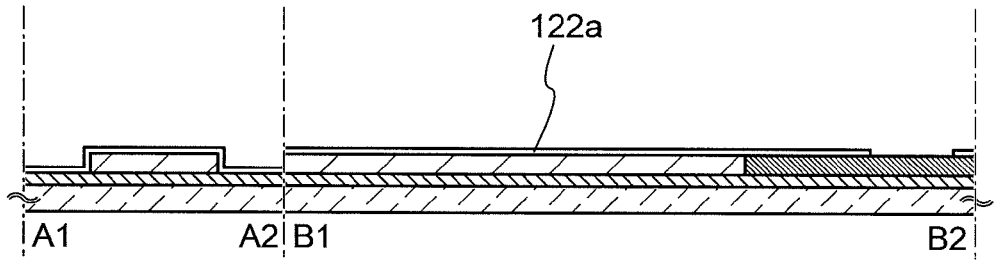

Next, a mask is formed over the insulating layer 122 and a region of the insulating layer 122 that overlaps with the impurity region 126 is partly removed, so that the gate insulating layer 122a is formed (see FIG. 8D). Part of the insulating layer 122 can be removed by etching such as wet etching or dry etching.

Figure 8E:
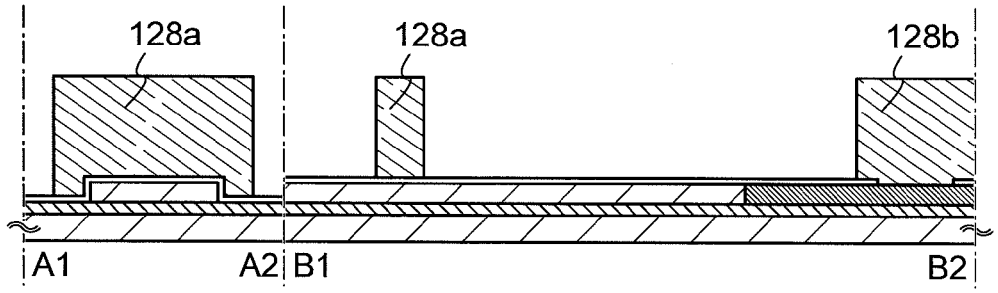

Next, a conductive layer for forming a gate electrode (including a wiring formed using the same layer as the gate electrode) is formed over the gate insulating layer 122a and is processed, so that the gate electrode 128a and the conductive layer 128b are formed (see FIG. 8E).

The conductive layer used for the gate electrode 128a and the conductive layer 128b can be formed using a metal material such as aluminum, copper, titanium, tantalum, or tungsten. The conductive layer may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. The conductive layer may be processed by etching using a resist mask.

Figure 9A:
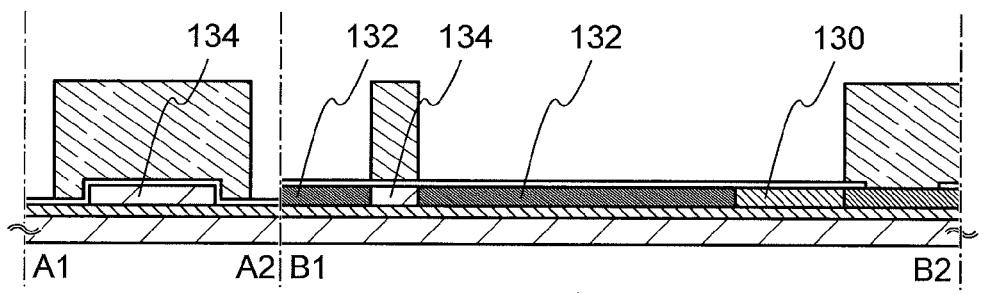
FIGS. 9A to 9D are cross-sectional views illustrating a manufacturing process of a semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 9A). Here, an impurity element such as boron (B) or aluminum (Al) is added in order to form a p-channel transistor. Note that although boron or aluminum is added here for formation of a p-channel transistor, in the case of forming an n-channel transistor, an impurity element such as phosphorus (P) or arsenic (As) may be added. Here, the concentration of the impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 9B:
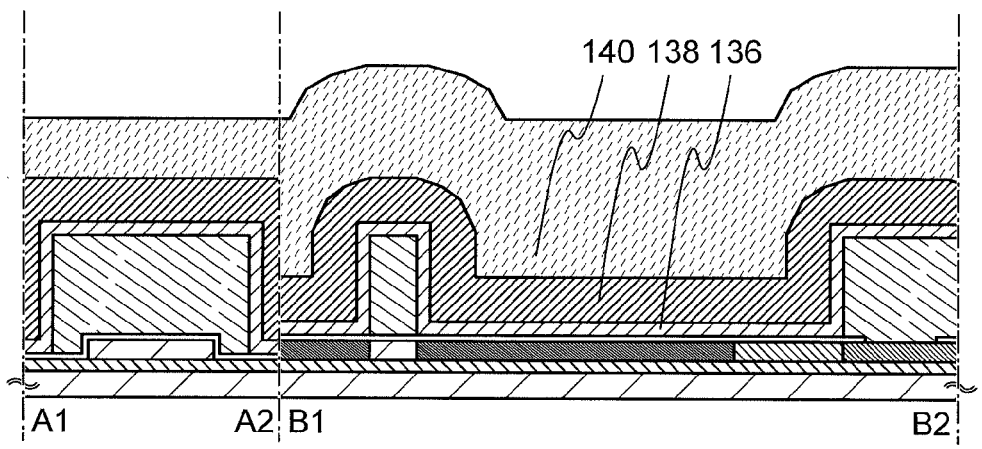

Next, the insulating layer 136, the insulating layer 138, and the insulating layer 140 are formed so as to cover the gate insulating layer 122a, the gate electrode 128a, and the conductive layer 128b (see FIG. 9B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked structure of the insulating layer 136, the insulating layer 138, and the insulating layer 140 is employed here; however, one embodiment of the disclosed invention is not limited to thereto. A single-layer structure, a stacked structure of two layers, or a stacked structure of four or more layers may also be used.

Figure 9C:
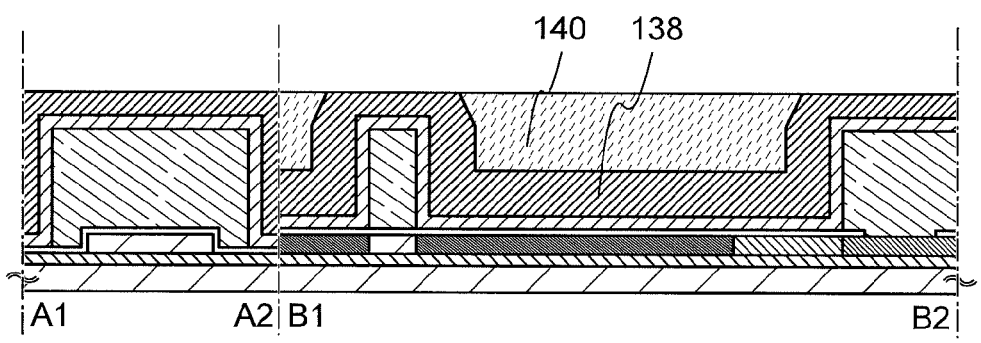

Next, the insulating layer 138 and the insulating layer 140 are subjected to chemical mechanical polishing (CMP) treatment, or etching treatment, so that the insulating layer 138 and the insulating layer 140 are flattened (see FIG. 9C). Here, CMP treatment is performed until the insulating layer 138 is partly exposed. In the case where silicon nitride oxide is used for the insulating layer 138 and silicon oxide is used for the insulating layer 140, the insulating layer 138 functions as an etching stopper.

Figure 9D:
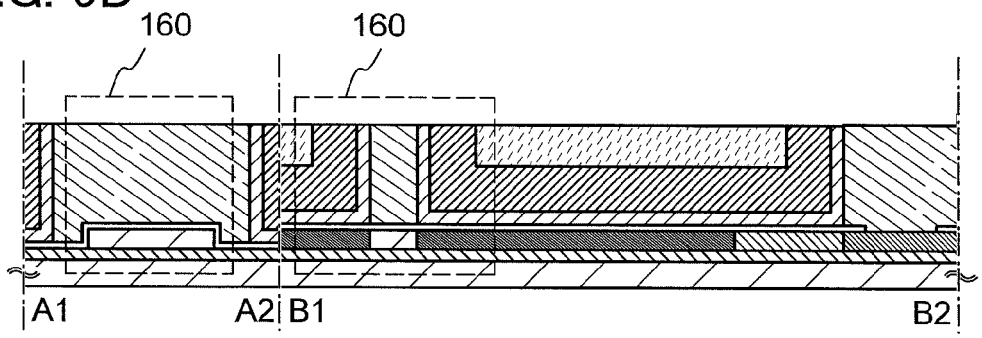

Next, the insulating layer 138 and the insulating layer 140 are subjected to CMP treatment, or etching treatment, so that upper surfaces of the gate electrode 128a and the conductive layer 128b are exposed (see FIG. 9D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 9D).

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Manufacturing Method of Transistor in Upper Portion>

Next, a method for manufacturing the transistor 162 in the upper portion will be described with reference to FIGS. 10A to 10D and FIGS. 11A and 11C.

Figure 10A:
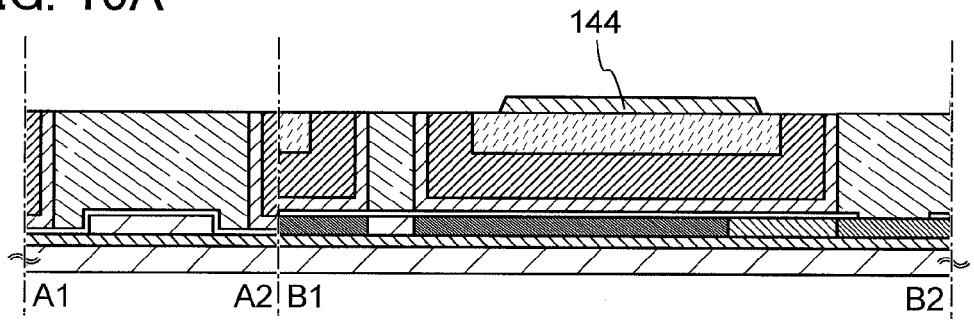
FIGS. 10A to 10D are cross-sectional views illustrating manufacturing steps of a semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 10A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

As a material used for the oxide semiconductor layer, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; or a single-component metal oxide such as an In—O-based material, a Sn—O-based material; a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

As the oxide semiconductor layer, a thin film including a material expressed as the chemical formula, $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

The thickness of the oxide semiconductor layer is preferably greater than or equal to 3 nm and less than or equal to 30 nm for the following reason: the transistor might possibly be normally on when the oxide semiconductor layer is too thick (e.g., a thickness of 50 nm or more).

The oxide semiconductor layer is preferably formed by a method in which impurities such as hydrogen, water, a hydroxyl group, or hydride do not enter the oxide semiconductor layer. For example, a sputtering method can be used.

In this embodiment, the oxide semiconductor layer is formed by a sputtering method with the use of an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3: Ga_2O_3: ZnO=1:1:2$ [molar ratio] can be used.

In the case where an In—Sn—Zn-based oxide called ITZO is formed, an oxide target having a composition ratio of In:Sn:Zn=1:2:2, 2:1:3, 1:1:1, or 20:45:35 in an atomic ratio is used, for example.

The filling rate of the oxide target is greater than or equal to 90% and less than or equal to 100%, preferably greater than or equal to 95% and greater than or equal to 99.9%. With the use of the metal oxide target with a high filling rate, a dense oxide semiconductor layer can be formed.

The deposition atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or hydride is removed is preferable, in order to prevent hydrogen, water, a hydroxyl group, hydride, or the like from entering the oxide semiconductor layer.

For example, the oxide semiconductor layer can be formed described below.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or hydride are sufficiently removed is introduced into the deposition chamber from which remaining moisture is being removed, and the oxide semiconductor layer is formed over the substrate with the use of the target. In order to remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature, the substrate temperature is increased, so that hydrogen bonds are cut by heat and are less likely to be taken into the oxide semiconductor layer. Therefore, the oxide semiconductor layer is formed with the substrate heated at the above temperature, whereby the concentration of impurities such as hydrogen, water, a hydroxyl group, or hydride in the oxide semiconductor layer can be sufficiently reduced. Moreover, damage due to sputtering can be reduced.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which voltage is applied to a substrate side to generate plasma in the vicinity of the substrate to modify a surface. Note that a gas of nitrogen, helium, oxygen or the like may be used instead of argon.

The oxide semiconductor layer can be processed by being etched after a mask having a desired shape is formed over the oxide semiconductor layer. The mask may be formed by a method such as photolithography or an ink-jet method. The metal oxide film and the like are also processed while the oxide semiconductor film is processed. Note that the etching of the oxide semiconductor layer may be dry etching or wet etching. Needless to say, both of them may be employed in combination. Here, the processed oxide semiconductor layer 144 is provided so as to overlap with the source region or the drain region of the transistor 160 at least partly. With the oxide semiconductor layer 144 provided in this manner, the semiconductor device can be highly integrated.

After that, heat treatment may be performed on the oxide semiconductor layer 144. The heat treatment further removes impurities such as the substance including a hydrogen atom from the oxide semiconductor layer 144; thus, the structure of the oxide semiconductor layer 144 can be ordered and defect states in the energy gap can be reduced. The heat treatment is performed under an inert gas atmosphere at greater than or equal to 250° C. and less than or equal to 700° C., preferably greater than or equal to 450° C. and less than or equal to 600° C. or less than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a manner that, for example, an object to be heated is introduced into an electric furnace in which a resistance heating element or the like is used and heated, under a nitrogen atmosphere at 450° C. for an hour. The oxide semiconductor layer 144 is not exposed to the air during the heat treatment so that entry of water and hydrogen can be prevented.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed into an island shape or after the gate insulating film is formed. Such dehydration treatment or dehydrogenation treatment may be performed once or plural times.

Figure 10B:
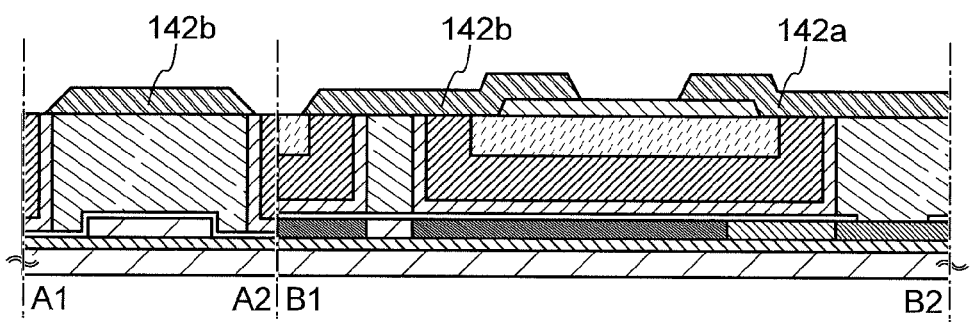

Next, a conductive layer for forming a source electrode and a drain electrode (including a wiring formed in the same layer as the source electrode and the drain electrode) is formed over the oxide semiconductor layer 144 and the like and is processed, so that the source and drain electrodes 142a and 142b are formed (see FIG. 10B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer may have a single-layer structure or a stacked structure including two or more layers. For example, the conductive layer may have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having tapered shapes.

The conductive layer may be formed using a conductive metal oxide. As the conductive metal oxide, indium oxide ($In_2O_3$), tin oxide ($SnO_2$), zinc oxide (ZnO), an indium tin oxide ($In_2O_3$—$SnO_2$, which is abbreviated to ITO in some cases), an indium zinc oxide ($In_2O_3$—ZnO), or any of these metal oxide materials in which silicon or silicon oxide is contained can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower edge portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 µm), and the circuit can operate at higher speed. Moreover, miniaturization allows low power consumption of a semiconductor device.

As an example which is different from that in FIG. 10B, oxide conductive layers can be provided as a source region and a drain region, between the oxide semiconductor layer 144 and the source and drain electrodes. A material of the oxide conductive layer preferably contains zinc oxide as a component and preferably does not contain indium oxide. For such an oxide conductive layer, zinc oxide, aluminum zinc oxide, aluminum zinc oxynitride, gallium zinc oxide, or the like can be used.

For example, the oxide conductive layers which serve as a source region and a drain region, the source electrode 142a, and the drain electrode 142b can be formed by forming an oxide conductive film over the oxide semiconductor layer 144, forming a conductive layer over the oxide conductive film, and processing the oxide conductive film and the conductive layer in one photolithography step.

Alternatively, a stacked layer of an oxide semiconductor film and an oxide conductive film is formed and the stacked layer is processed in one photolithography step, so that the island-shaped oxide semiconductor layer 144 and oxide conductive film may be formed. After the source electrode 142*a* and the drain electrode 142*b* are formed, the island-shaped oxide conductive film is etched using the source electrode 142*a* and the drain electrode 142*b* as masks, so that the oxide conductive layers which serve as a source region and a drain region can be formed.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

When the oxide conductive layer is provided between the oxide semiconductor layer and the source and drain electrode layers, the source region and the drain region can have lower resistance and the transistor can operate at high speed. Moreover, with the structure including the oxide semiconductor layer 144, the oxide conductive layer, and the drain electrode formed using a metal material, withstand voltage of the transistor can be further increased.

In order to improve frequency characteristics of a peripheral circuit (a driver circuit), it is effective to use the oxide conductive layer for a source region and a drain region for the reason below. The contact resistance can be reduced when a metal electrode (e.g., molybdenum or tungsten) and the oxide conductive layer are in contact, as compared to the case where a metal electrode (e.g., molybdenum or tungsten) and the oxide semiconductor layer are in contact. The contact resistance can be reduced by interposing an oxide conductive layer between the oxide semiconductor layer and source and drain electrodes; thus, frequency characteristics of a peripheral circuit (driver circuit) can be improved.

Figure 10C:
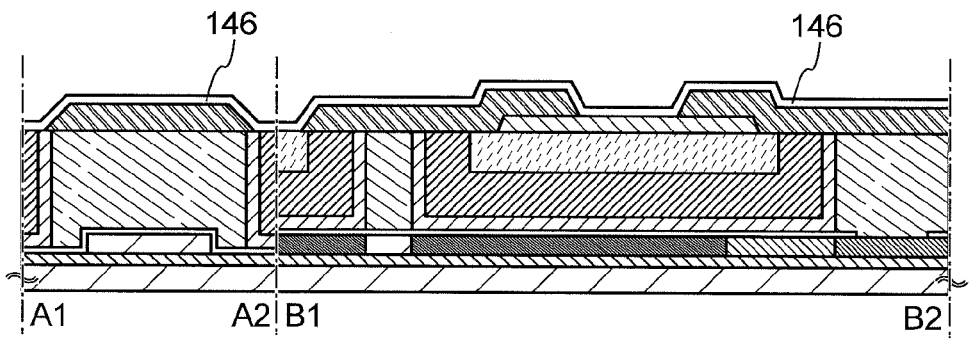

Next, the gate insulating layer 146 is formed so as to cover the source electrode 142*a* and the drain electrode 142*b* and to be in contact with part of the oxide semiconductor layer 144 (see FIG. 10C).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, gallium oxide, hafnium silicate ($HfSi_xO_y$ (x>0, y>0)), hafnium silicate to which nitrogen is added ($HfSi_xO_y$ (x>0, y>0)), hafnium aluminate to which nitrogen is added ($HfAl_xO_y$ (x>0, y>0)), or the like. The gate insulating layer 146 may have a single-layer structure or a stacked structure in which these elements are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like is caused. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_y$ (x>0, y>0)), or hafnium aluminate to which nitrogen is added ($HfAl_xO_y$ (x>0, y>0)) is preferably used for the gate insulating layer 146. The use of a high-k material for the gate insulating layer 146 makes it possible to ensure electrical characteristics and to increase the thickness in order to suppress gate leakage. Note that a stacked structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be an insulating material containing an element belonging to Group 13 and oxygen. Many oxide semiconductor materials contain an element belonging to Group 13, and an insulating material containing an element belonging to Group 13 is compatible with an oxide semiconductor. By using such an insulating material for the insulating layer in contact with the oxide semiconductor layer, an interface with the oxide semiconductor layer can be kept favorable.

An insulating material containing an element belonging to Group 13 refers to an insulating material containing one or more elements belonging to Group 13. As examples of the insulating material containing an element belonging to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, the use of a material containing gallium oxide for the gate insulating layer allows the characteristics of the interface between the oxide semiconductor layer and the gate insulating layer to be kept favorable. Moreover, when the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is effective to form an insulating layer with the use of a material containing an aluminum oxide. Aluminum oxide is impermeable to water. Therefore, it is preferable to use a material containing aluminum oxide in terms of preventing entry of water to the oxide semiconductor layer.

The insulating layer in contact with the oxide semiconductor layer 144 preferably contains oxygen in a proportion higher than that in the stoichiometric composition, by heat treatment under an oxygen atmosphere or oxygen doping. "Oxygen doping" refers to addition of oxygen into a bulk. Note that the term "bulk" is used in order to clarify that oxygen is added not only to a surface of a thin layer but also to the inside of the thin layer. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 144 is formed using gallium oxide, the composition of gallium oxide can be set to be $Ga_2O_x$ (x=3+α, 0<α<1) by heat treatment under an oxygen atmosphere or oxygen doping. Further, in the case where the insulating layer in contact with the oxide semiconductor layer 144 is formed of aluminum oxide, the composition of aluminum oxide can be set to be $Al_2O_x$ (x=3+α, $0<\alpha<1$) by heat treatment under an oxygen atmosphere or oxygen doping. Further, in the case where the insulating layer in contact with the oxide semiconductor layer 144 is formed of gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment under an oxygen atmosphere or oxygen doping.

By oxygen doping or the like, an insulating layer which includes a region where the proportion of oxygen is higher than that in the stoichiometric composition can be formed. When the insulating layer having such a region is in contact with the oxide semiconductor layer, oxygen that exists excessively in the insulating layer is supplied to the oxide semiconductor layer, which allows oxygen deficiency in the oxide semiconductor layer or at an interface between the oxide semiconductor layer and the insulating layer to be reduced.

Note that the insulating layer having a region where the proportion of oxygen is higher than that in the stoichiometric proportion may be applied to an insulating layer serving as a base film for the oxide semiconductor layer 144 instead of the gate insulating layer 146, or both the gate insulating layer 146 and the base film.

After the gate insulating layer 146 is formed, heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. By performing the heat treatment, variation in electrical characteristics of the transistor can be reduced. In the case where the gate insulating layer 146 includes oxygen, oxygen can be supplied to the oxide semiconductor layer 144 to fill oxygen vacancies in the oxide semiconductor layer 144. In this sense, the heat treatment can also be referred to as supply of oxygen.

Note that in this embodiment, the heat treatment for supply of oxygen is performed after the gate insulating layer 146 is formed; however, the timing of the heat treatment for supply of oxygen is not limited thereto. For example, the heat treatment for supply of oxygen may be performed after the gate electrode is formed. The heat treatment for supply of oxygen may be performed following heat treatment for dehydration or dehydrogenation.

As described above, the heat treatment for dehydration or dehydrogenation, and the oxygen doping treatment or the treatment for supply of oxygen are performed to reduce impurities such as a substance containing a hydrogen atom and fill oxygen vacancies in the oxide semiconductor layer 144, whereby the oxide semiconductor layer 144 can be highly purified.

An i-type (intrinsic) or substantially i-type oxide semiconductor layer that is highly purified is obtained. Consequently, a transistor having highly excellent characteristics can be realized.

Figure 10D:
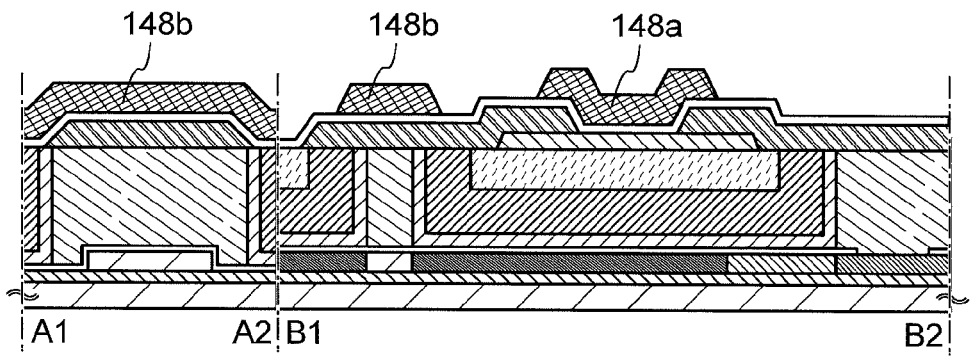

Next, a conductive layer for forming a gate electrode (including a wiring formed using the same layer as the gate electrode) is formed and is processed, so that the gate electrode 148a and the conductive layer 148b are formed (see FIG. 10D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked structure.

Figure 11A:
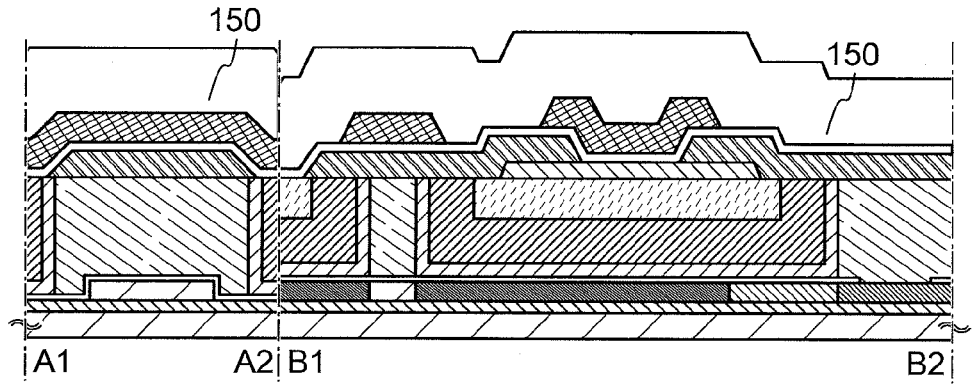
FIGS. 11A to 11C are cross-sectional views illustrating a manufacturing process of a semiconductor device.
Figure 11B:
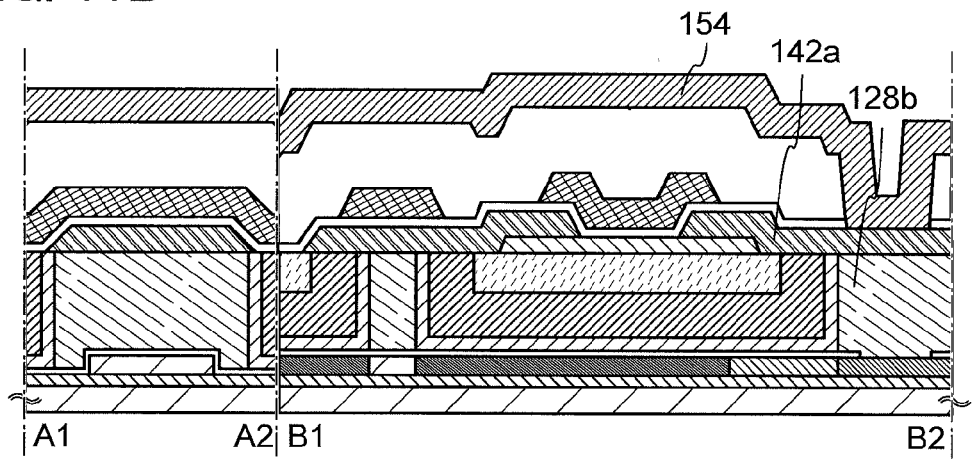

Next, an insulating layer 150 is formed over the gate insulating layer 146, the gate electrode 148a, and the conductive layer 148b (see FIG. 11A). The insulating layer 150 can be formed by a PVD method, a CVD method, or the like. The insulating layer 150 can be formed using a material containing an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) is preferably employed for the following reason: the low dielectric constant of the insulating layer 150 allows capacitance generated between wirings, electrodes, or the like to be reduced and operation speed to be increased. Note that although the insulating layer 150 has a single-layer structure in this embodiment, an embodiment of the disclosed invention is not limited to thereto. The insulating layer 150 may have a stacked structure including two or more layers.

Next, an opening reaching the source electrode 142a is formed in the gate insulating layer 146 and the insulating layer 150. After that, a wiring 154 connected to the source electrode 142a is formed over the insulating layer 150 (see FIG. 11B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used. Here, the wiring 154 is provided so as to overlap with the oxide semiconductor layer 144 at least partly. With the wiring 154 provided in this manner, higher integration of the semiconductor device can be achieved.

Specifically, it is possible to employ a method, for example, in which a thin titanium film (about 5 nm) is formed in a region including the opening of the insulating layer 150 by a PVD method, and then, an aluminum film is formed so as to be embedded in the openings. Here, the titanium film formed by a PVD method has a function of reducing an oxide film (such as a natural oxide film) over which the titanium film is to be formed, and thereby lowering contact resistance with the lower electrode or the like (here, the source electrode 142a). In addition, hillock of aluminum film can be prevented. A copper film may be formed by a plating method after the formation of the barrier film of titanium, titanium nitride, or the like.

The opening formed in the insulating layer 150 is preferably formed in a region overlapping with the conductive layer 128b. By forming the opening in such a region, an increase in the element area due to a contact region of electrodes can be suppressed.

Here, the case where the position where the impurity region 126 and the source electrode 142a are connected and the position where the source electrode 142a and the wiring 154 are connected overlap with each other without using the conductive layer 128b will be described. In this case, an opening (also referred to as a contact in a lower portion) is formed in the insulating layer 136, the insulating layer 138, and the insulating layer 140 which are formed over the impurity region 126, and the source electrode 142a is formed in the contact in the lower portion; after that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode 142a formed in the contact in the lower portion might be disconnected due to etching. When the contacts in the lower portion and in the upper portion are formed so as not to overlap with each other in order to avoid the disconnection, an increase in the element area is caused.

As described in this embodiment, with the use of the conductive layer 128b, the contact in the upper portion can be formed without disconnection of the source electrode 142a. Thus, the contacts in the lower portion and in the upper portion can be formed so as to overlap with each other, so that the increase in the element area due to the contact regions can be suppressed. In other words, the degree of integration of the semiconductor device can be increased.

Figure 11C:
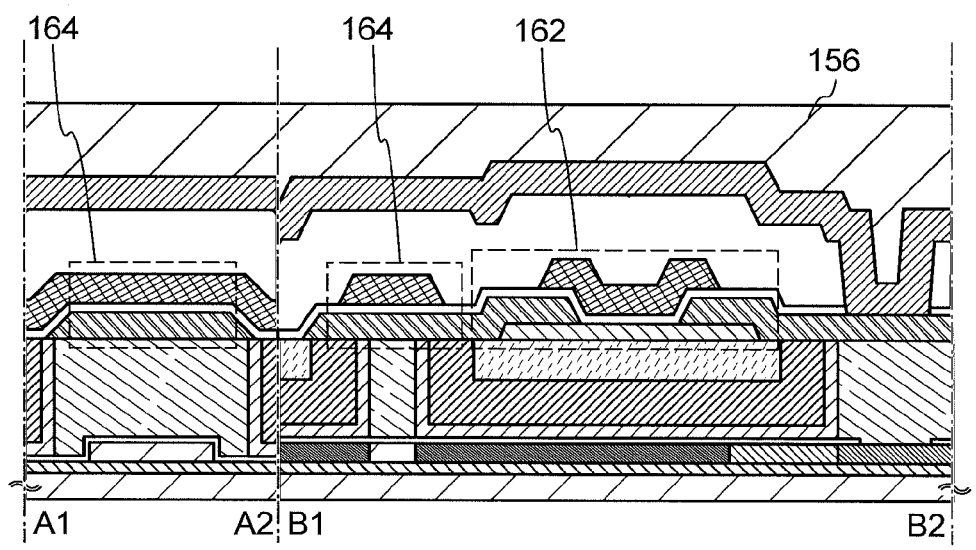

Next, an insulating layer 156 is formed so as to cover the wiring 154 (see FIG. 11C).

Through the above steps, the transistor 162 and the capacitor 164 including the purified oxide semiconductor layer 144 are completed (see FIG. 11C).

Figure 12A:
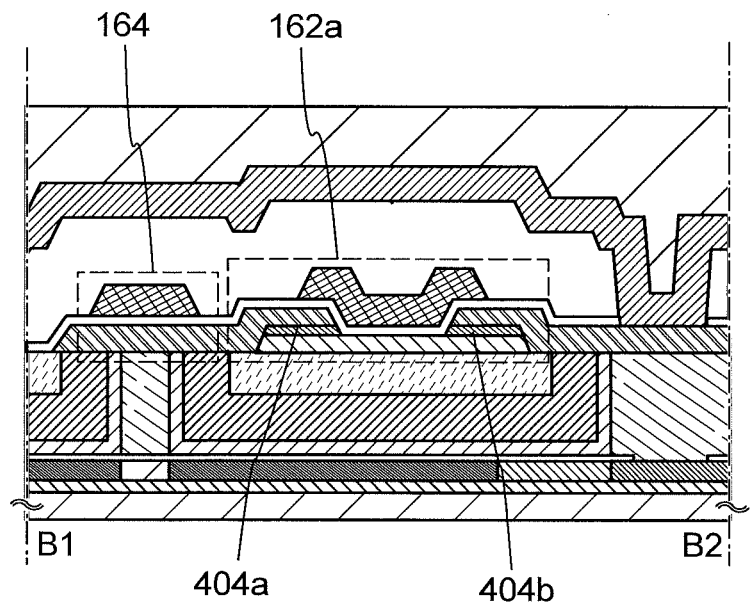
FIGS. 12A and 12B are cross-sectional views of a semiconductor device.
Figure 12B:
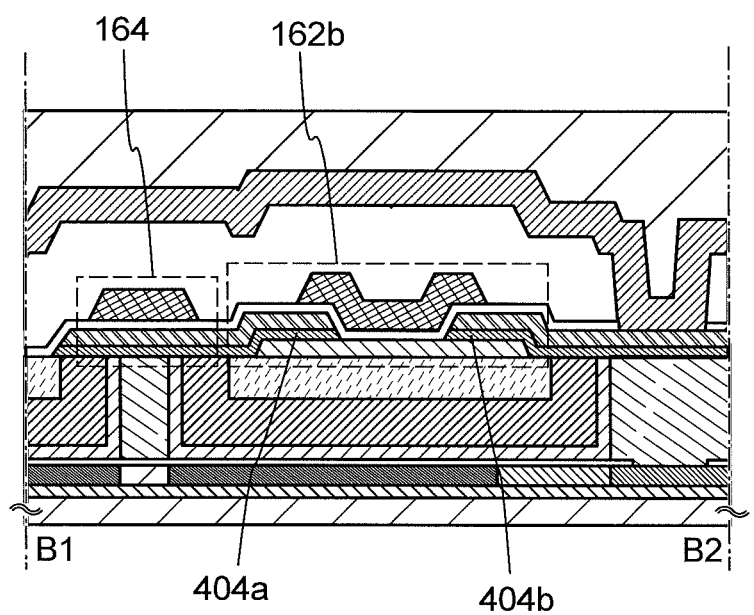

Oxide conductive layers functioning as a source region and a drain region may be provided as buffer layers between the oxide semiconductor layer 144 and the source and drain electrodes 142a and 142b in the transistor 162. FIGS. 12A and 12B illustrate a transistor 162A and a transistor 162B, respectively, where oxide conductive layers are provided in the transistor 162 in FIGS. 1A and 1B.

In the transistors 162a and 162b illustrated in FIGS. 12A and 12B, oxide conductive layers 404a and 404b functioning as a source region and a drain region are formed between the oxide semiconductor layer 144 and the source and drain electrodes 142a and 142b. The shapes of the oxide conductive layers 404a and 404b differ between the transistors 162a and 162b in FIGS. 12A and 12B owing to the manufacturing process.

As for the transistor 162a in FIG. 12A, a stack of an oxide semiconductor film and an oxide conductive film is formed and the shape of the stack is processed to form the island-shaped oxide semiconductor layer 144 and the island-shaped oxide conductive film through the same photolithography step. The source electrode 142a and the drain electrode 142b are formed over the oxide semiconductor layer and the oxide conductive film. After that, the island-shaped oxide conductive film is etched with the use of the source electrode 142a and the drain electrode 142b as masks to form the oxide semiconductor conductive layers 404a and 404b serving as the source region and the drain region.

As for the transistor 162b in FIG. 12B, an oxide conductive film is formed over the oxide semiconductor layer 144, and a metal conductive film is formed thereover. Then, the oxide conductive film and the metal conductive film are processed through the same photolithography step to form the oxide conductive layers 404a and 404b serving as the source region and the drain region, the source electrode 142a, and the drain electrode 142b.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

As the formation method of the oxide conductive layers 404a and 404b, a sputtering method, a vacuum evaporation method (an electron beam evaporation method or the like), an arc discharge ion plating method, or a spray method can be used. As a material of the oxide conductive layers, zinc oxide, a compound of silicon oxide and indium tin oxide, zinc aluminum oxide, zinc aluminum oxynitride, zinc gallium oxide, or the like can be used. In addition, the above materials may contain silicon oxide.

When the oxide conductive layer is provided as a source region and a drain region between the oxide semiconductor layer 144 and the source and drain electrode layers 142a and 142b, the source region and the drain region can have lower resistance and the transistors 162a and 162b can operate at high speed.

With the structure including the oxide semiconductor layer 144, the oxide conductive layers 404a and 404b, and the drain electrode layer 142b, withstand voltages of the transistors 162a and 162b can be improved.

Since the oxide semiconductor layer 144 is purified in the transistor 162 described in this embodiment, the hydrogen concentration is $5\times10^{19}$ atoms/cm$^3$ or lower, preferably $5\times10^{18}$ atoms/cm$^3$ or lower, more preferably $5\times10^{17}$ atoms/cm$^3$ or lower. In addition, the value of the carrier concentration of the oxide semiconductor layer 144 is sufficiently low (e.g., lower than $1\times10^{12}$/cm$^3$, preferably lower than $1.45\times10^{10}$/cm$^3$) in comparison with that of a general silicon wafer (approximately $1\times10^{14}$/cm$^3$). Accordingly, the off-state current is also sufficiently small. For example, the off-state current of the transistor 162 (here, current per unit channel width (1 µm)) at room temperature (25° C.) is 100 zA (1 zA (zeptoampere) is $1\times10^{-21}$ A) or less, preferably 10 zA or less.

In this manner, by using the purified intrinsic oxide semiconductor layer 144, the off-state current of the transistor can be sufficiently reduced easily. In addition, by using such a transistor, a semiconductor device in which stored data can be held for an extremely long time can be obtained.

In addition, the transistor using a material other than an oxide semiconductor and the transistor using an oxide semiconductor are overlapped with each other at least partly, in particular, the source region or the drain region of the transistor using a material other than an oxide semiconductor and the oxide semiconductor layer are partly overlapped with each other; thus, high integration of the semiconductor device can be achieved. Further, in a period during which the transistor using a material other than an oxide semiconductor is in an off state, the negative potential is supplied to a gate electrode of the transistor using a material other than an oxide semiconductor at least when the positive potential is supplied to the source region or the drain region of the transistor using an oxide semiconductor; thus, memory retention of the semiconductor device can be improved.

The methods and structures described in this embodiment can be combined as appropriate with any of the methods and structures described in the other embodiments.

(Embodiment 3)

Figure 13A:
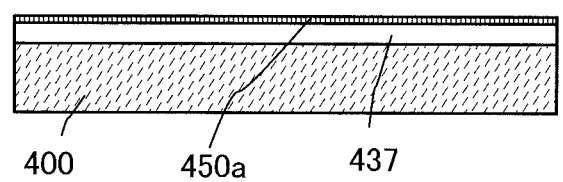
FIGS. 13A to 13C are cross-sectional views illustrating a manufacturing process of a semiconductor device.
Figure 13B:
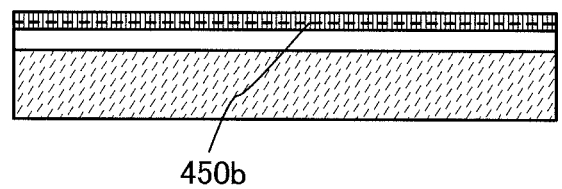

One embodiment of an oxide semiconductor layer that can be used for the semiconductor layers of the transistor 162 in the above embodiments will be described with reference to FIGS. 13A to 13C.

The oxide semiconductor layer in this embodiment has a stacked-layer structure including a second crystalline oxide semiconductor layer which is thicker than a first crystalline oxide semiconductor layer over the first crystalline oxide semiconductor layer.

An insulating layer 437 is formed over an insulating layer 400. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, a first oxide semiconductor film is formed to a thickness of 5 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

In the case where an In—Sn—Zn-based oxide called ITZO is formed, an oxide target having a composition ratio of In:Sn:Zn=1:2:2, 2:1:3, 1:1:1, or 20:45:35 in an atomic ratio is used, for example.

Then, first heat treatment is performed with the substrate placed in an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 13A).

Depending on the temperature of the first heat treatment, the first heat treatment causes crystallization from a film surface and crystal grows from the film surface toward the inside of the film; thus, c-axis aligned crystal is obtained. By the first heat treatment, a large amount of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the stoichiometric composition ratio.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

In the case where an In—Sn—Zn-based oxide called ITZO is formed, an oxide target having a composition ratio of In:Sn:Zn=1:2:2, 2:1:3, 1:1:1, or 20:45:35 in an atomic ratio is used, for example.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, a second crystalline oxide semiconductor layer 450b is formed (see FIG. 13B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 13C:
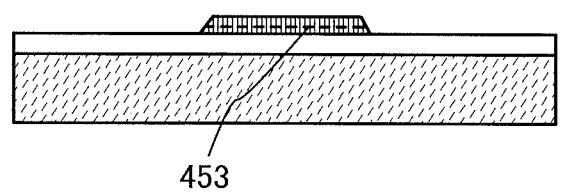

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 13C). In the drawing, the interface between the first crystalline oxide semiconductor layer 450a and the second crystalline oxide semiconductor layer 450b are indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

Note that for the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

Note that the first crystalline oxide semiconductor layer and the second crystalline oxide semiconductor layer are each formed using an oxide material including at least Zn. For example, a metal oxide including four elements, such as an In—Al—Ga—Zn—O-based material, or an In—Sn—Ga—Zn—O-based material; a metal oxide including three elements, such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a metal oxide including two elements, such as an In—Zn—O-based material, a Sn—Zn—O-based material, an Al—Zn—O-based material, or a Zn—Mg—O-based material; a Zn—O-based material; or the like can be used. Further, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based material may contain an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for the transistor 162 that can be applied to a semiconductor device disclosed in this specification.

In the transistor in this Embodiment 3 in which the oxide semiconductor layer of this embodiment is used as an oxide semiconductor layer, an electric field is not applied from one surface to the other surface of the oxide semiconductor layer and current does not flow in the thickness direction of the oxide semiconductor stack (i.e., the direction from one surface to the other surface, specifically the vertical direction in FIGS. 1A and 1B). The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

The methods and structures described in this embodiment can be combined as appropriate with any of the methods and structures described in the other embodiments.
(Embodiment 4)

In this embodiment, the case where the semiconductor device described in any of the above embodiments is applied to electronic devices will be described with reference to FIGS. 14A to 14D. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 14A:
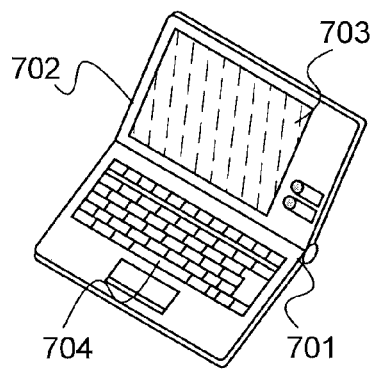
FIGS. 14A to 14F are diagrams for illustrating electronic devices including a semiconductor device.

FIG. 14A illustrates a laptop personal computer that includes a housing 701, a housing 702, a display portion 703, a keyboard 704, and the like. The semiconductor device described in any of the above embodiments is provided in at least one of the housing 701 and the housing 702. Therefore, a laptop personal computer in which writing and reading of data are performed at high speed, data is stored for a long time, and power consumption is sufficiently reduced can be realized.

Figure 14B:
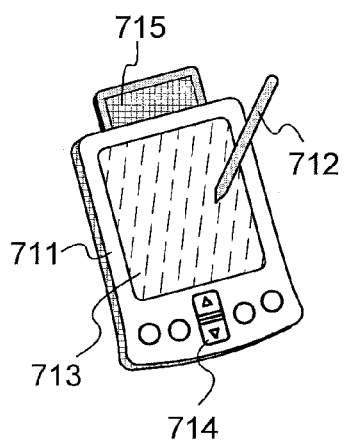

FIG. 14B illustrates a personal digital assistant (PDA). A main body 711 is provided with a display portion 713, an external interface 715, operation buttons 714, and the like. Therefore, a personal digital assistant in which writing and reading of data are performed at high speed, data is stored for a long time, and power consumption is sufficiently reduced can be realized.

Figure 14C:
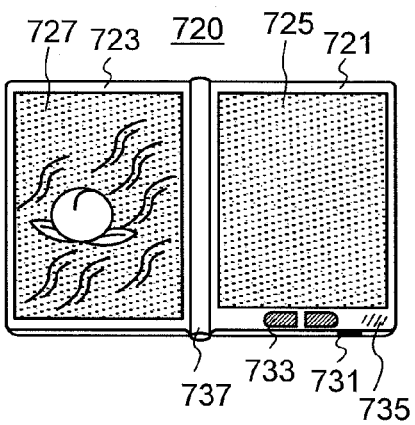

FIG. 14C illustrates an e-book reader 720 on which electronic paper is mounted. The e-book reader 720 has two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Therefore, an e-book reader in which writing and reading of data are performed at high speed, data is stored for a long time, and power consumption is sufficiently reduced can be realized.

Figure 14D:
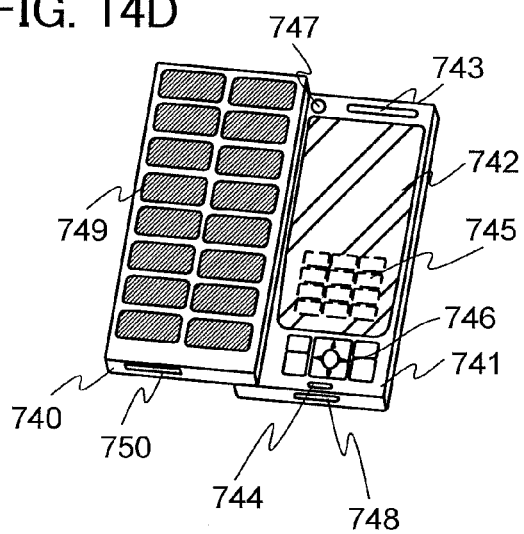

FIG. 14D illustrates a mobile phone that includes two housings, a housing 740 and a housing 741. Further, the housing 740 and the housing 741 in a state where they are developed as illustrated in FIG. 14D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housings 740 and 741 is provided with the semiconductor device described in any of the above embodiments. Therefore, a mobile phone in which writing and reading of data are performed at high speed, data is stored for a long time, and power consumption is sufficiently reduced can be realized.

Figure 14E:
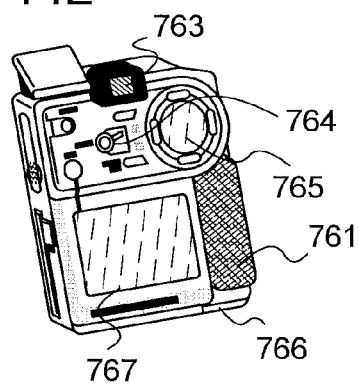

FIG. 14E illustrates a digital camera including a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data is stored for a long time, and power consumption is sufficiently reduced can be realized.

Figure 14F:
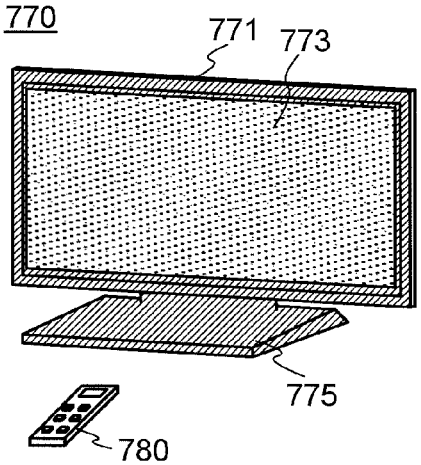

FIG. 14F illustrates a television device including a housing 771, a display portion 773, a stand 775, and the like. A television device 770 can be operated with an operation switch of the housing 771 or a remote controller 780. The semiconductor device described in any of the above embodiments is mounted on the housing 771 and the remote controller 780. Therefore, a television device in which writing and reading of data are performed at high speed, data is stored for a long time, and power consumption is sufficiently reduced can be realized.

As described above, the electronic devices described in this embodiment each include the semiconductor device according to the above embodiment. Therefore, electronic devices with low power consumption can be realized.

(Embodiment 5)

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically. In this embodiment, the field-effect mobility of an ideal oxide semiconductor without a defect inside the semiconductor is calculated theoretically, and calculation results of characteristics of minute transistors that are manufactured using such an oxide semiconductor are shown.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 6]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 7]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[FORMULA 8]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[FORMULA 9]}$$

The right side of Formula 9 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm²/Vs from Formula 6 and Formula 7. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as the following formula.

$$\frac{1}{\mu_1} = \frac{1}{\mu_0} + \frac{D}{B}\exp\left(-\frac{x}{G}\right) \quad \text{[FORMULA 10]}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 10 is increased and accordingly the mobility $\mu_1$ is decreased.

Figure 18:
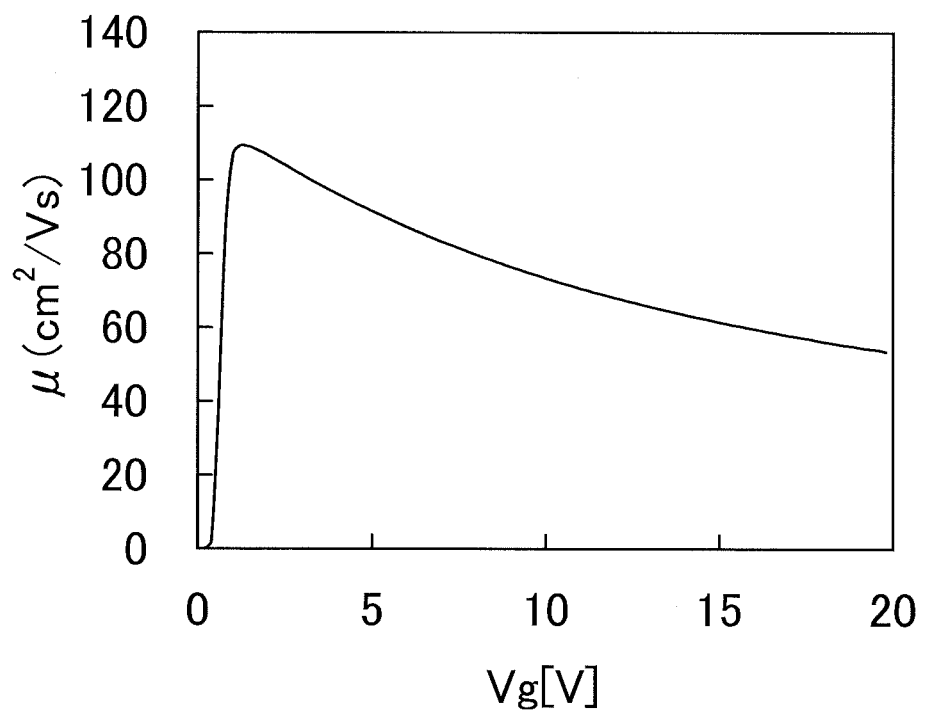
FIG. 18 is a graph showing gate voltage dependence of mobility, which is obtained by calculation.

Calculation results of the mobility $\mu_2$ of a transistor whose channel includes an ideal oxide semiconductor without a defect inside the semiconductor are shown in FIG. 18. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 8103a and a semiconductor region 8103c which have n⁺-type conductivity in an oxide semiconductor layer. The resistivities of the semiconductor region 8103a and the semiconductor region 8103c are $2×10^{-3}$ Ωcm.

The transistor illustrated in FIG. 22A is formed over a base insulating layer 8101 and an embedded insulator 8102 which is embedded in the base insulating layer 8101 and formed of aluminum oxide. The transistor includes the semiconductor region 8103a, the semiconductor region 8103c, an intrinsic semiconductor region 8103b serving as a channel formation region therebetween, and a gate 8105. The width of the gate 8105 is 33 nm.

A gate insulator 8104 is formed between the gate 8105 and the semiconductor region 8103b. In addition, a sidewall insulator 8106a and a sidewall insulator 8106b are formed on both side surfaces of the gate 8105, and an insulator 8107 is formed over the gate 8105 so as to prevent a short circuit between the gate 8105 and another wiring. The sidewall insulator has a width of 5 nm. A source 8108a and a drain 8108b are provided in contact with the semiconductor region 8103a and the semiconductor region 8103c, respectively. Note that the channel width of this transistor is 40 nm.

The transistor of FIG. 22B is the same as the transistor of FIG. 22A in that it is formed over the base insulating layer 8101 and the embedded insulator 8102 formed of aluminum oxide and that it includes the semiconductor region 8103a, the semiconductor region 8103c, the intrinsic semiconductor region 8103b provided therebetween, the gate 8105 having a width of 33 nm, the gate insulator 8104, the sidewall insulator 8106a, the sidewall insulator 8106b, the insulator 8107, the source 8108a, and the drain 8108b.

The transistor illustrated in FIG. 22A is different from the transistor illustrated in FIG. 22B in the conductivity type of semiconductor regions under the sidewall insulator 8106a and the sidewall insulator 8106b. In the transistor illustrated in FIG. 22A, the semiconductor regions under the sidewall insulator 8106a and the sidewall insulator 8106b are part of the semiconductor region 8103a having n⁺-type conductivity and part of the semiconductor region 8103c having n⁺-type conductivity, whereas in the transistor illustrated in FIG. 22B, the semiconductor regions under the sidewall insulator 8106a and the sidewall insulator 8106b are part of the intrinsic semiconductor region 8103b. In other words, in the semiconductor layer of FIG. 22B, a region having a width of $L_{off}$ which overlaps with neither the semiconductor region 8103a (the semiconductor region 8103c) nor the gate 8105 is provided. This region is called an offset region, and the width $L_{off}$ is called an offset length. As is seen from the drawing, the offset length is equal to the width of the sidewall insulator 8106a (the sidewall insulator 8106b).

Figure 19A:
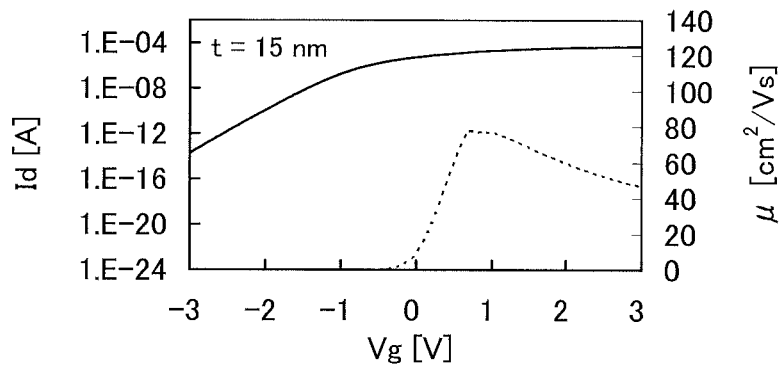
FIGS. 19A to 19C are graphs showing gate voltage dependence of drain current and mobility, which is obtained by calculation.
Figure 19B:
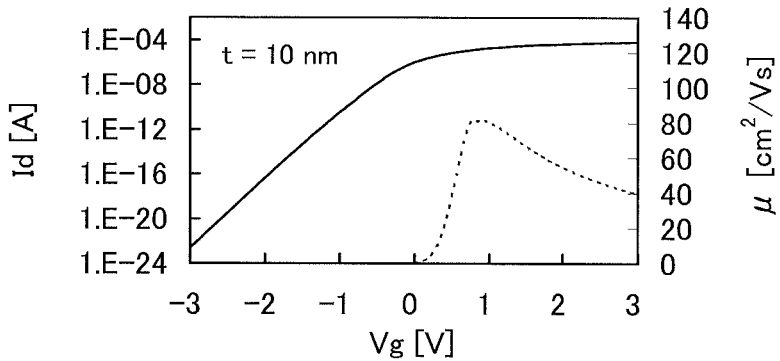
Figure 19C:
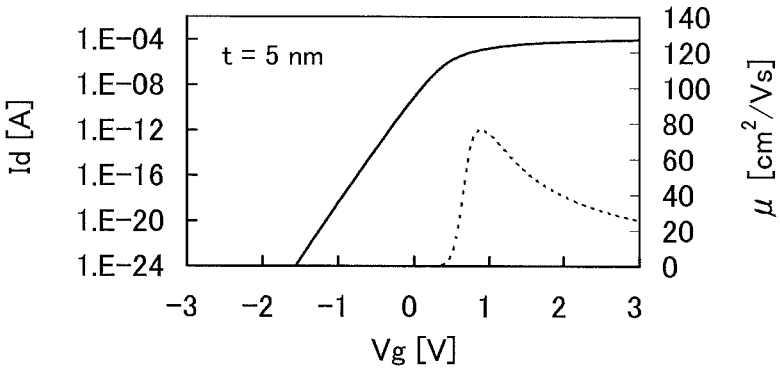

The other parameters used in calculation are as described above. For the calculation, device simulation software Sentaurus Device manufactured by Synopsys, Inc. was used. FIGS. 19A to 19C show the gate voltage ($V_g$: a potential difference between the gate and the source) dependence of the drain current ($I_d$, a solid line) and the mobility (μ, a dotted line) of the transistor having the structure illustrated in FIG. 22A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 19A shows the gate voltage dependence of the transistor in the case where the thickness of the gate insulating layer is 15 nm, FIG. 19B shows that of the transistor in the case where the thickness of the gate insulating layer is 10 nm, and FIG. 19C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 20A:
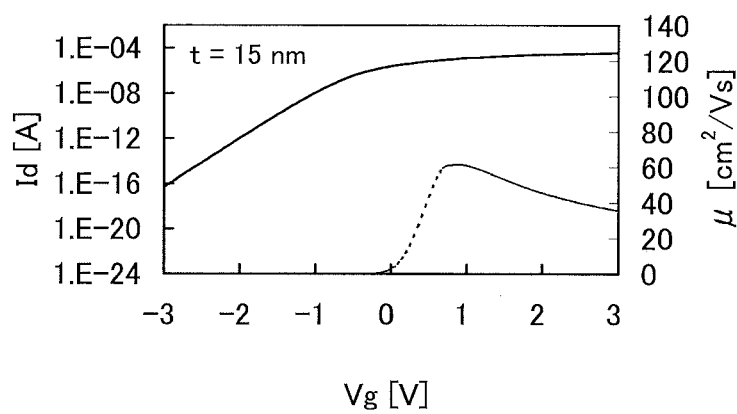
FIGS. 20A to 20C are graphs showing gate voltage dependence of drain current and mobility, which is obtained by calculation.
Figure 20B:
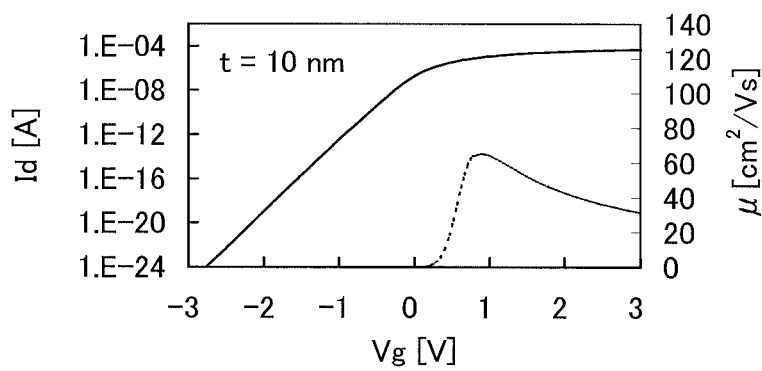
Figure 20C:
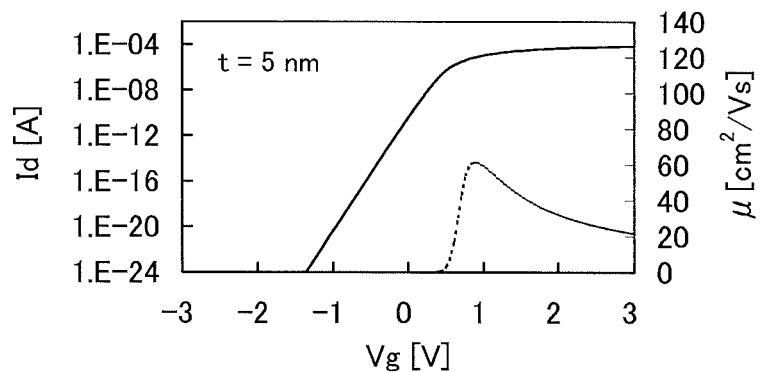

FIGS. 20A to 20C show the gate voltage $V_g$ dependence of the drain current $I_d$ (a solid line) and the mobility μ (a dotted line) of the transistor having the structure illustrated in FIG. 22B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 20A shows the gate voltage dependence of the transistor in the case where the thickness of the gate insulating layer is 15 nm, FIG. 20B shows that of the transistor in the case where the thickness of the gate insulating layer is 10 nm, and FIG. 20C shows that of the transistor in the case where the thickness of the gate insulating layer is 5 nm.

Figure 21A:
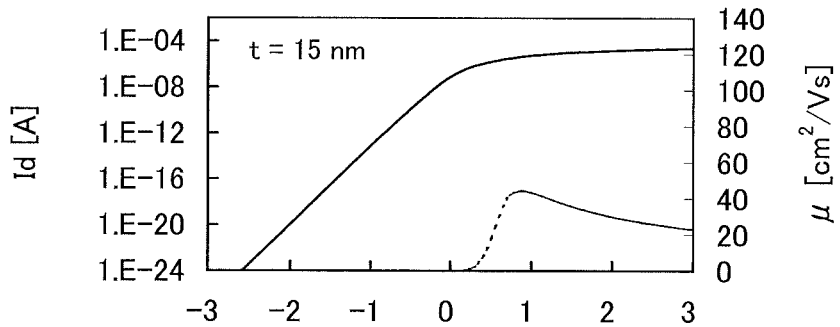
FIGS. 21A to 21C are graphs showing gate voltage dependence of drain current and mobility, which is obtained by calculation.
Figure 21B:
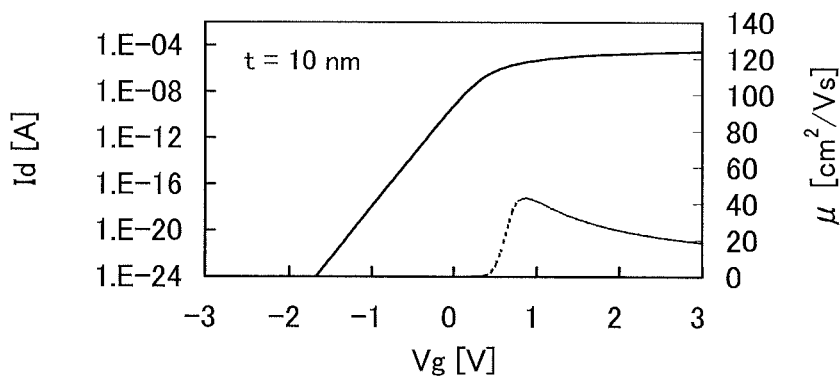
Figure 21C:
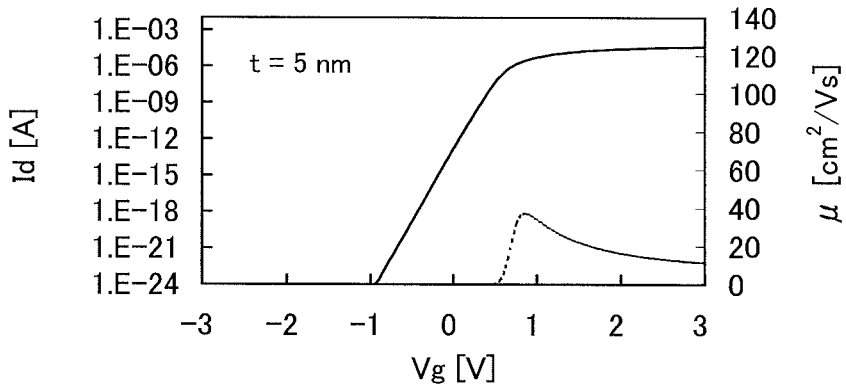

Further, FIGS. 21A to 21C show the gate voltage dependence of the drain current $I_d$ (a solid line) and the mobility μ (a dotted line) of the transistor having the structure illustrated in FIG. 22B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 19A to 19C, approximately 60 cm²/Vs in FIGS. 20A to 20C, and approximately 40 cm²/Vs in FIGS. 21A to 21C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

(Embodiment 6)

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more. In this embodiment, the case where the field effect mobility of the transistor is improved by intentionally heating the substrate after formation of the oxide semiconductor film will be described with reference to FIGS. 23A to 23C, FIGS. 24A and 24B, FIGS. 25A and 25B, FIG. 26, FIGS. 27A and 27B, FIG. 28, and FIG. 29.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 23A:
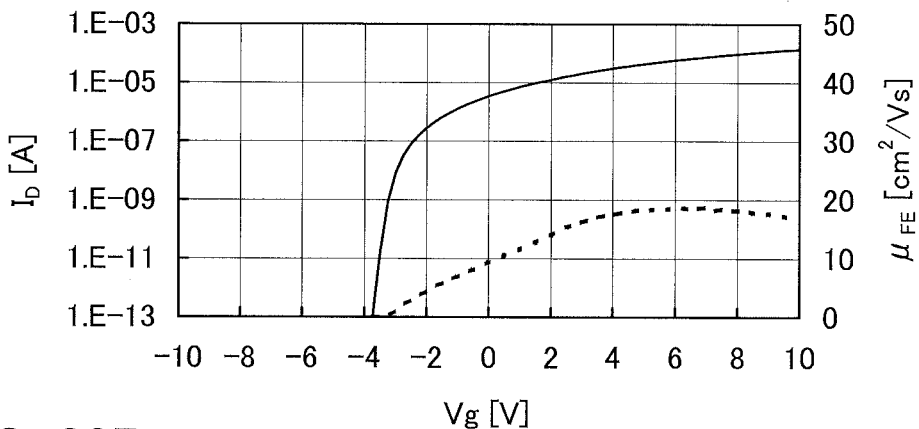
FIGS. 23A to 23C are graphs showing characteristics of transistors according to one embodiment of the present invention.
Figure 23B:
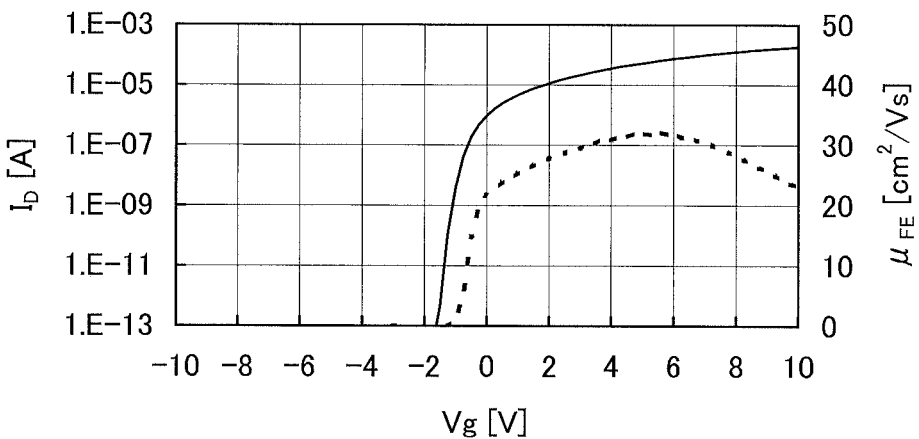
Figure 23C:
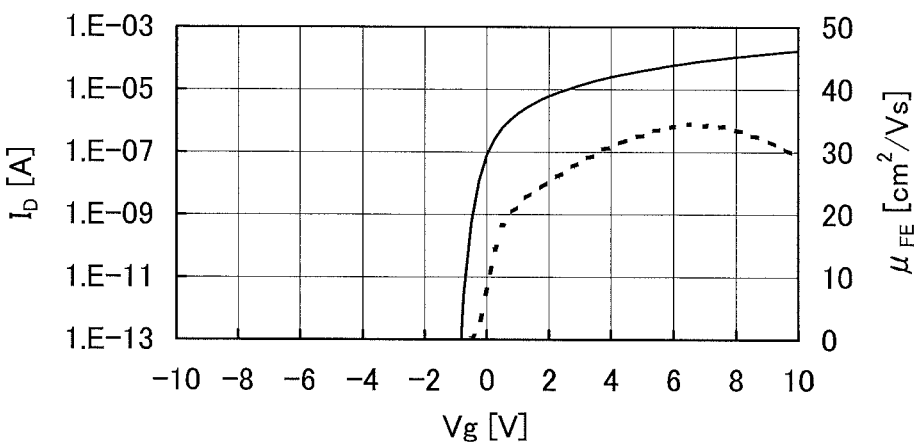

As an example, FIGS. 23A to 23C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 23A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 23B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 23C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating layer was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating layer was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 24A:
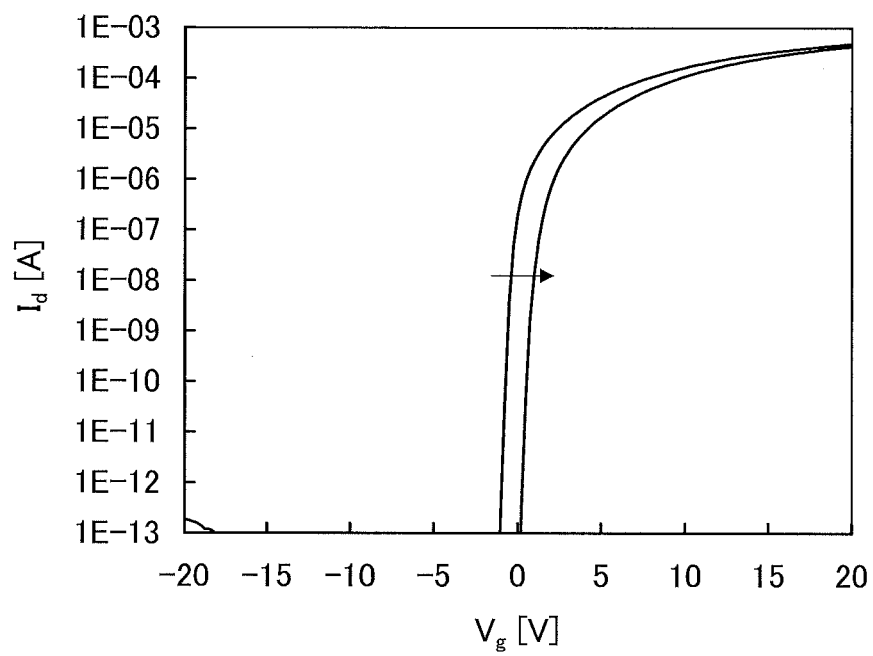
FIGS. 24A and 24B are graphs showing characteristics of transistors according to one embodiment of the present invention.
Figure 24B:
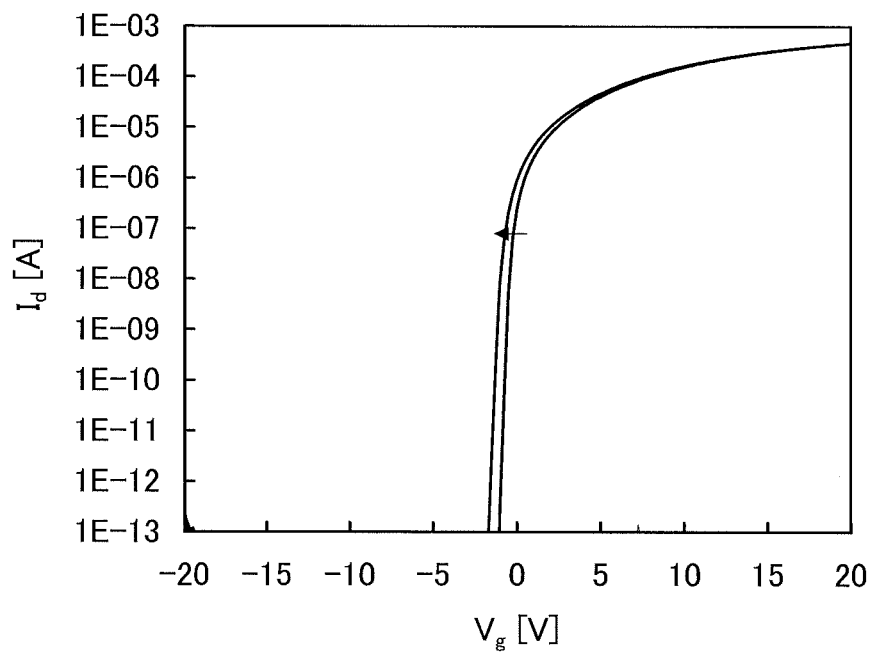
Figure 25A:
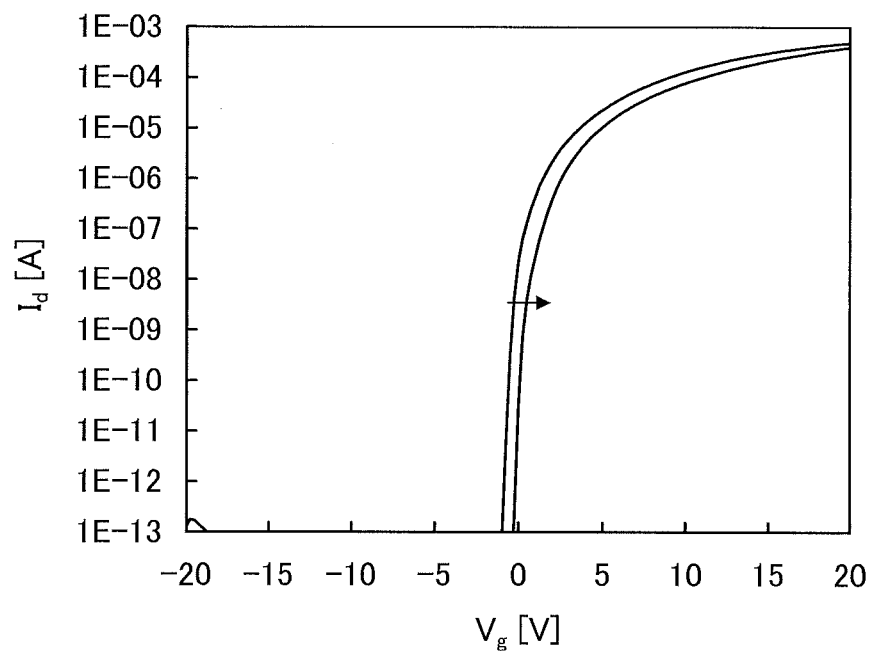
FIGS. 25A and 25B are graphs showing characteristics of transistors according to one embodiment of the present invention.
Figure 25B:
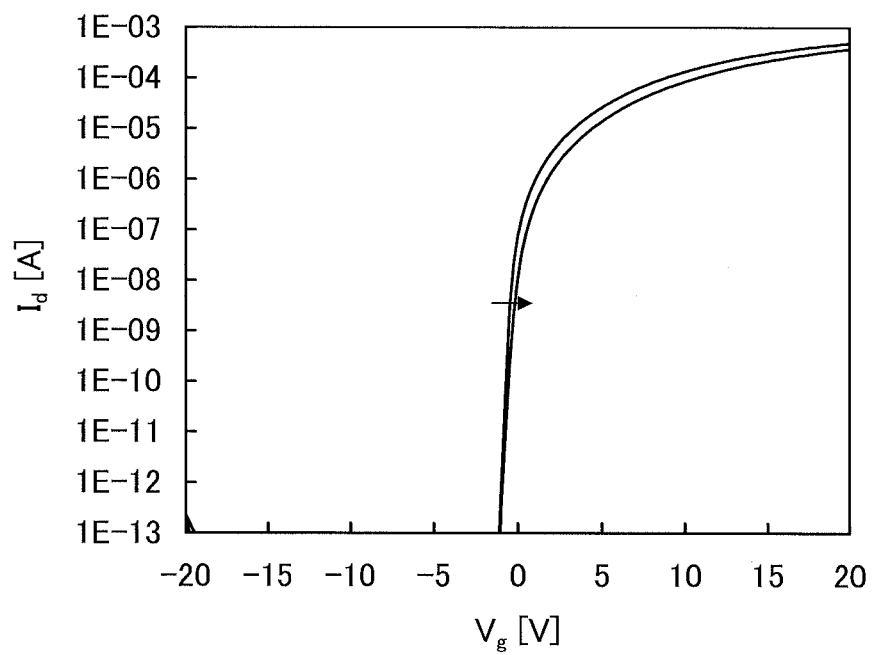

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
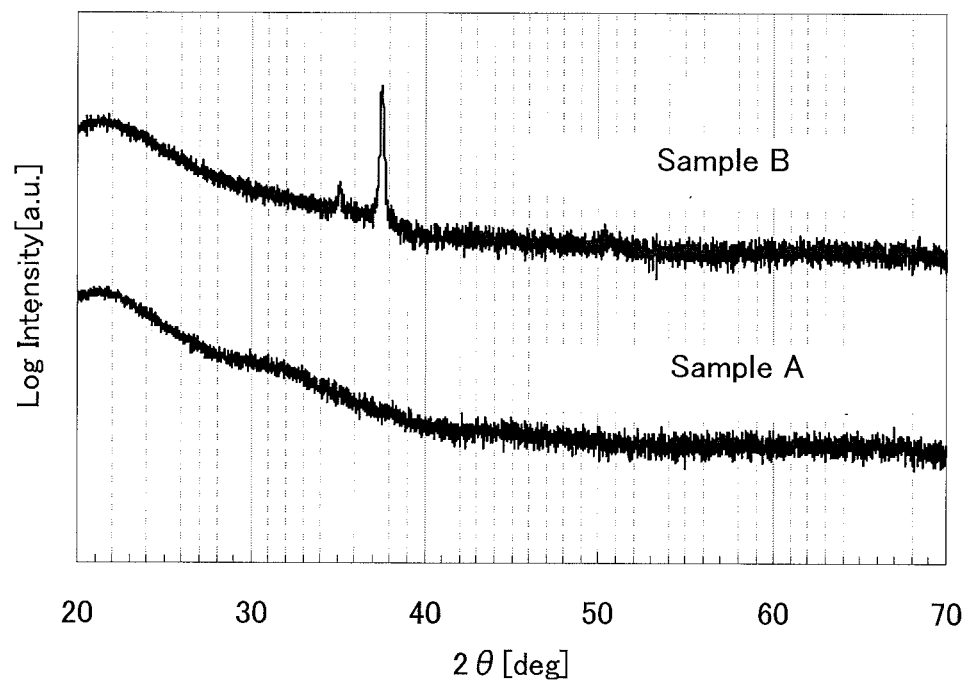
FIG. 28 is a graph showing XRD spectra of a transistor according to one embodiment of the present invention.

FIG. 28 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 29:
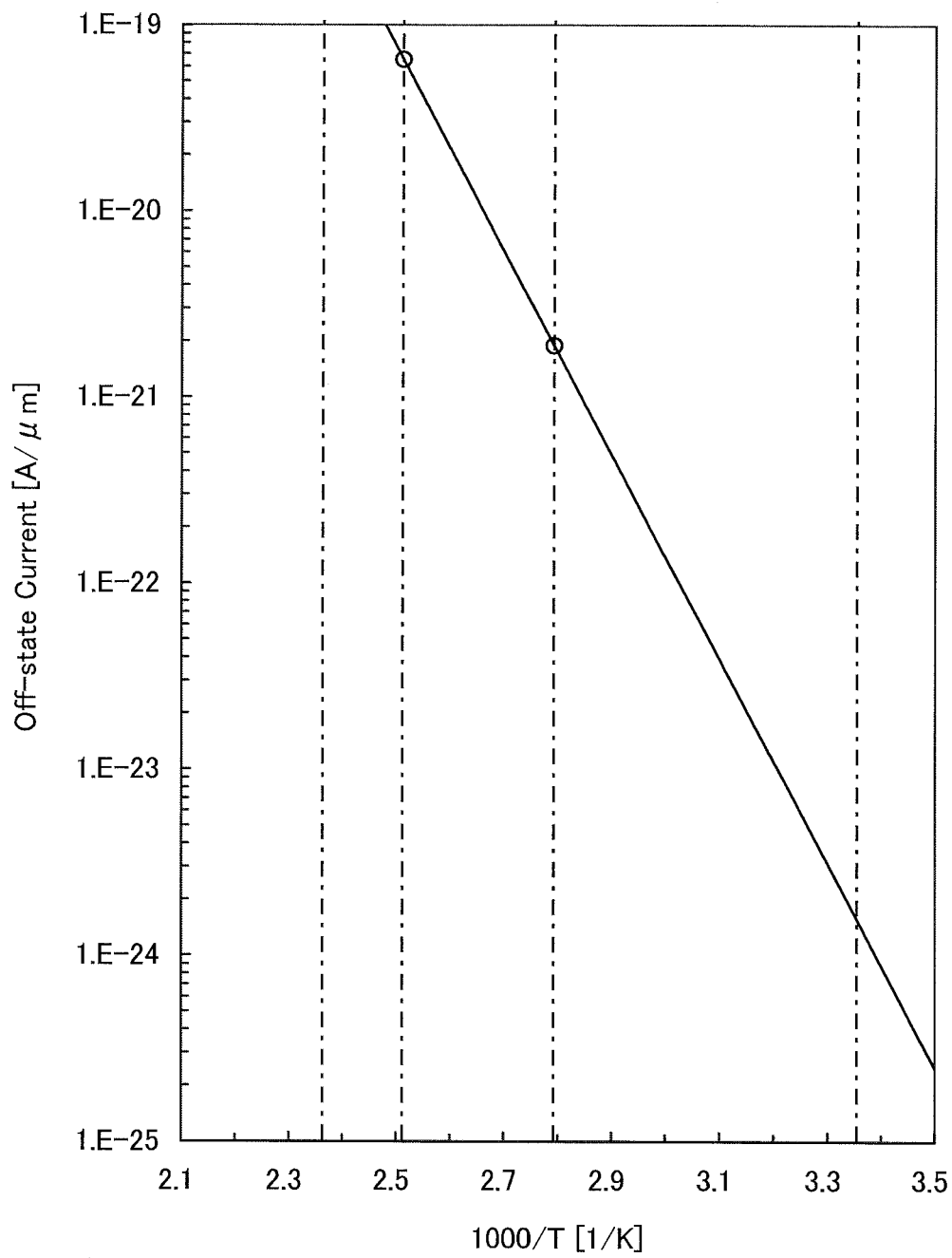
FIG. 29 is a graph showing characteristics of a transistor according to one embodiment of the present invention.

FIG. 29 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 29, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 26:
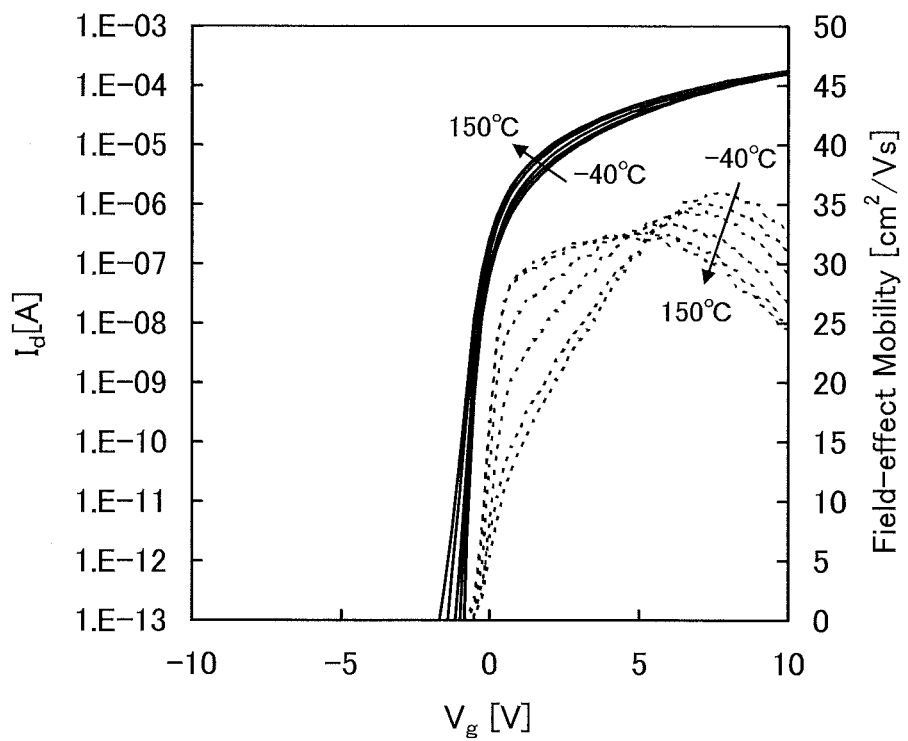
FIG. 26 is a graph showing characteristics of a transistor according to one embodiment of the present invention.
Figure 27A:
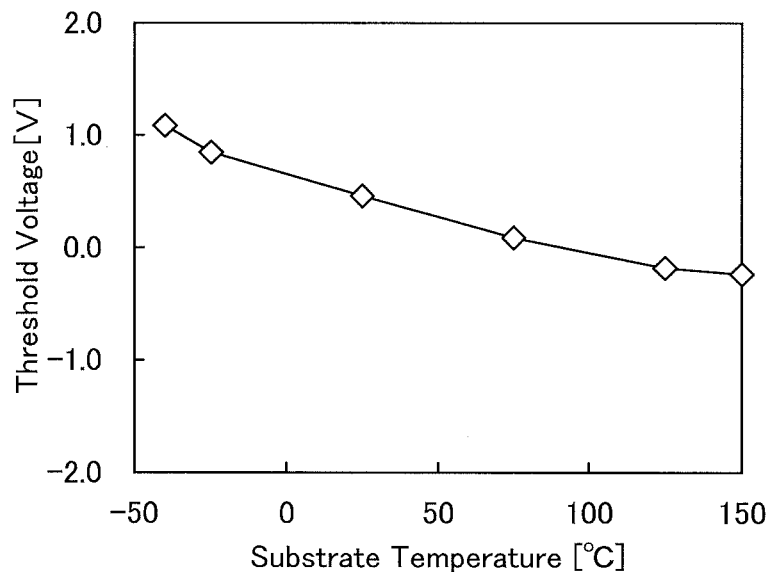
FIGS. 27A and 27B are graphs showing characteristics of transistors according to one embodiment of the present invention.

FIG. 26 shows the $V_g$ dependence of $I_d$ (a solid line) and field-effect mobility (a dotted line). FIG. 27A shows a relation between the substrate temperature and the threshold voltage, and FIG. 27B shows a relation between the substrate temperature and the field-effect mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
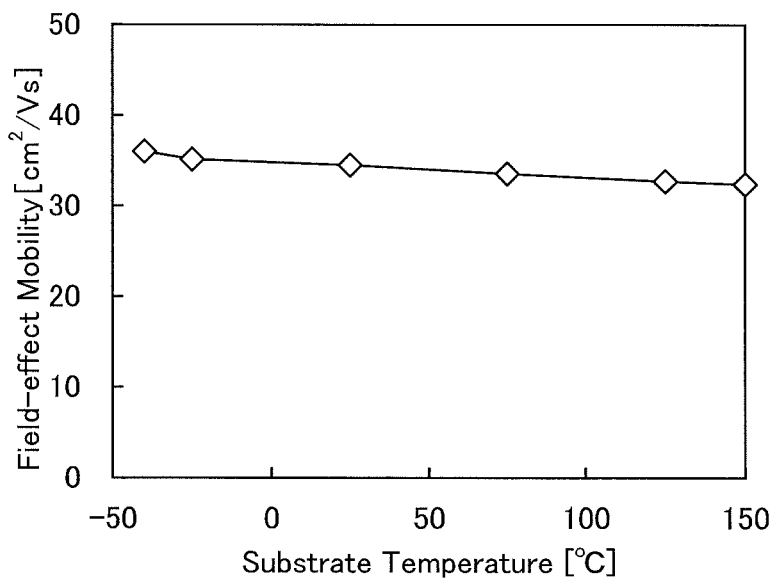

From FIG. 27B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

EXAMPLE 1

In this example, an example of a transistor in which an In—Sn—Zn—O film is used as an oxide semiconductor film will be described with reference to FIGS. 30A and 30B and the like.

Figure 30A:
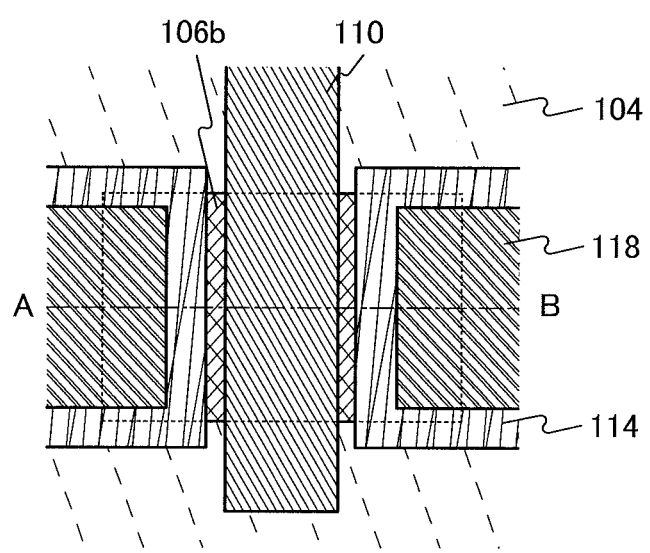
FIGS. 30A and 30B are diagrams showing a structure of a transistor according to an embodiment of the present invention.
Figure 30B:
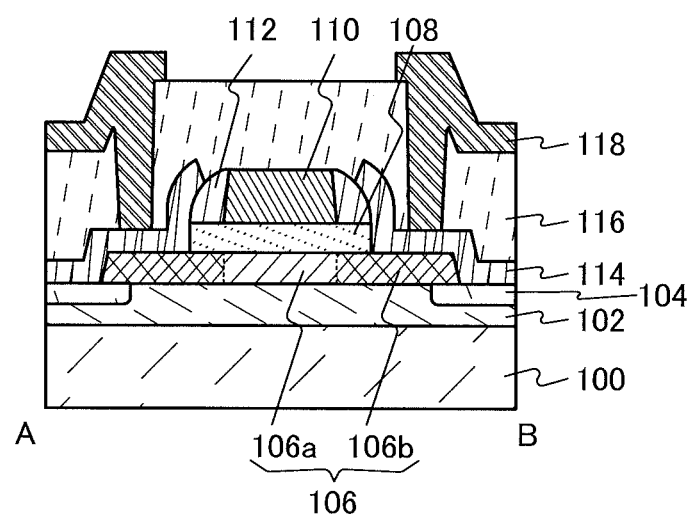

FIGS. 30A and 30B are a top view and a cross-sectional view of a coplanar transistor having a top-gate top-contact structure. FIG. 30A is the top view of the transistor. FIG. 30B illustrates cross section A-B along dashed-dotted line A-B in FIG. 30A.

The transistor illustrated in FIG. 30B includes a substrate 100; a base insulating layer 102 provided over the substrate 100; a protective insulating film 104 provided in the periphery of the base insulating layer 102; an oxide semiconductor film 106 provided over the base insulating layer 102 and the protective insulating film 104 and including a high-resistance region 106a and low-resistance regions 106b; a gate insulating layer 108 provided over the oxide semiconductor film 106; a gate electrode 110 provided to overlap with the oxide semiconductor film 106 with the gate insulating layer 108 positioned therebetween; a sidewall insulating film 112 provided in contact with a side surface of the gate electrode 110; a pair of electrodes 114 provided in contact with at least the low-resistance regions 106b; an interlayer insulating film 116 provided to cover at least the oxide semiconductor film 106, the gate electrode 110, and the pair of electrodes 114; and a wiring 118 provided to be connected to at least one of the pair of electrodes 114 through an opening formed in the interlayer insulating film 116.

Although not illustrated, a protective film may be provided to cover the interlayer insulating film 116 and the wiring 118. With the protective film, a minute amount of leakage current generated by surface conduction of the interlayer insulating film 116 can be reduced and thus the off-state current of the transistor can be reduced.

EXAMPLE 2

In this embodiment, another example of a transistor in which an In—Sn—Zn—O film is used as an oxide semiconductor film will be described.

Figure 31A:
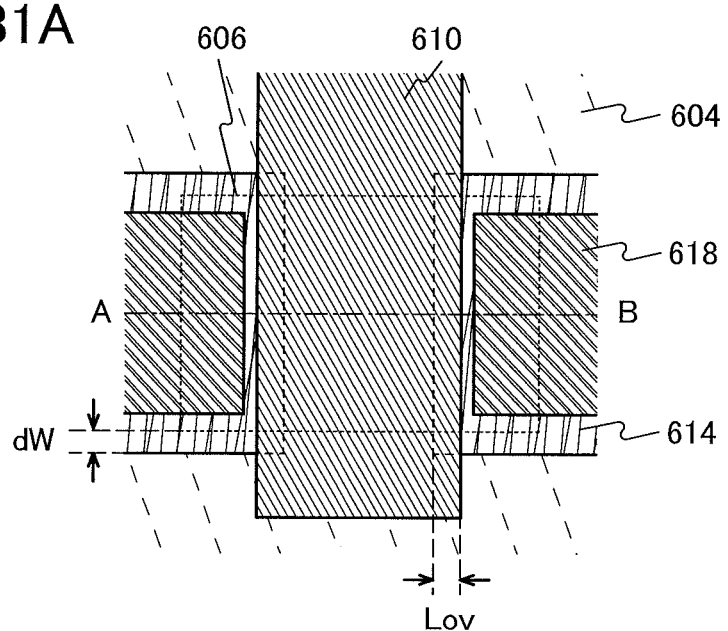
FIGS. 31A and 31B are diagrams showing a structure of a transistor according to an embodiment of the present invention.
Figure 31B:
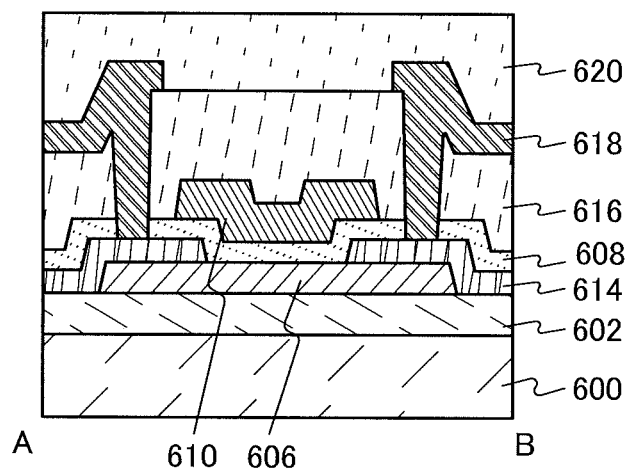

FIGS. 31A and 31B are a top view and a cross-sectional view which illustrate a structure of a transistor manufactured in this embodiment. FIG. 31A is the top view of the transistor. FIG. 31B is a cross-sectional view along dashed-dotted line A-B in FIG. 31A.

The transistor illustrated in FIG. 31B includes a substrate 600; a base insulating layer 602 provided over the substrate 600; an oxide semiconductor film 606 provided over the base insulating layer 602; a pair of electrodes 614 in contact with the oxide semiconductor film 606; a gate insulating layer 608 provided over the oxide semiconductor film 606 and the pair of electrodes 614; a gate electrode 610 provided to overlap with the oxide semiconductor film 606 with the gate insulating layer 608 positioned therebetween; an interlayer insulating film 616 provided to cover the gate insulating layer 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating layer 602, a silicon oxide film can be used. As the oxide semiconductor film 606, an In—Sn—Zn—O film can be used. As the pair of electrodes 614, a tungsten film can be used. As the gate insulating layer 608, a silicon oxide film can be used. The gate electrode 610 can have a stacked structure of a tantalum nitride film and a tungsten film. The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This application is based on Japanese Patent Application serial no. 2010-197404 filed with the Japan Patent Office on Sep. 3, 2010 and Japanese Patent Application serial no. 2011-107642 filed with the Japan Patent Office on May 12, 2011, the entire contents of which are hereby incorporated by reference.

EXPLANATION OF REFERENCE

100: substrate, 102: base insulating layer, 104: protective insulating film, 106a: high-resistance region, 106b: low-resistance region, 106: oxide semiconductor film, 108: gate insulating layer, 110: gate electrode, 112: sidewall insulating film, 114: pair of electrodes, 116: interlayer insulating film, 118: wiring, 120: semiconductor layer, 122: insulating layer, 124: mask, 126: impurity region, 130: impurity region, 132: impurity region, 134: channel formation region, 136: insulating layer, 138: insulating layer, 140: insulating layer, 144:

oxide semiconductor layer, 146: gate insulating layer, 150: insulating layer, 154: wiring, 156: insulating layer, 157: insulating layer, 158: conductive layer, 160: transistor, 162: transistor, 162a: transistor, 162b: transistor, 164: capacitor, 170: memory cell, 400: insulating layer, 437: insulating layer, 453: oxide semiconductor layer, 500: semiconductor substrate, 510: single crystal semiconductor substrate, 512: oxidation film, 514: embrittled region, 516: single crystal semiconductor layer, 518: single crystal semiconductor layer, 600: substrate, 602: base insulating layer, 604: pair of electrodes, 606: oxide semiconductor film, 608: gate insulating layer, 610: gate electrode, 614: pair of electrodes, 616: interlayer insulating film, 618: wiring, 620: protective film, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power supply, 733: operation key, 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television device, 771: housing, 773: display portion, 775: stand, 780: remote controller, 122a: gate insulating layer, 128a: gate electrode, 128b: conductive layer, 142a: source electrode, 142b: drain electrode, 148a: gate electrode, 148b: conductive layer, 404a: oxide conductive layer, 404b: oxide conductive layer, 450a: crystalline oxide semiconductor layer, 450b: crystalline oxide semiconductor layer, 8101: base insulating layer, 8102: embedded insulator, 8103a: semiconductor region, 8103b: semiconductor region, 8103c: semiconductor region, 8104: gate insulator, 8105: gate, 8106a: sidewall insulator, 8106b: sidewall insulator, 8107: insulator, 8108a: source, and 8108b: drain.

The invention claimed is:

1. A driving method for a semiconductor device, the semiconductor device comprises a memory cell including:
   a first transistor comprising a first gate electrode; and
   a second transistor comprising:
      a second channel formation region that overlaps with at least a part of one of a source and a drain of the first transistor with an insulating layer interposed therebetween; and
      a second gate electrode over the second channel fat nation region,
   wherein one of a source and a drain of the second transistor is electrically connected to the first gate electrode so that a node is formed,
   the driving method comprising the steps of:
   turning on the second transistor so that charge is supplied to the node,
   turning off the second transistor so that charge is held in the node, and
   supplying a second potential to the second gate electrode at least when a first potential is supplied to the one of the source and the drain of the first transistor in a period during which charge needs to be held in the node,
   wherein the second potential has opposite polarity with the first potential.

2. The driving method for the semiconductor device according to claim 1,
   wherein the second transistor further comprising a second gate insulating layer between the second gate electrode and the second channel formation region,
   wherein the second potential satisfies a following formula (1):

$$V_a \le -V_b \times \frac{t_a}{t_b} \times \frac{\varepsilon_{rb}}{\varepsilon_{ra}}, \quad (1)$$

wherein $V_a$ represents the second potential, $V_b$ represents the first potential, $t_a$ represents a thickness of the second gate insulating layer, $\varepsilon_{ra}$ represents a relative permittivity of the second gate insulating layer, $t_b$ represents a thickness of the insulating layer, and $\varepsilon_{rb}$ represents a relative permittivity of the insulating layer.

3. The driving method for the semiconductor device according to claim 1,
   wherein the second transistor further comprising a second gate insulating layer between the second gate electrode and the second channel formation region, and
   wherein the semiconductor device further comprising a capacitor that comprises one of a source and a drain electrode of the second transistor, the second gate insulating layer, and a conductive layer.

4. The driving method for the semiconductor device according to claim 3, wherein the one of the source and the drain of the first transistor is electrically connected to the one of the source and the drain of the second transistor.

5. The semiconductor device according to claim 1, wherein a channel formation region of the first transistor and the second channel formation region includes different semiconductor material.

6. The semiconductor device according to claim 1, wherein the second channel formation region includes an oxide semiconductor.

7. A driving method for a semiconductor device, the semiconductor device comprises a memory cell including:
   a first transistor comprising a first gate electrode;
   a second transistor comprising:
      a second gate electrode that overlaps with at least a part of one of a source and a drain of the first transistor with a first insulating layer interposed therebetween; and
      a second channel formation region over the second gate electrode; and
   a wiring over the second transistor with a second insulating layer interposed therebetween,
   wherein one of a source and a drain of the second transistor is electrically connected to the first gate electrode so that a node is formed,
   the driving method comprising the steps of:
   turning on the second transistor so that charge is supplied to the node,
   turning off the second transistor so that charge is held in the node, and
   supplying a second potential to the second gate electrode at least when a first potential is supplied to the wiring in a period during which charge needs to be held in the node,
   wherein the second potential has opposite polarity with the first potential.

8. The driving method for the semiconductor device according to claim 7,
   wherein the second transistor further comprising a second gate insulating layer between the second gate electrode and the second channel formation region,
   wherein the second potential satisfies a following formula (2):

$$V_a \le -V_c \times \frac{t_a}{t_c} \times \frac{\varepsilon_{rc}}{\varepsilon_{ra}}, \qquad (2)$$

wherein $V_a$ represents the second potential, $V_c$ represents the first potential, $t_a$ represents a thickness of the second gate insulating layer, $\varepsilon_{ra}$ represents a relative permittivity of the second gate insulating layer, $t_c$ represents a thickness of the second insulating layer, and $\varepsilon_{rc}$ represents a relative permittivity of the second insulating layer.

9. The driving method for the semiconductor device according to claim 7,
wherein the second transistor further comprising a second gate insulating layer between the second gate electrode and the second channel formation region, and
wherein the semiconductor device further comprising a capacitor that comprises one of a source and a drain electrode of the first transistor, the second gate insulating layer, and a conductive layer.

10. The driving method for the semiconductor device according to claim 9, wherein the one of the source and the drain of the first transistor is electrically connected to the one of the source and the drain of the second transistor.

11. The driving method for the semiconductor device according to claim 7, wherein a channel formation region of the first transistor and the second channel formation region includes different semiconductor material.

12. The driving method for the semiconductor device according to claim 7, wherein the second channel formation region includes an oxide semiconductor.

13. A driving method for a semiconductor device, the semiconductor device comprising:
a plurality of bit lines;
a plurality of source lines;
a plurality of write word lines;
a plurality of write-read word lines; and
a memory cell array comprising a plurality of memory cells, one of the plurality of the memory cells comprising:
a first transistor including a first gate electrode, a first source region, a first drain region, and a first channel formation region;
a second transistor including a second gate electrode, a second source electrode, a second drain electrode, and a second channel formation region provided so as to overlap at least part of one of the first source region and the first drain region; and
a capacitor,
wherein one of the plurality of source lines is electrically connected to the first source region,
wherein one of the plurality of bit lines is electrically connected to the first drain region and the second source electrode,
wherein one of the plurality of write-read word lines is electrically connected to one electrode of the capacitor,
wherein one of the write word lines is electrically connected to the second gate electrode,
wherein the first gate electrode, the second drain electrode, and the other electrode of the capacitor are electrically connected to one another to form a node where charge is held,
the driving method comprising the steps of:
supplying a first potential to one of the plurality of write word line and a second potential to the other of the plurality of write word lines in unselected rows at least when a third potential is supplied to the plurality of bit lines in a writing period of the one of the memory cells, and
supplying a fourth potential to the plurality of write word lines at least when a fifth potential is supplied to the plurality of bit lines in a reading period of the one of the memory cells,
wherein the first potential, the third potential and the fifth potential have a same polarity, and
wherein the second potential and the fourth potential have a same polarity that is opposite polarity with the first potential.

14. The driving method for the semiconductor device according to claim 13, wherein a channel formation region of the first transistor and the second channel formation region includes different semiconductor material.

15. The driving method for the semiconductor device according to claim 13, wherein the second channel formation region includes an oxide semiconductor.

* * * * *

UNITED STATES PATENT AND TRADEMARK OFFICE
CERTIFICATE OF CORRECTION

PATENT NO. : 8,654,566 B2  Page 1 of 1
APPLICATION NO. : 13/221947
DATED : February 18, 2014
INVENTOR(S) : Shuhei Nagatsuka et al.

It is certified that error appears in the above-identified patent and that said Letters Patent is hereby corrected as shown below:

In the Specification

Column 8, line 44, replace "faulting" with --forming--;

Column 20, line 58, after "example" insert --.--;

Column 22, line 53, after "FG" replace ";" with --,--;

Column 26, line 33, after "maxtrix of" replace "in" with --*m*--;

Column 29, line 25, replace "m th" with --n-th--;

Column 29, line 26, replace "n-th" with --hith--;

Column 31, line 33, replace "(RPM)" with --(HPM)--;

Column 31, line 66, replace "(RPM)" with --(HPM)--;

Column 35, line 6, after "7G" insert --,--;

Column 52, line 22, replace "In($I_d/V_g$)" with --ln($I_d/V_g$)--;

Column 52, line 23, replace "I/$V_g$" with --1/$V_g$--;

Column 58, line 6, replace "2θ" with --2θ--;

In the Claims

Column 61, lines 47-48, in claim 1 replace "fat nation" with --formation--.

Signed and Sealed this
Eleventh Day of November, 2014

Michelle K. Lee
*Deputy Director of the United States Patent and Trademark Office*